(12) United States Patent
Masunaga et al.

(10) Patent No.: US 12,164,227 B2
(45) Date of Patent: *Dec. 10, 2024

(54) CHEMICALLY AMPLIFIED NEGATIVE RESIST COMPOSITION AND RESIST PATTERN FORMING PROCESS

(71) Applicant: Shin-Etsu Chemical Co., Ltd., Tokyo (JP)

(72) Inventors: Keiichi Masunaga, Joetsu (JP); Satoshi Watanabe, Joetsu (JP); Masaaki Kotake, Joetsu (JP); Masaki Ohashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 301 days.

This patent is subject to a terminal disclaimer.

(21) Appl. No.: 17/591,719

(22) Filed: Feb. 3, 2022

(65) Prior Publication Data
US 2022/0276557 A1    Sep. 1, 2022

(30) Foreign Application Priority Data
Feb. 12, 2021 (JP) ................... 2021-020906

(51) Int. Cl.
*G03F 7/038* (2006.01)
*G03F 7/004* (2006.01)
(Continued)

(52) U.S. Cl.
CPC .......... *G03F 7/0382* (2013.01); *G03F 7/0045* (2013.01); *G03F 7/2006* (2013.01); *G03F 7/327* (2013.01)

(58) Field of Classification Search
CPC ...... G03F 7/0382; G03F 7/0045; G03F 7/327; G03F 7/0046; G03F 7/0043; G03F 7/004;
(Continued)

(56) References Cited

U.S. PATENT DOCUMENTS 6,479,210 B2    11/2002   Kinoshita et al.
6,485,883 B2    11/2002   Kodama et al.
(Continued)

FOREIGN PATENT DOCUMENTS

EP    1 684 118 A1    7/2006
EP    1 975 711 A1    10/2008
(Continued)

OTHER PUBLICATIONS

Non-Final Office Action dated Jan. 10, 2024, issued in U.S. Appl. No. 17/524,085. (19 pages).
(Continued)

*Primary Examiner* — Sean M DeGuire
*Assistant Examiner* — Alexander N. Lee
(74) *Attorney, Agent, or Firm* — WHDA, LLP

(57) ABSTRACT

A chemically amplified negative resist composition comprising (A) a sulfurane or selenurane compound having formula (A1) wherein M is sulfur or selenium and (B) a base polymer containing a polymer comprising repeat units having formula (B1) is provided. The resist composition exhibits a high resolution during pattern formation and forms a pattern with minimal LER or LWR.

(A1)

(Continued)

-continued

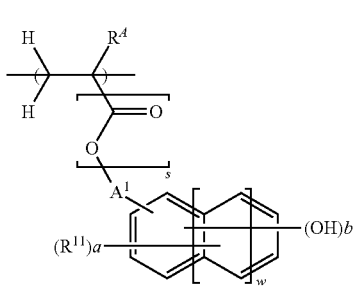

(B1)

13 Claims, 3 Drawing Sheets

(51) Int. Cl.
 *G03F 7/20* (2006.01)
 *G03F 7/32* (2006.01)
(58) Field of Classification Search
 CPC .... G03F 7/0042; G03F 7/0392; G03F 7/2006;
  G03F 7/2004; G03F 1/50; C08F 2/50;
  C08F 220/22; C08F 220/301; C08F
  220/303; C08F 220/382; H01L 21/0274;
  C07C 381/12; C07C 391/00; C07C
  391/02; C07C 381/00
 USPC ...................................................... 430/270.1
 See application file for complete search history.

(56) References Cited

U.S. PATENT DOCUMENTS

| 6,492,091 | B2 | 12/2002 | Kodama et al. |
| 7,214,467 | B2 | 5/2007 | Kanna et al. |
| 9,075,306 | B2 | 7/2015 | Takeda et al. |
| 2006/0166133 | A1* | 7/2006 | Koitabashi ............ G03F 7/0382 |
| | | | 430/270.1 |
| 2010/0009286 | A1 | 1/2010 | Takeda et al. |
| 2010/0316955 | A1 | 12/2010 | Masunaga et al. |
| 2011/0171577 | A1 | 7/2011 | Tsuchimura et al. |
| 2013/0230762 | A1* | 9/2013 | Hashizume ....... H01M 10/0567 |
| | | | 429/163 |
| 2017/0329227 | A1 | 11/2017 | Ohashi et al. |
| 2018/0180992 | A1 | 6/2018 | Kotake et al. |
| 2018/0180998 | A1* | 6/2018 | Kotake ................. G03F 7/0382 |

FOREIGN PATENT DOCUMENTS

| JP | 11202439 | A | * | 7/1999 |
| JP | 11-327143 | A | | 11/1999 |
| JP | 2006-201532 | A | | 8/2006 |
| JP | 2006-215180 | A | | 8/2006 |
| JP | 3955384 | B2 | | 8/2007 |
| JP | 4116340 | B2 | | 7/2008 |
| JP | 2008-249762 | A | | 10/2008 |
| JP | 4226803 | B2 | | 2/2009 |
| JP | 2009-53518 | A | | 3/2009 |
| JP | 4231622 | B2 | | 3/2009 |
| JP | 2010-100604 | A | | 5/2010 |
| JP | 4575479 | B2 | | 11/2010 |
| JP | 2011-22564 | A | | 2/2011 |
| JP | 5083528 | B2 | | 11/2012 |

OTHER PUBLICATIONS

Non-Final Office Action dated Jan. 31, 2024, issued in U.S. Appl. No. 17/591,741. (18 pages).

* cited by examiner

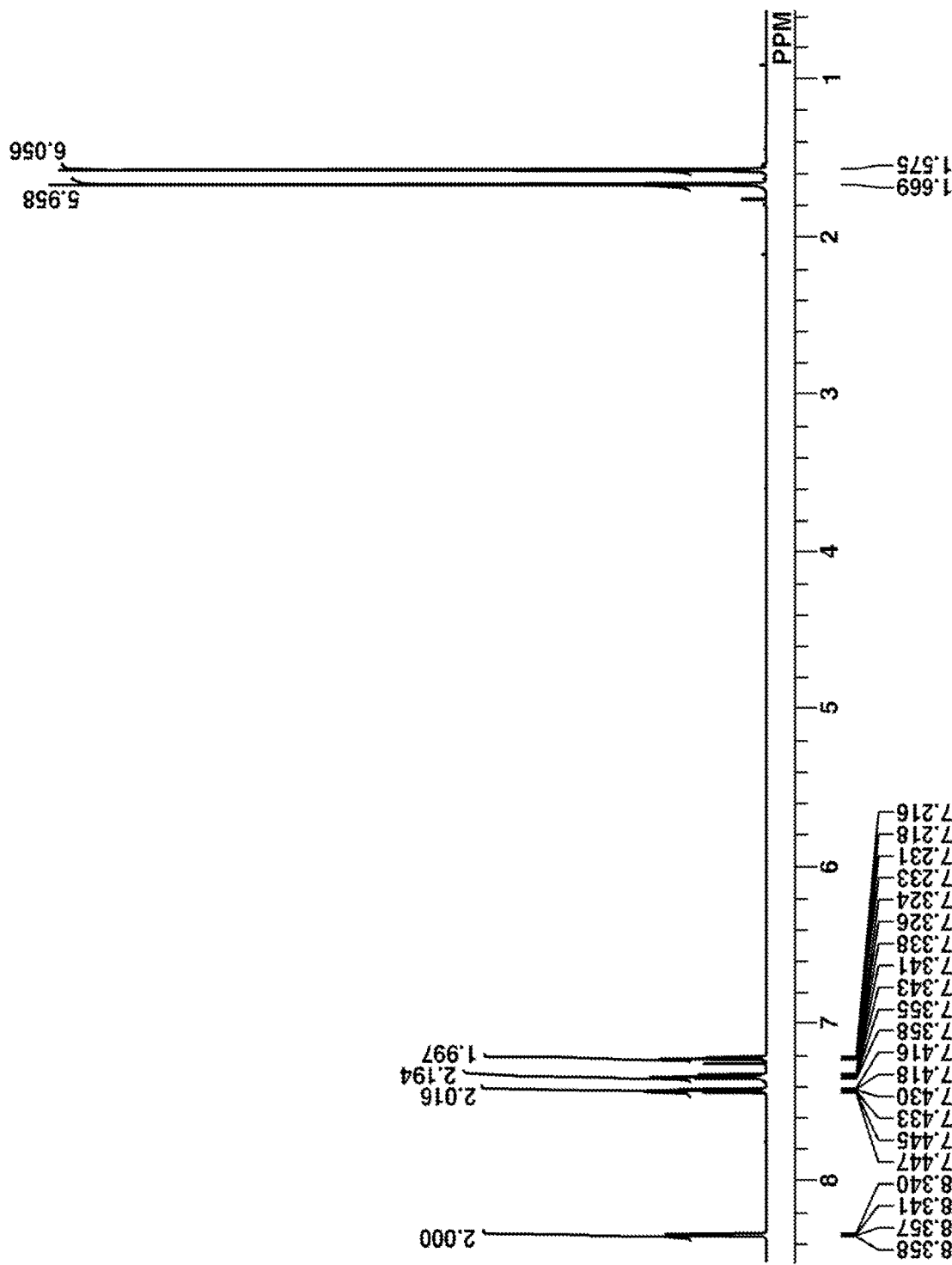

CHEMICALLY AMPLIFIED NEGATIVE RESIST COMPOSITION AND RESIST PATTERN FORMING PROCESS

CROSS-REFERENCE TO RELATED APPLICATION

This non-provisional application claims priority under 35 U.S.C. § 119(a) on Patent Application No. 2021-020906 filed in Japan on Feb. 12, 2021, the entire contents of which are hereby incorporated by reference.

TECHNICAL FIELD

This invention relates to a chemically amplified negative resist composition and a resist pattern forming process using the same.

BACKGROUND ART

To meet the demand for higher integration density and operating speed of LSIs, the effort to reduce the pattern rule is in rapid progress. Acid-catalyzed chemically amplified resist compositions are most often used in forming resist patterns with a feature size of 0.2 μm or less. High-energy radiation such as UV, deep-UV or EB is used as the light source for exposure of these resist compositions. In particular, while EB lithography is utilized as the ultra-fine microfabrication technique, it is also indispensable in processing a photomask blank to form a photomask for use in semiconductor device fabrication.

Polymers comprising a major proportion of aromatic structure having an acidic side chain, for example, polyhydroxystyrene are useful in resist materials for the KrF excimer laser lithography. These polymers are not used in resist materials for the ArF excimer laser lithography since they exhibit strong absorption at a wavelength of around 200 nm. These polymers, however, are expected to form useful resist materials for the EB and EUV lithography for forming patterns of finer size than the processing limit of ArF excimer laser because they offer high etching resistance.

Resist compositions for photolithography include positive ones in which exposed areas are dissolved away and negative ones in which exposed areas are left as a pattern. A viable composition is selected among them depending on the desired resist pattern. In general, the chemically amplified negative resist composition comprises a polymer which is normally soluble in an aqueous alkaline developer, an acid generator which is decomposed to generate an acid upon exposure to light, and a crosslinker which causes the polymer to crosslink in the presence of the acid serving as a catalyst, thus rendering the polymer insoluble in the developer (sometimes, the crosslinker is incorporated in the polymer). Most often a basic compound is added for controlling the diffusion of the acid generated upon light exposure.

Typical of the alkali-soluble units to constitute polymers which dissolve in aqueous alkaline developer are units derived from phenols. A number of negative resist compositions of such type were developed, especially as adapted for exposure to KrF excimer laser light. These compositions have not been used in the ArF excimer laser lithography because the phenolic units are not transmissive to exposure light having a wavelength of 150 to 220 nm. Recently, these compositions are recognized attractive again as the negative resist composition for the short wavelength (e.g., EB or EUV) lithography capable of forming finer size patterns. Exemplary compositions are described in Patent Documents 1 to 3.

For the photolithography, improvements in the control of resist sensitivity and pattern profile were made by properly selecting and combining components used in resist compositions and adjusting processing conditions. One outstanding problem is the diffusion of acid that has a significant impact on the resolution of a chemically amplified resist composition.

An acid diffusion inhibitor is, in fact, essential for controlling acid diffusion and improving the performance, especially resolution of a resist composition. Studies have been made on the acid diffusion inhibitor while amines and weak acid onium salts have been generally used. The weak acid onium salts are exemplified in several patent documents. Patent Document 4 describes that the addition of triphenylsulfonium acetate ensures to form a satisfactory resist pattern without T-top profile, a difference in line width between isolated and grouped patterns, and standing waves. Patent Document 5 describes improvements in sensitivity, resolution and exposure margin by the addition of sulfonic acid ammonium salts or carboxylic acid ammonium salts. Also, Patent Document 6 describes that a resist composition for KrF or EB lithography comprising a PAG capable of generating a fluorinated carboxylic acid is improved in resolution and process latitude such as exposure margin and depth of focus. Further, Patent Document 7 describes that a resist composition for $F_2$ laser lithography comprising a PAG capable of generating a fluorinated carboxylic acid is improved in line edge roughness (LER) and solves the footing problem. The resist compositions of these patent documents are used in the KrF, EB and $F_2$ lithography processes.

Patent Document 8 describes a positive photosensitive composition for ArF lithography comprising a carboxylic acid onium salt. This system is based on the mechanism that a salt exchange occurs between a weak acid onium salt and a strong acid (sulfonic acid) generated by a PAG upon exposure, to form a weak acid and a strong acid onium salt. That is, the strong acid (sulfonic acid) having high acidity is replaced by a weak acid (carboxylic acid), thereby suppressing acid-catalyzed decomposition reaction of acid labile group and reducing or controlling the distance of acid diffusion. The onium salt apparently functions as an acid diffusion inhibitor.

However, when the resist composition comprising the foregoing carboxylic acid onium salt or fluorocarboxylic acid onium salt is used in patterning, roughness (LER or LWR) is unsatisfactory as viewed from the advanced miniaturization technology. It would be desirable to have an acid diffusion inhibitor capable of minimizing LER or LWR.

CITATION LIST

Patent Document 1: JP-A 2006-201532 (US 20060166133, EP 1684118)
Patent Document 2: JP-A 2006-215180
Patent Document 3: JP-A 2008-249762 (U.S. Pat. No. 9,075,306, EP 1975711)
Patent Document 4: JP 3955384 (U.S. Pat. No. 6,479,210)
Patent Document 5: JP-A H11-327143
Patent Document 6: JP 4231622 (U.S. Pat. No. 6,485,883)
Patent Document 7: JP 4116340 (U.S. Pat. No. 7,214,467)
Patent Document 8: JP 4226803 (U.S. Pat. No. 6,492,091)
Patent Document 9: JP 4575479

DISCLOSURE OF INVENTION

An object of the invention is to provide a chemically amplified negative resist composition which exhibits an improved resolution upon pattern formation and forms a pattern with reduced LER or LWR, and a pattern forming process using the same.

The inventors have found that a resist composition comprising an acid diffusion inhibitor in the form of a sulfurane or selenurane compound of specific structure can be processed by lithography to form a resist pattern with reduced LER or LWR.

In one aspect, the invention provides a chemically amplified negative resist composition comprising (A) a sulfurane or selenurane compound having the following formula (A1) and (B) a base polymer containing a polymer comprising repeat units having the following formula (B1).

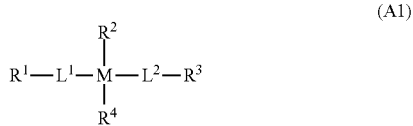
(A1)

Herein $R^1$ to $R^4$ are each independently a $C_1$-$C_{20}$ hydrocarbyl group which may contain a heteroatom, $R^1$ and $R^2$ may bond together to form a ring with $L^1$ and M to which they are attached, $R^1$ and $R^2$, and $R^3$ and $R^4$ may bond together to form spiro rings with M as the spiro atom, $L^1$ and $L^2$ are each independently —O— or —N(R)—, R is hydrogen or a $C_1$-$C_{20}$ hydrocarbyl group which may contain a heteroatom, and M is sulfur or selenium,

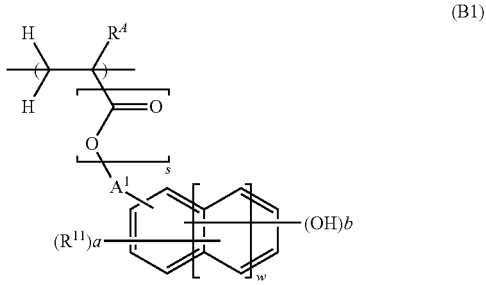
(B1)

wherein $R^A$ is hydrogen, fluorine, methyl or trifluoromethyl, $R^{11}$ is halogen, an optionally halogenated $C_2$-$C_8$ saturated hydrocarbylcarbonyloxy group, optionally halogenated $C_1$-$C_6$ saturated hydrocarbyl group, or optionally halogenated $C_1$-$C_6$ saturated hydrocarbyloxy group.

$A^1$ is a single bond or a $C_1$-$C_{10}$ saturated hydrocarbylene group in which any constituent —$CH_2$— may be replaced by —O—, s is 0 or 1, w is an integer of 0 to 2, a is an integer satisfying $0 \le a \le 5+2w-b$, and b is an integer of 1 to 3.

In a preferred embodiment, the polymer further comprises repeat units of at least one type selected from repeat units having the formulae (B2), (B3) and (B4).

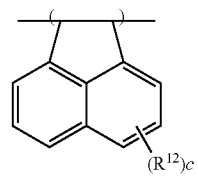
(B2)

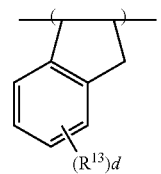
(B3)

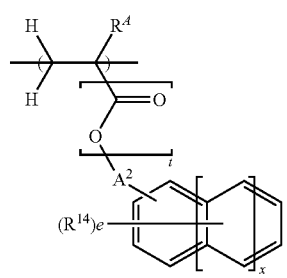
(B4)

Herein $R^A$ is as defined above, $R^{12}$ and $R^{13}$ are each independently hydroxy, halogen, an optionally halogenated $C_2$-$C_8$ saturated hydrocarbylcarbonyloxy group, optionally halogenated $C_1$-$C_8$ saturated hydrocarbyl group, or optionally halogenated $C_1$-$C_8$ saturated hydrocarbyloxy group, $R^{14}$ is an acetyl group. $C_1$-$C_{20}$ saturated hydrocarbyl group, $C_1$-$C_{20}$ saturated hydrocarbyloxy group, $C_2$-$C_{20}$ saturated hydrocarbylcarbonyloxy group, $C_2$-$C_{20}$ saturated hydrocarbyloxyhydrocarbyl group, $C_2$-$C_{20}$ saturated hydrocarbylthiohydrocarbyl group, halogen atom, nitro group, cyano group, sulfinyl group, or sulfonyl group.

$A^2$ is a single bond or $C_1$-$C_{10}$ saturated hydrocarbylene group in which any constituent —$CH_2$— may be replaced by —O—, c and d are each independently an integer of 0 to 4, e is an integer of 0 to 5, x is an integer of 0 to 2, and t is 0 or 1.

In a preferred embodiment, the polymer further comprises repeat units having the formula (B5).

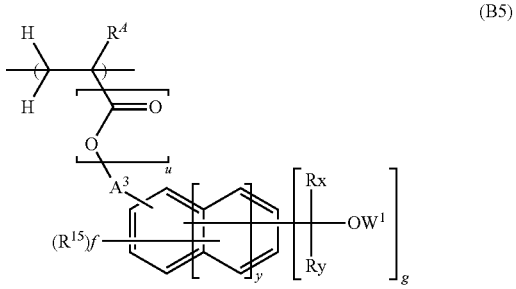
(B5)

Herein $R^A$ is as defined above, $A^3$ is a single bond or $C_1$-$C_{10}$ saturated hydrocarbylene group in which any constituent —$CH_2$— may be replaced by —O—, $R^{15}$ is each independently halogen, an optionally halogenated $C_2$-$C_8$ saturated to hydrocarbylcarbonyloxy group, optionally halogenated $C_1$-$C_6$ saturated hydrocarbyl group, or optionally halogenated $C_1$-$C_6$ saturated hydrocarbyloxy group, $W^1$ is hydrogen, a $C_1$-$C_{10}$ aliphatic hydrocarbyl group or an optionally substituted aryl group, any constituent —$CH_2$— in the aliphatic hydrocarbyl group may be replaced by —O—, —C(=O)—, —O—C(=O)— or —C(=O)—O—, Rx and Ry are each independently hydrogen, an optionally hydroxy or saturated hydrocarbyloxy-substituted $C_1$-$C_{15}$ saturated hydrocarbyl group, or an optionally substituted aryl group, with the proviso that both Rx and Ry are not hydrogen at the same time, Rx and Ry may bond together to form a ring with the carbon atom to which they are attached, y is an integer of 0 to 2, u is 0 or 1, f is an integer satisfying $0 \leq f \leq 5+2y-g$, and g is an integer of 1 to 3.

More preferably, the polymer further comprises repeat units of at least one type selected from repeat units having the formulae (B6) to (B13).

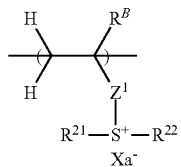

(B6)

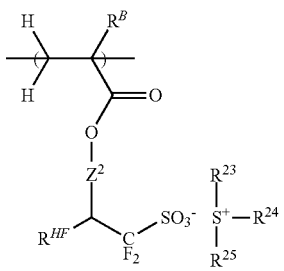

(B7)

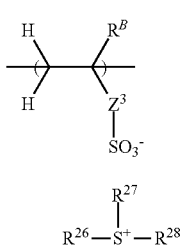

(B8)

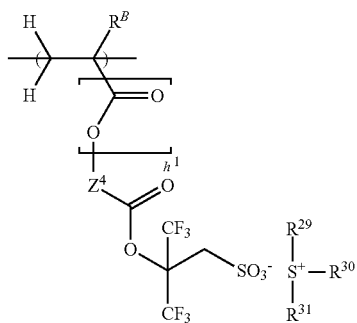

(B9)

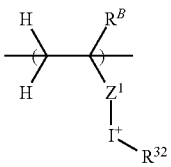

(B10)

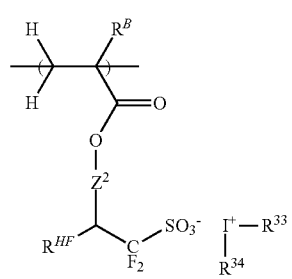

(B11)

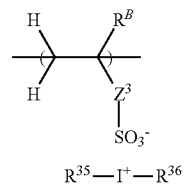

(B12)

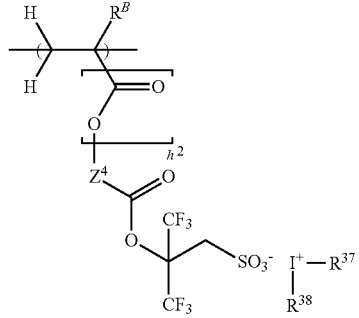

(B13)

Herein $R^B$ is each independently hydrogen or methyl.

$Z^1$ is a single bond, a $C_1$-$C_6$ aliphatic hydrocarbylene group, phenylene group, naphthylene group or $C_7$-$C_{18}$ group obtained by combining the foregoing, —O—$Z^{11}$—, —C(=O)—O—$Z^{11}$—, or —C(=O)—NH—$Z^{11}$—, $Z^{11}$ is a $C_1$-$C_6$ aliphatic hydrocarbylene group, phenylene group, naphthylene group or $C_7$-$C_{18}$ group obtained by combining the foregoing, which may contain a carbonyl moiety, ester bond, ether bond or hydroxy moiety.

$Z^2$ is a single bond or —$Z^{21}$—C(=O)—O—, $Z^{21}$ is a $C_1$-$C_{20}$ hydrocarbylene group which may contain a heteroatom, $Z^3$ is a single bond, methylene, ethylene, phenylene, fluorinated phenylene, trifluoromethyl-substituted phenylene, —O—$Z^{31}$—, —C(=O)—O—$Z^{31}$—, or —C(=O)—NH—$Z^{31}$—, $Z^{31}$ is a $C_1$-$C_6$ aliphatic hydrocarbylene group, phenylene group, fluorinated phenylene group, trifluoromethyl-substituted phenylene group, or $C_7$-$C_{20}$ group obtained by combining the foregoing, which may contain a carbonyl moiety, ester bond, ether bond or hydroxy moiety, $Z^4$ is a single bond or $C_1$-$C_{30}$ hydrocarbylene group which may contain a heteroatom, $h^1$ and $h^2$ are each independently 0 or 1, $h^1$ and $h^2$ are 0 when $Z^4$ is a single bond, $R^{21}$ to $R^{38}$ are each independently a $C_1$-$C_{20}$ hydrocarbyl group which may contain a heteroatom, $R^{21}$ and $R^{22}$ may bond together to form a ring with the sulfur atom to which they are attached, $R^{23}$ and $R^{24}$, $R^{26}$ and $R^{27}$, or $R^{29}$ and $R^{30}$ may bond together to form a ring with the sulfur atom to which they are attached, $R^{HF}$ is hydrogen or trifluoromethyl, and $Xa^-$ is a non-nucleophilic counter ion.

Even more preferably, the polymer further comprises repeat units having the formula (B1-1), repeat units having the formula (B5-1) or repeat units having the formula (B5-2), and repeat units having the formula (B7-1) or repeat units having the formula (B11-1):

In a preferred embodiment, the base polymer (B) further contains a polymer comprising repeat units having formula (B1) and repeat units having formula (B5), but not repeat units having formulae (B6) to (B13).

The negative resist composition may further comprise (C) an acid generator and/or (D) a crosslinker. In another embodiment, the negative resist composition is free of a crosslinker.

The negative resist composition may further comprise (E) a polymer comprising repeat units having the formula (E1) and repeat units of at least one type selected from repeat units having the formulae (E2) to (E5).

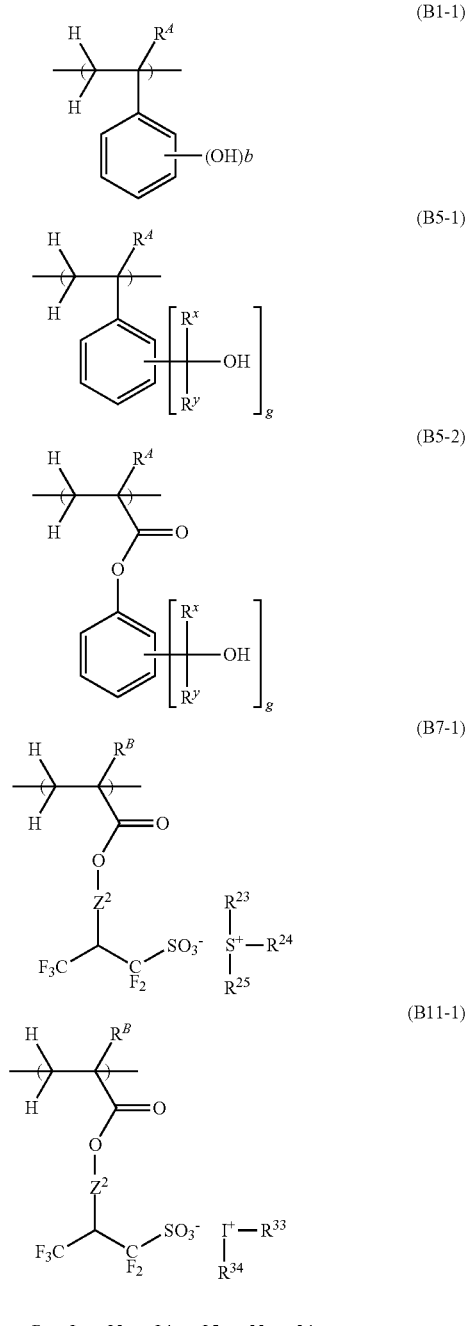

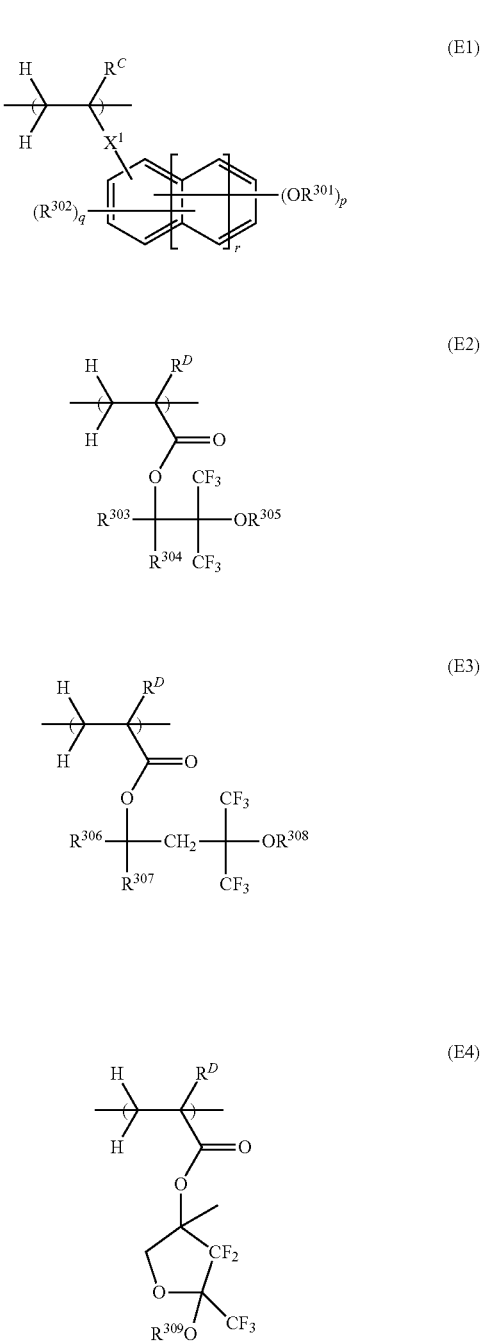

wherein $R^A$, $R^B$, $Z^2$, $R^{23}$, $R^{24}$, $R^{25}$, $R^{33}$, $R^{34}$, Rx, Ry, b, and g are as defined above.

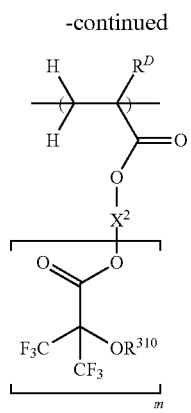

Herein $R^C$ is each independently hydrogen or methyl.

$R^D$ is each independently hydrogen, fluorine, methyl or trifluoromethyl, $R^{301}$ is hydrogen or a $C_1$-$C_5$ straight or branched hydrocarbyl group in which a heteroatom-containing moiety may intervene in a carbon-carbon bond, $R^{302}$ is a $C_1$-$C_5$ straight or branched hydrocarbyl group in which a heteroatom-containing moiety may intervene in a carbon-carbon bond, $R^{303}$, $R^{304}$, $R^{306}$ and $R^{307}$ are each independently hydrogen or a $C_1$-$C_{10}$ saturated hydrocarbyl group.

$R^{305}$, $R^{308}$, $R^{309}$ and $R^{310}$ are each independently hydrogen, a $C_1$-$C_{15}$ hydrocarbyl group, $C_1$-$C_{15}$ fluorinated hydrocarbyl group, or acid labile group, when $R^{305}$, $R^{308}$, $R^{309}$ and $R^{310}$ each are a hydrocarbyl or fluorinated hydrocarbyl group, an ether bond or carbonyl moiety may intervene in a carbon-carbon bond, p is an integer of 1 to 3, q is an integer satisfying 0≤q≤5+2r−p, r is 0 or 1, m is an integer of 1 to 3, $X^1$ is a single bond, —C(=O)—O— or —C(=O)—NH—, and $X^2$ is a $C_1$-$C_{20}$ (m+1)-valent hydrocarbon group or $C_1$-$C_{20}$ (m+1)-valent fluorinated hydrocarbon group.

In another aspect, the invention provides a resist pattern forming process comprising the steps of:

applying the chemically amplified negative resist composition defined above onto a substrate to form a resist film thereon, exposing the resist film patternwise to high-energy radiation, and developing the exposed resist film in an alkaline developer.

Preferably, the high-energy radiation is KrF excimer laser, EUV or EB.

Typically, the substrate is a photomask blank.

Advantageous Effects of Invention

Owing to the sulfurane or selenurane compound having formula (A1), the chemically amplified negative resist composition of the invention is effective for controlling acid diffusion during the exposure step. When the composition is coated as a resist film and processed to form a pattern, the resist film exhibits a very high resolution during pattern formation and minimal line width variations relative to dose changes and pattern layout dependence, and forms a pattern with reduced LER or LWR. Owing to the repeat units having formula (B1), when the resist composition is coated onto a substrate to form a resist film, the adhesion of the composition to the substrate is improved. Also, the dissolution of the resist film in alkaline developer is controlled.

BRIEF DESCRIPTION OF DRAWINGS

FIG. 3 is a diagram showing the $^1$H-NMR spectrum of compound Q-2 in Synthesis Example 1-2.

DESCRIPTION OF EMBODIMENTS

Figure 1:
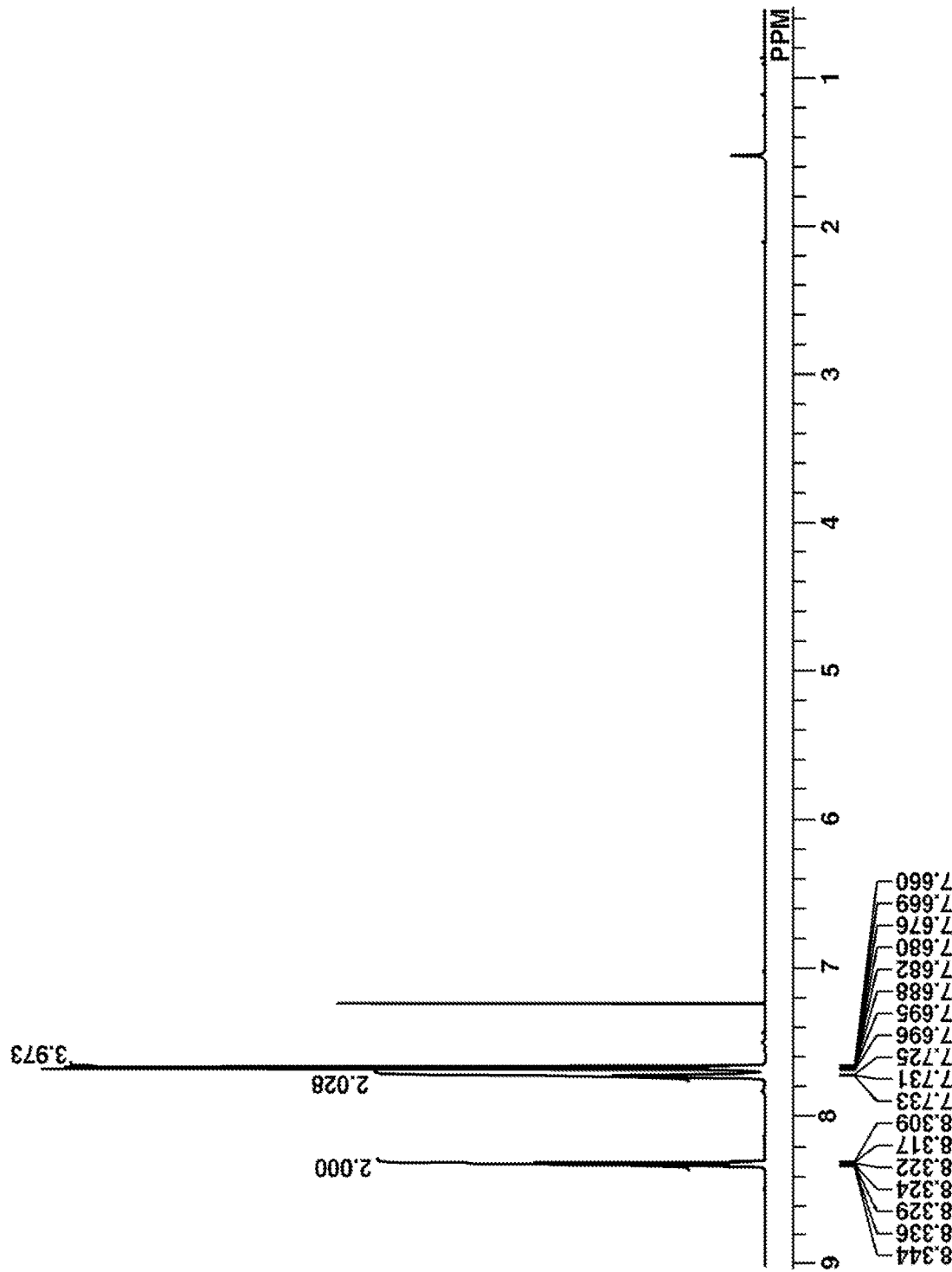
FIG. 1 is a diagram showing the $^1$H-NMR spectrum of compound Q-1 in Synthesis Example 1-1.

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In chemical formulae, Me stands for methyl, Ac stands for acetyl, and the broken line designates a valence bond.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LER: line edge roughness
LWR: line width roughness Negative Resist Composition One embodiment of the invention is a chemically amplified negative resist composition comprising (A) a specific sulfurane or selenurane compound and (B) a base polymer containing a specific polymer.

(A) Sulfurane or Selenurane Compound

The sulfurane or selenurane compound as component (A) has the formula (A1).

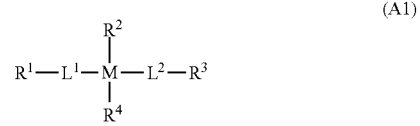

(A1)

In formula (A1), $R^1$ to $R^4$ are each independently a $C_1$-$C_{20}$ hydrocarbyl group which may contain a heteroatom. $R^1$ and $R^2$ may bond together to form a ring with $L^1$ and M to which they are attached, $R^1$ and $R^2$, and $R^3$ and $R^4$ may bond together to form spiro rings with M as the spiro atom. $L^1$ and $L^2$ are each independently —O— or —N(R)—. R is hydrogen or a $C_1$-$C_{20}$ hydrocarbyl group which may contain a heteroatom. M is sulfur or selenium.

The $C_1$-$C_{20}$ hydrocarbyl groups represented by $R^1$ to $R^4$ and R may be saturated or unsaturated and straight, branched or cyclic. Examples thereof include alkyl groups such as methyl ethyl, propyl, isopropyl, n-butyl, sec-butyl, tert-butyl, tert-pentyl, n-pentyl, n-hexyl, n-octyl, 2-ethylhexyl, n-nonyl and n-decyl; cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.0$^{2,6}$]decanyl, adamantyl, and adamantylmethyl; and aryl groups such as phenyl, naphthyl and anthracenyl. In these groups, some hydrogen may be substituted by a moiety containing a heteroatom such as oxygen, sulfur, nitrogen or halogen exclusive of fluorine, and a moiety containing a heteroatom such as oxygen, sulfur or nitrogen may intervene in a carbon-carbon bond, so that the group may contain a hydroxy, chlorine, bromine, iodine, cyano, carbonyl, ether bond, thioether bond, ester bond, sulfonic ester bond, carbonate bond, carbamate bond, lactone ring, sultone ring, or carboxylic anhydride.

Illustrative examples of the compound having formula (A1) are shown below, but not limited thereto.

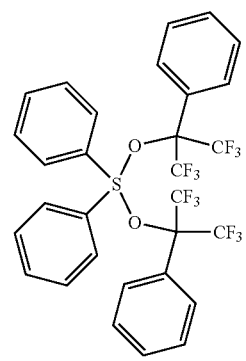
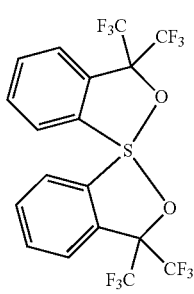
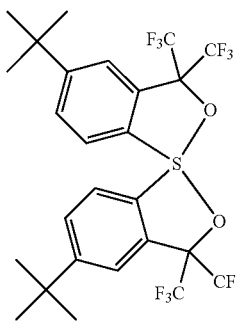
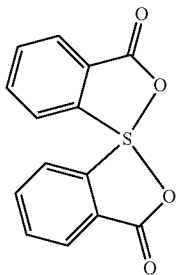
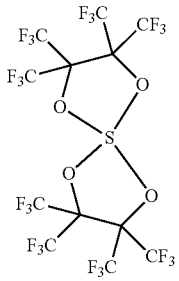
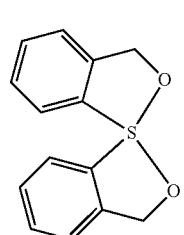
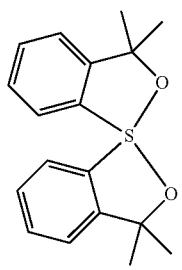
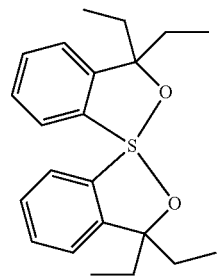
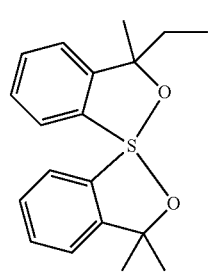

-continued

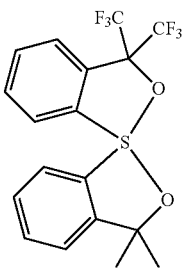
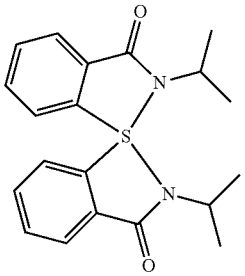
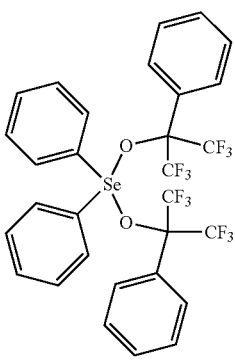
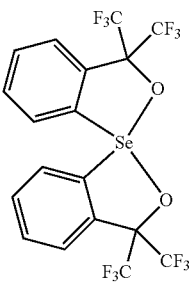
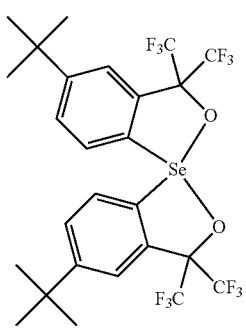
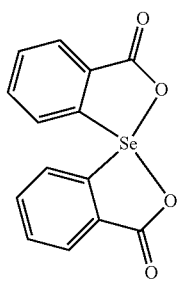
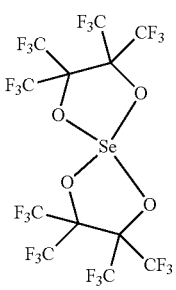
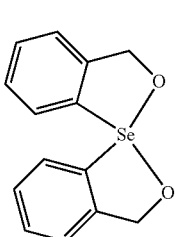
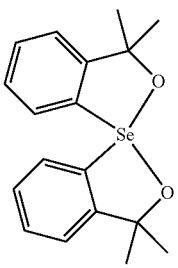

-continued

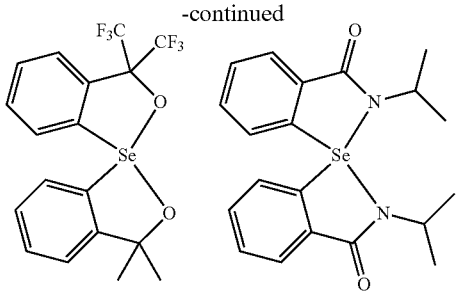

The compound having formula (A1) may be synthesized by a combination of well-known organic chemistry methods, for example, with reference to Journal of the Chemical Society [Section] D: Chemical Communications, 1971, 12, p 649-50, Journal of Organic Chemistry, Vol. 42, No. 25, 1977, p 4006-4016, and Journal of Organic Chemistry, Vol. 46, No. 6, 1981, p 1049-1053.

The compound having formula (A1) functions quite effectively as an acid diffusion inhibitor in a chemically amplified negative resist composition. As used herein, the "acid diffusion inhibitor" is a compound capable of trapping the acid generated from a photoacid generator in the chemically amplified negative resist composition to prevent the acid from diffusing to the unexposed region, for thereby forming the desired pattern.

Although the acid diffusion controlling mechanism of the compound having formula (A1) is not well understood, one assumption is described below. When the acid generated by the PAG acts on the compound, either of M-L$^1$ and M-L$^2$ bonds in the compound is cleaved whereby the compound is converted to a sulfonium cation or selenium cation. The counter anion is a conjugate base of the generated acid, meaning that the generated acid is trapped. As a consequence, the compound having formula (A1) functions as an acid diffusion inhibitor.

Amine compounds are used from the past as the acid diffusion inhibitor in photoresist compositions. The amine compound neutralizes and traps the acid generated by the PAG. The amine compound, however, brings about a dark/bright dimensional difference due to its localization within a resist film and its volatilization from a resist film surface layer (known as chemical flare). It is noted that the term "dark" refers to an area including wide light-shielded portion and "bright" refers to an area including wide exposed portion. The amine compound also causes profile faults due to substantial surface insolubilization. Although it is possible to prevent volatilization by designing the compound to a high molecular weight to elevate the boiling point, the problems of localization within resist film and substantial surface insolubilization are left unsolved.

In contrast, the compound having formula (A1) is a highly crystalline, non-volatile sulfurane or selenurane compound, which eliminates the risk of chemical flare. Since the compound having formula (A1) is low polar and highly compatible with the resist casting solvent (e.g., PGMEA), it is presumed that the compound is uniformly distributed within a resist film. This ensures uniform trapping of the generated acid in the exposed region, leading to improvements in LER and LWR.

Also known as the acid diffusion inhibitor other than the amine compound are onium salt type acid diffusion inhibitors. The onium salt type acid diffusion inhibitor is a salt compound of weak acid (the weak acid is, for example, a carboxylic acid or alkane sulfonic acid). It undergoes ion exchange with the strong acid (e.g., α,α'-difluorosulfonic acid) generated by the PAG, thereby trapping the generated acid. A weak acid is created instead, which is insufficient to cleave the acid labile group on the base polymer in a photoresist composition. Accordingly, the onium salt of weak acid functions as an acid diffusion inhibitor. Examples of the onium salt type acid diffusion inhibitor include salts of carboxylic acids and sulfonic acids as described in Patent Document 8 and JP-A 2003-005376.

As compared with the amine compounds, the onium salt type acid diffusion inhibitors are effective for improving LER and LWR at the sacrifice of contrast. This is because the acid trapping via ion exchange is not irreversible reaction, but equilibration reaction. That is, insufficient acid diffusion control invites a degradation of contrast.

In contrast, the compound having formula (A1) is effective not only for improving LER and LWR, but also for providing a high contrast and hence, a high resolution. This is because the compound having formula (A1) has a high diffusion control function capable of preventing the once trapped acid from being released again, rather than the equilibration reaction of the onium salt.

In the resist composition, the compound having formula (A1) is preferably present in an amount of 0.1 to 80 parts by weight, more preferably 1 to 70 parts by weight per 80 parts by weight of the base polymer (B) to be described later. As long as the amount of the compound is within the range, a satisfactory acid diffusion controlling function is exerted, and any performance losses such as a lowering of sensitivity and formation of foreign particles due to a shortage of dissolution are avoided. The compound having formula (A1) may be used alone or in admixture of two or more.

(B) Base Polymer

The base polymer as component (B) contains a polymer comprising repeat units having the following formula (B1). Notably, the polymer is referred to as polymer B and the units having formula (B1) are also referred to as units (B1). The repeat units (B1) are effective for providing etch resistance, adhesion to substrates, and solubility in alkaline developer.

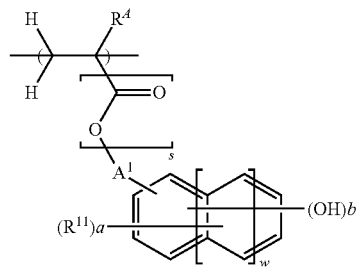

In formula (B1), R$^4$ is hydrogen, fluorine, methyl or trifluoromethyl.

In formula (B1), R$^{11}$ is halogen, an optionally halogenated C$_2$-C$_8$ saturated to hydrocarbylcarbonyloxy group, optionally halogenated C$_1$-C$_6$ saturated hydrocarbyl group, or optionally halogenated C$_1$-C$_6$ saturated hydrocarbyloxy group. The saturated hydrocarbyl group and saturated hydrocarbyl moiety in the saturated hydrocarbylcarbonyloxy group and saturated hydrocarbyloxy group may be straight, branched or cyclic. Examples thereof include alkyl groups such as methyl, ethyl, propyl, isopropyl, butyl, pentyl and hexyl; cycloalkyl groups such as cyclopropyl, cyclobutyl, cyclopentyl and cyclohexyl; and combinations thereof. A carbon count within the upper limit ensures a sufficient solubility in alkaline developer. When "a" is 2 or more, a plurality of groups $R^{11}$ may be identical or different.

In formula (B1), $A^1$ is a single bond or a $C_1$-$C_{10}$ saturated hydrocarbylene group in which any constituent —$CH_2$— may be replaced by —O—. The saturated hydrocarbylene group may be straight, branched or cyclic and examples thereof include alkanediyl groups such as methylene, ethane-1,2-diyl, propane-1,3-diyl, butane-1,4-diyl, pentane-1,5-diyl, hexane-1,6-diyl, and structural isomers thereof; cyclic saturated hydrocarbylene groups such as cyclopropanediyl, cyclobutanediyl, cyclopentanediyl, and cyclohexanediyl; and combinations thereof. For the saturated hydrocarbylene group containing an ether bond, in case of s=1 in formula (B1), the ether bond may be incorporated at any position excluding the position between the α- and β-carbons relative to the ester oxygen. In case of s=0, the atom bonding to the backbone becomes an ether oxygen atom, and a second ether bond may be incorporated at any position excluding the position between the α- and β-carbons relative to the ether oxygen. Saturated hydrocarbylene groups having no more than 10 carbon atoms are desirable because of a sufficient solubility in alkaline developer.

In formula (B1), s is 0 or 1. The subscript w is an integer of 0 to 2. The corresponding structure represents a benzene skeleton when w=0, a naphthalene skeleton when w=1, and an anthracene skeleton when w=2. The subscript "a" is an integer in the range: 0≤a≤5+2w−b, and b is an integer of 1 to 3. In case of w=0, preferably "a" is an integer of 0 to 3, and b is an integer of 1 to 3. In case of w=1 or 2, preferably "a" is an integer of 0 to 4, and b is an integer of 1 to 3.

Preferred examples of the repeat units (B1) wherein s=0 and $A^1$ is a single bond (meaning that the aromatic ring is directly bonded to the main chain of the polymer), that is, repeat units free of a linker: —C(=O)—O-$A^1$- include units derived from 3-hydroxystyrene, 4-hydroxystyrene, 5-hydroxy-2-vinylnaphthalene, and 6-hydroxy-2-vinylnaphthalene. More preferred are repeat units having the formula (B1-1).

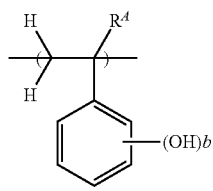

(B1-1)

Herein $R^A$ and b are as defined above.

Preferred examples of the repeat units (B1) wherein s=1, that is, having a linker: —CO—O-$A^1$- are shown below, but not limited thereto.

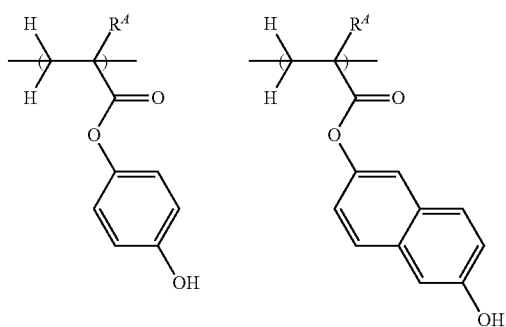

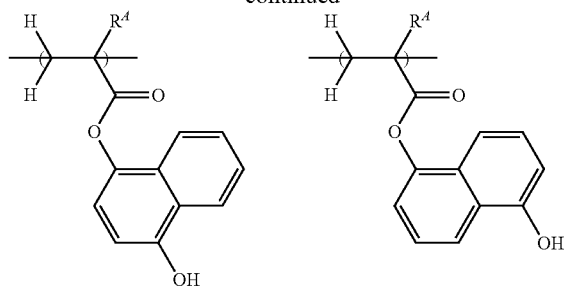

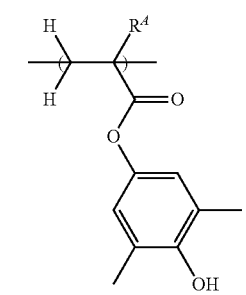 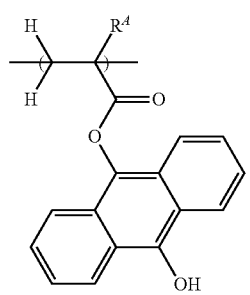

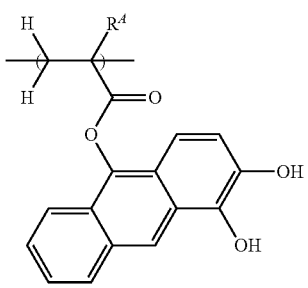 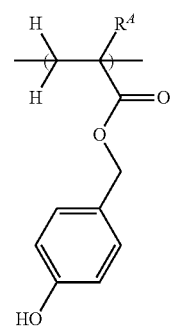

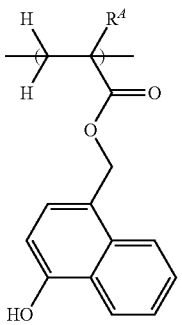 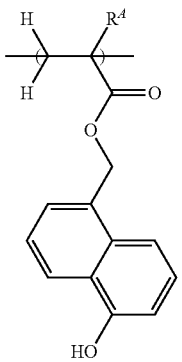

Herein $R^A$ is as defined above.

The repeat units (B1) may be of one type or a combination of plural types.

For the purpose of improving etch resistance, preferably the polymer B further comprises repeat units of at least one type selected from repeat units having the formula (B2), repeat units having the formula (B3) and repeat units having the formula (B4). Notably these units are simply referred to as repeat units (B2), (B3) and (B4).

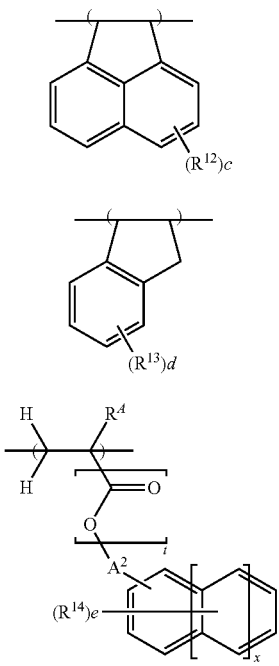

In formulae (B2) and (B3), $R^{12}$ and $R^{13}$ are each independently hydroxy, halogen, an optionally halogenated $C_2$-$C_8$ saturated hydrocarbylcarbonyloxy group, optionally halogenated $C_1$-$C_8$ saturated hydrocarbyl group, or optionally halogenated $C_1$-$C_8$ saturated hydrocarbyloxy group. The saturated hydrocarbyl group, saturated hydrocarbyloxy group, and saturated hydrocarbylcarbonyloxy group may be straight, branched or cyclic. When c is 2 or more, a plurality of groups $R^{12}$ may be identical or different. When d is 2 or more, a plurality of groups $R^{13}$ may be identical or different.

In formulae (B2) and (3), c and d are each independently an integer of 0 to 4.

In formula (B4), $R^A$ is as defined above. $R^{14}$ is an acetyl group. $C_1$-$C_{20}$ saturated hydrocarbyl group, $C_1$-$C_{20}$ saturated hydrocarbyloxy group, $C_2$-$C_{20}$ saturated hydrocarbylcarbonyloxy group, $C_2$-$C_{20}$ saturated hydrocarbyloxyhydrocarbyl group, $C_2$-$C_{20}$ saturated hydrocarbylthiohydrocarbyl group, halogen atom, nitro group, cyano group, sulfinyl group, or sulfonyl group. The saturated hydrocarbyl group, saturated hydrocarbyloxy group, saturated hydrocarbylcarbonyloxy group, saturated hydrocarbyloxyhydrocarbyl group, and saturated hydrocarbylthiohydrocarbyl group may be straight, branched or cyclic. When e is 2 or more, a plurality of groups $R^4$ may be identical or different.

$R^{14}$ is preferably selected from halogen atoms such as chlorine, bromine and iodine; saturated hydrocarbyl groups such as methyl, ethyl, propyl, butyl, pentyl, hexyl, cyclopentyl, cyclohexyl, and structural isomers thereof; and saturated hydrocarbyloxy groups such as methoxy, ethoxy, propoxy, butoxy, pentyloxy, hexyloxy, cyclopentyloxy, cyclohexyloxy, and structural isomers of their hydrocarbon moiety. Inter alia, methoxy and ethoxy are most useful.

The saturated hydrocarbylcarbonyloxy group may be readily introduced into a polymer even after polymerization, by a chemical modification method and is advantageously utilized for fine adjustment of the solubility of the polymer in alkaline developer. Examples of the saturated hydrocarbylcarbonyloxy group include methylcarbonyloxy, ethylcarbonyloxy, propylcarbonyloxy, butylcarbonyloxy, pentylcarbonyloxy, hexylcarbonyloxy, cyclopentylcarbonyloxy, cyclohexylcarbonyloxy, benzoyloxy, and structural isomers of their hydrocarbon moiety. As long as the carbon count is equal to or less than 20, an appropriate effect of controlling or adjusting (typically reducing) the solubility of the polymer in alkaline developer is obtainable, and the generation of scum or development defects may be suppressed.

Of the foregoing preferred substituent groups, such substituent groups as chlorine, bromine, iodine, methyl, ethyl and methoxy are useful because the corresponding monomers may be readily prepared.

In formula (B4), $A^2$ is a single bond or $C_1$-$C_{10}$ saturated hydrocarbylene group in which any constituent —$CH_2$— may be replaced by —O—. The saturated hydrocarbylene group may be straight, branched or cyclic. Examples thereof include alkanediyl groups such as methylene, ethane-1,2-diyl, propane-1,3-diyl, butane-1,4-diyl, pentane-1,5-diyl, hexane-1,6-diyl, and structural isomers thereof; cyclic saturated hydrocarbylene groups such as cyclopropanediyl, cyclobutanediyl, cyclopentanediyl, and cyclohexanediyl; and combinations thereof. For the saturated hydrocarbylene group containing an ether bond, in case of t=1 in formula (B4), the ether bond may be incorporated at any position excluding the position between the α- and β-carbons relative to the ester oxygen. In case of t=0, the atom bonding to the backbone becomes an ether oxygen atom, and a second ether bond may be incorporated at any position excluding the position between the α- and β-carbons relative to the ether oxygen. Saturated hydrocarbylene groups having no more than 10 carbon atoms are desirable because of a sufficient solubility in alkaline developer.

In formula (B4), e is an integer of 0 to 5, and t is 0 or 1. The subscript x is an integer of 0 to 2; the corresponding structure represents a benzene skeleton when x=0, a naphthalene skeleton when x=1, and an anthracene skeleton when x=2. In case x=0, preferably e is an integer of 0 to 3; in case x=1 or 2, preferably e is an integer of 0 to 4.

Preferred examples of the repeat units (B4) wherein t is 0 and $A^2$ is a single bond (meaning that the aromatic ring is directly bonded to the main chain of the polymer), that is, repeat units free of the linker: —C(=O)—O-$A^2$- include units derived from styrene, 4-chlorostyrene, 4-bromostyrene, 4-methylstyrene, 4-methoxystyrene, 4-acetoxystyrene, 2-hydroxypropylstyrene, 2-vinylnaphthalene, and 3-vinylnaphthalene.

Preferred examples of the repeat units (B4) wherein t is 1, that is, having an ester bond as the linker are shown below, but not limited thereto. $R^A$ is as defined above.

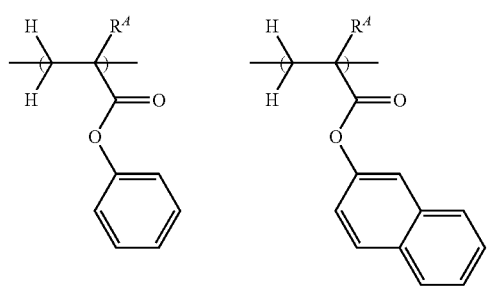

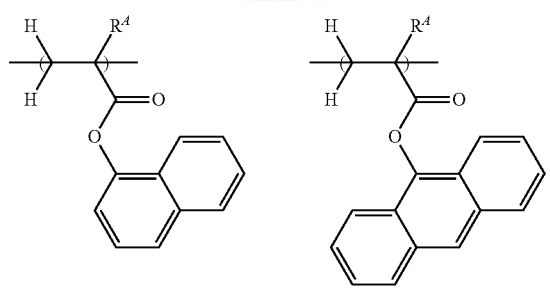
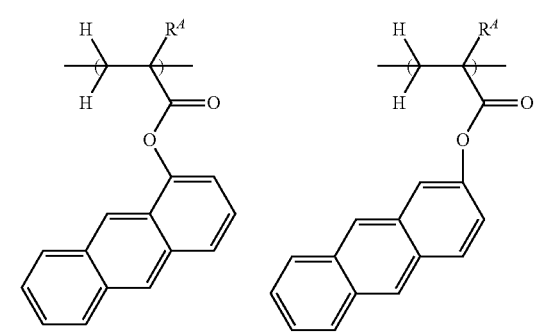
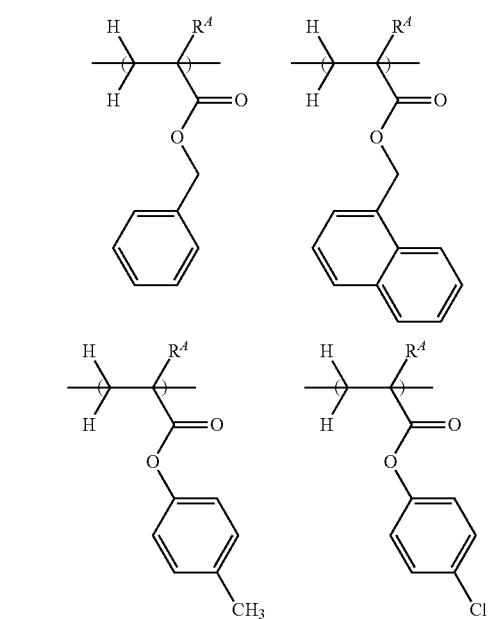
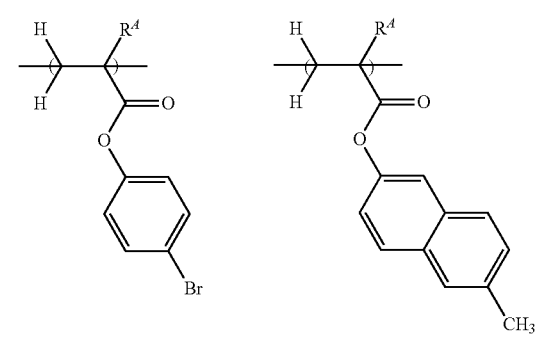
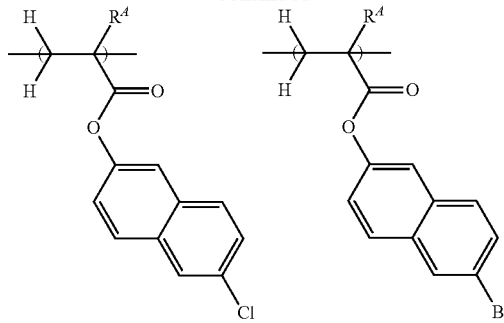
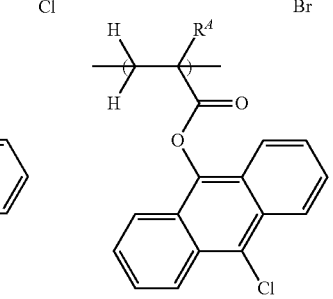
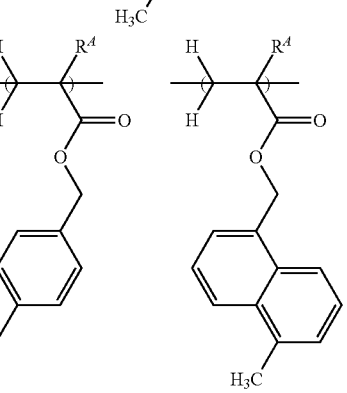
When repeat units of at least one type selected from repeat units (B2) to (B4) are incorporated, better performance is obtained because not only the aromatic ring possesses etch resistance, but the cyclic structure incorporated into the main chain also exerts the effect of improving resistance to etching and EB irradiation during pattern inspection step.

The repeat units (B2) to (B4) may be of one type or a combination of plural types.

The polymer B may further comprise repeat units having the formula (B5). Notably the repeat units having formula (B5) are simply referred to as repeat units (B5), and of the polymers B, a polymer further comprising repeat units (B5) is referred to as polymer B'.

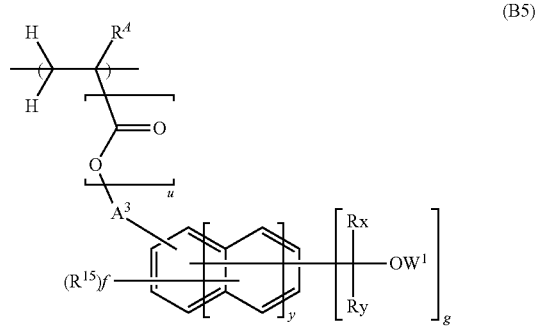

(B5)

Upon exposure to high-energy radiation, the repeat unit (B5) functions such that the acid labile group undergoes elimination reaction under the action of an acid which is generated by the acid generator. That is, the unit (B5) induces alkali insolubilization and crosslinking reaction between polymer molecules. The repeat unit (B5) provides for efficient progress of negative-working reaction, leading to an improvement in resolution performance.

In formula (B5), $R^4$ is as defined above. $R^{15}$ is each independently halogen, an optionally halogenated $C_2$-$C_8$ saturated hydrocarbylcarbonyloxy group, optionally halogenated $C_1$-$C_6$ saturated hydrocarbyl group, or optionally halogenated $C_1$-$C_6$ saturated hydrocarbyloxy group. The saturated hydrocarbyl group and saturated hydrocarbyl moiety in the saturated hydrocarbylcarbonyloxy group and saturated hydrocarbyloxy group may be straight, branched or cyclic. Examples thereof include alkyl groups such as methyl, ethyl, propyl, isopropyl, butyl, pentyl, hexyl and structural isomers thereof; cycloalkyl groups such as cyclopropyl, cyclobutyl, cyclopentyl, and cyclohexyl; and combinations thereof. When f is 2 or more, a plurality of groups $R^{15}$ may be identical or different.

In formula (B5), $A^3$ is a single bond or $C_1$-$C_{10}$ saturated hydrocarbylene group in which a constituent —$CH_2$— may be replaced by —O—. The saturated hydrocarbylene group may be straight, branched or cyclic and examples thereof include alkanediyl groups such as methylene, ethane-1,2-diyl, propane-1,3-diyl, butane-1,4-diyl, pentane-1,5-diyl, hexane-1,6-diyl, and structural isomers thereof; cyclic saturated hydrocarbylene groups such as cyclopropanediyl, cyclobutanediyl, cyclopentanediyl, and cyclohexanediyl; and combinations thereof. For the saturated hydrocarbylene group containing an ether bond, in case of u=1 in formula (B5), the ether bond may be incorporated at any position excluding the position between the α- and β-carbons relative to the ester oxygen. In case of u=0, the atom bonding to the backbone becomes an ether oxygen atom, and a second ether bond may be incorporated at any position excluding the position between the α- and β-carbons relative to the ether oxygen.

In formula (B5), $W^1$ is hydrogen, a $C_1$-$C_{10}$ aliphatic hydrocarbyl group, or an optionally substituted aryl group. The aliphatic hydrocarbyl group may be straight, branched or cyclic and examples thereof include alkyl groups such as methyl, ethyl, propyl, and isopropyl; and cyclic aliphatic hydrocarbyl groups such as cyclopentyl, cyclohexyl, and adamantyl. Typical of the aryl groups is phenyl. In the aliphatic hydrocarbyl group, a constituent —$CH_2$— may be replaced by —O—, —C(=O)—, —O—C(=O)— or —C(=O)—O—. The constituent —$CH_2$— in the hydrocarbyl group may be one bonded to the oxygen atom in formula (B5). Typical of the replaced group is methylcarbonyl.

In formula (B5), Rx and Ry are each independently hydrogen, a $C_1$-$C_{15}$ saturated hydrocarbyl group which may be substituted with a hydroxy or saturated hydrocarbyloxy moiety, or an optionally substituted aryl group, excluding that both Rx and Ry are hydrogen at the same time. Rx and Ry may bond together to form a ring with the carbon atom to which they are attached. Preferred examples of Rx and Ry include alkyl groups such as methyl, ethyl, propyl, butyl and structural isomers thereof, and substituted forms of the foregoing groups in which some hydrogen is substituted by a hydroxy or saturated hydrocarbyloxy moiety.

In formula (B5), y is an integer of 0 to 2, and the corresponding structure represents a benzene skeleton when y=0, a naphthalene skeleton when y=1, and an anthracene skeleton when y=2. The subscript u is or 1, f is an integer in the range: 0≤f≤5+2y−g, and g is an integer of 1 to 3.

Of the repeat units (B5), repeat units having formula (B5-1) or (B5-2) are preferred.

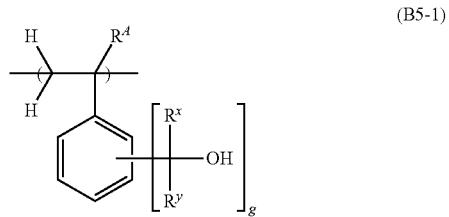

(B5-1)

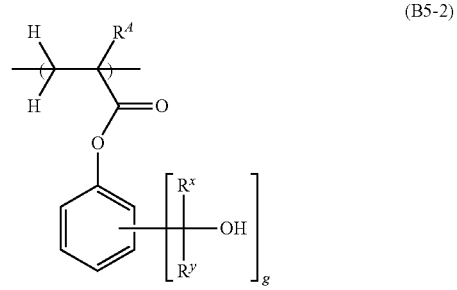

(B5-2)

Herein $R^4$, Rx, Ry, and g are as defined above.

Preferred examples of the repeat unit (B5) are given below, but not limited thereto. Herein $R^4$ is as defined above.

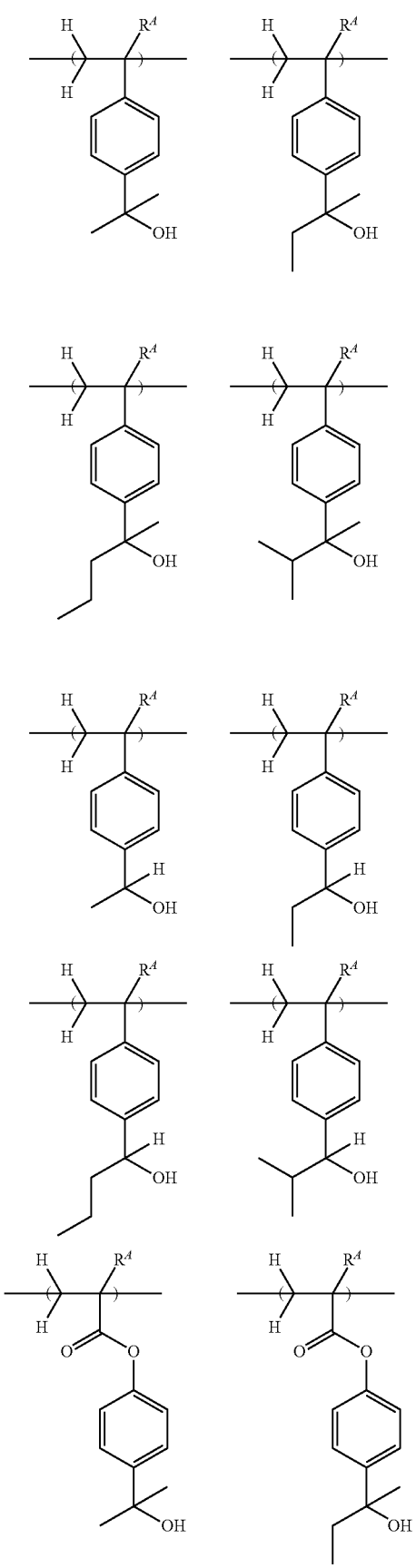
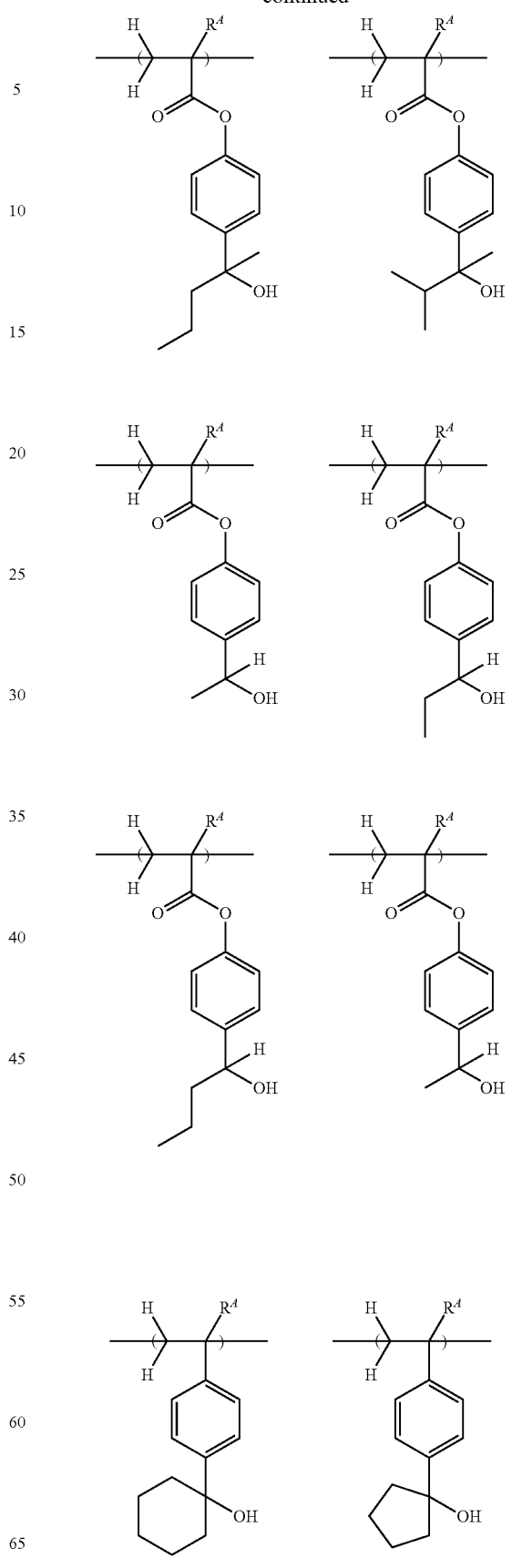

-continued
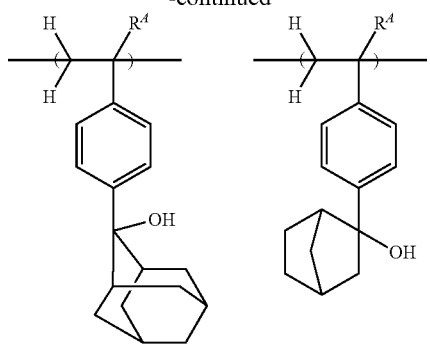
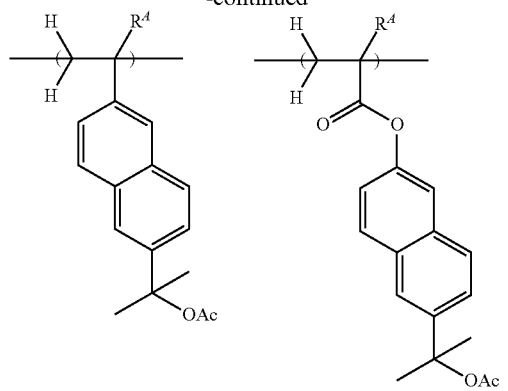
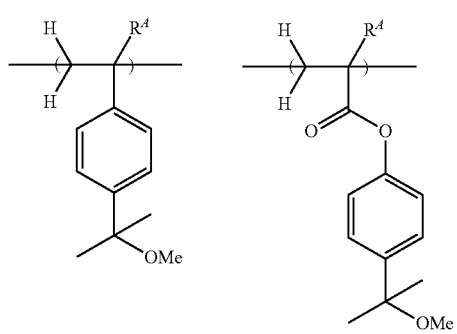
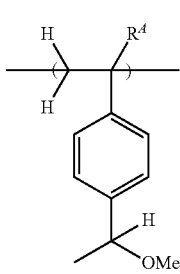
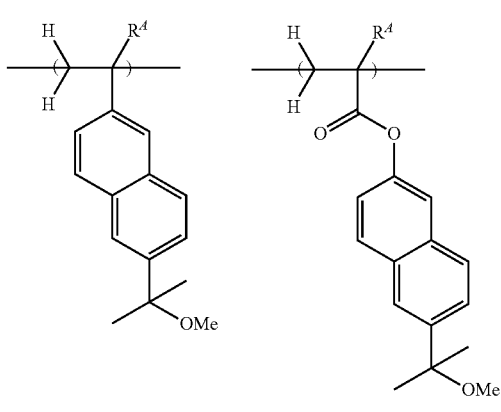
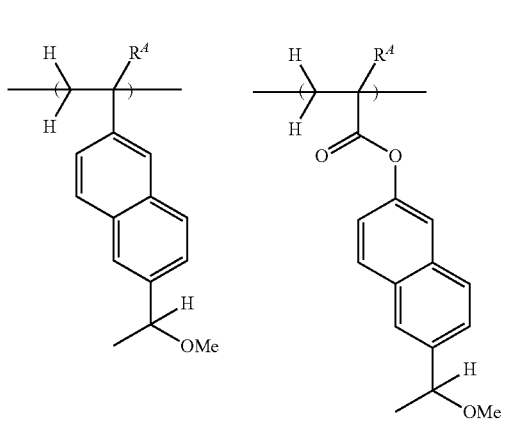
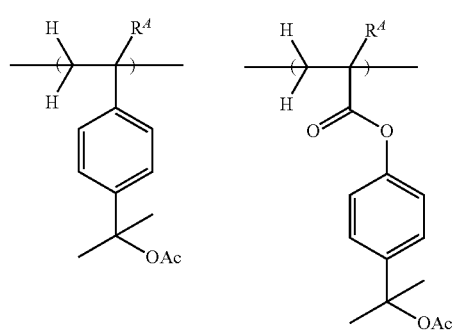
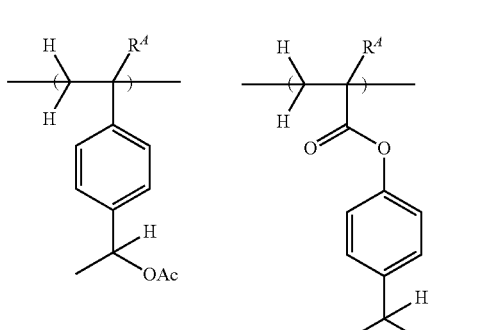

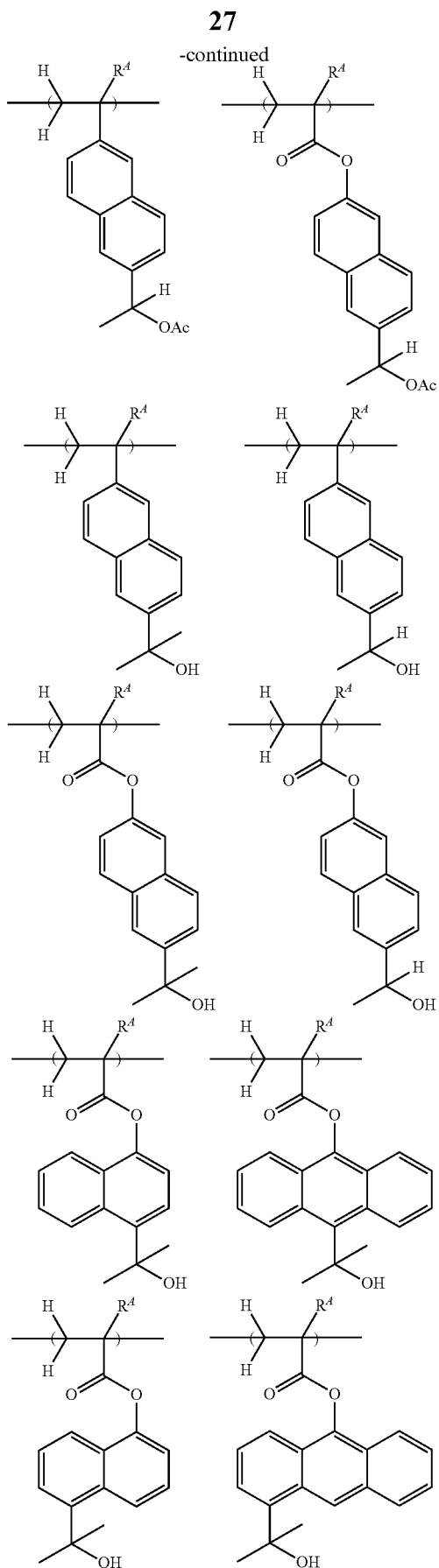
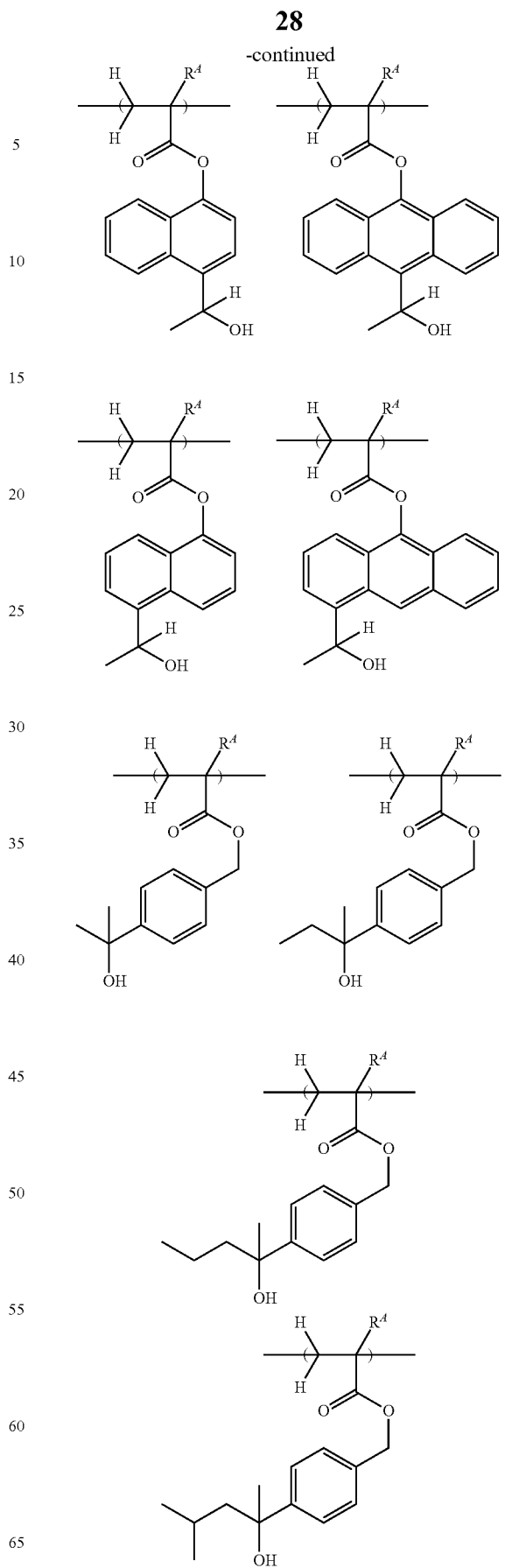

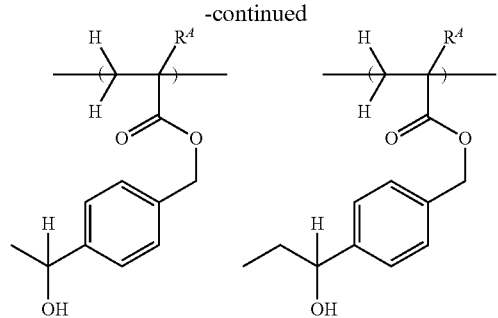
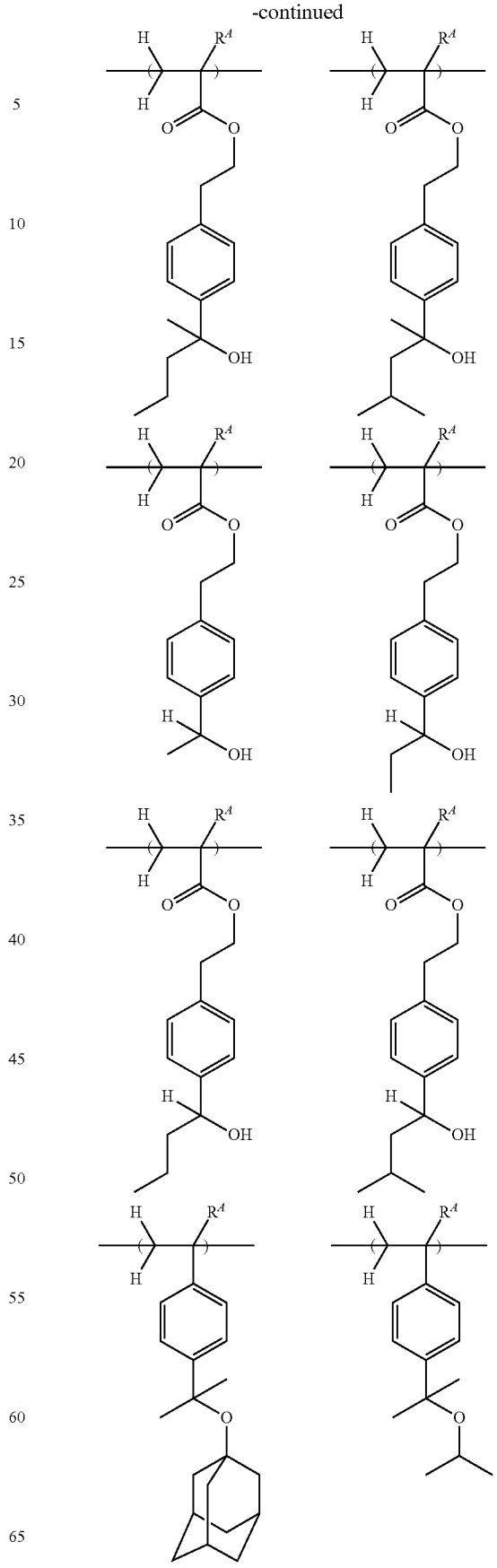

-continued
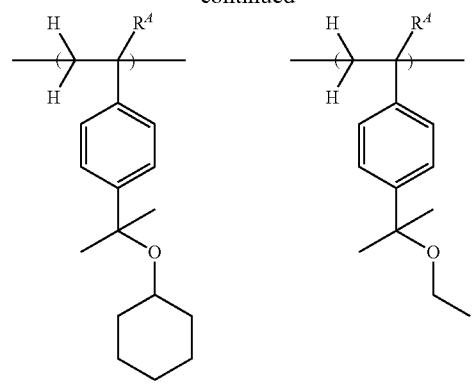
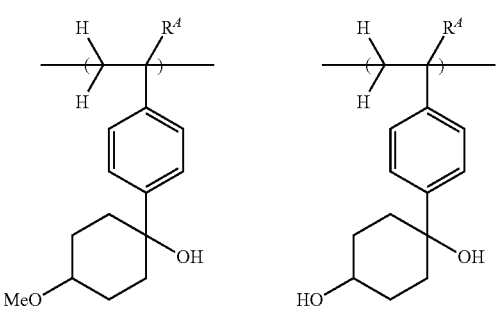
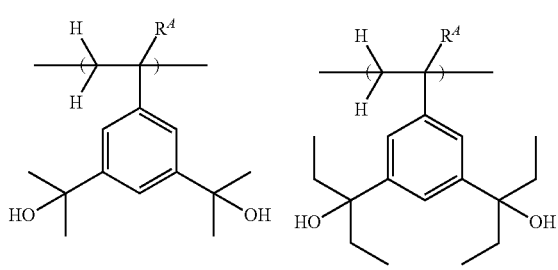
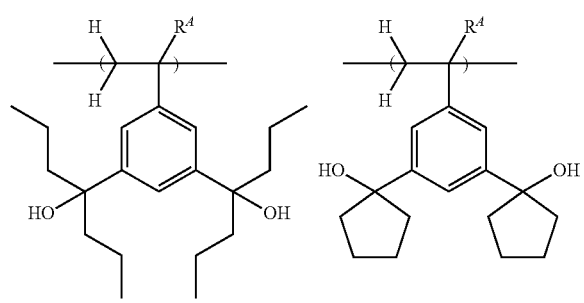
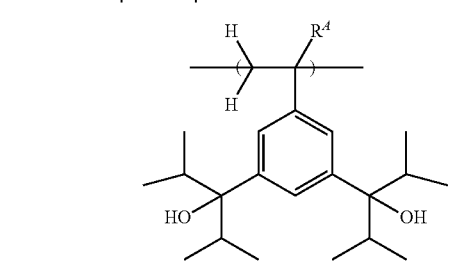
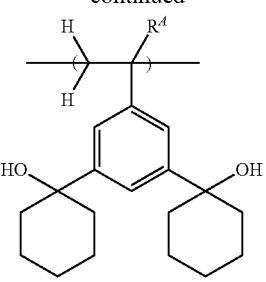
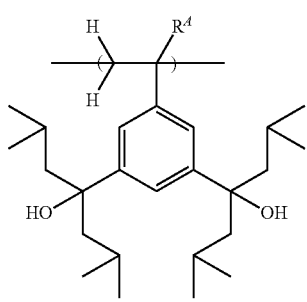
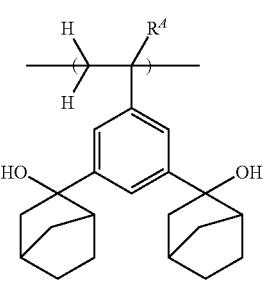
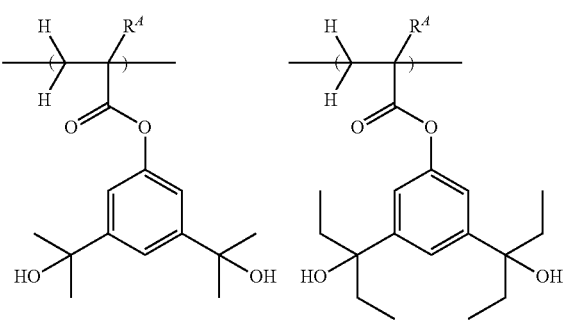
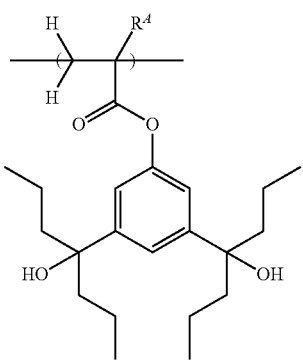

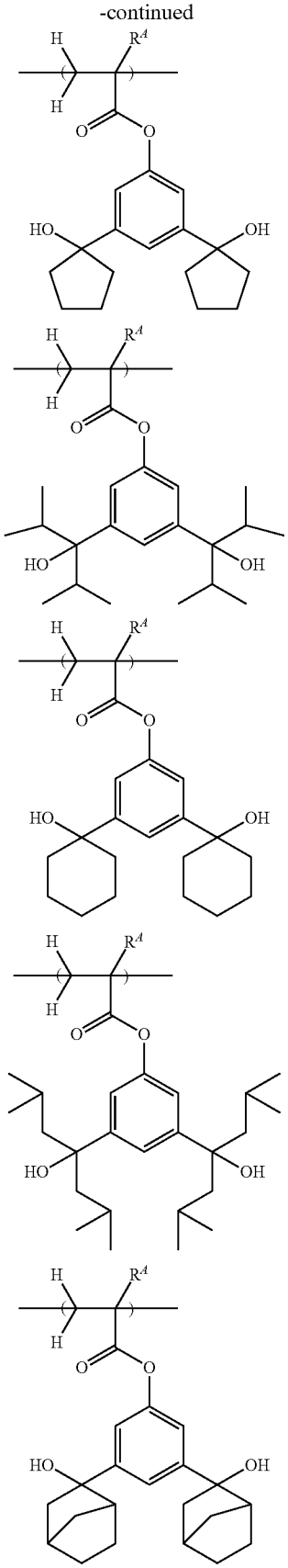
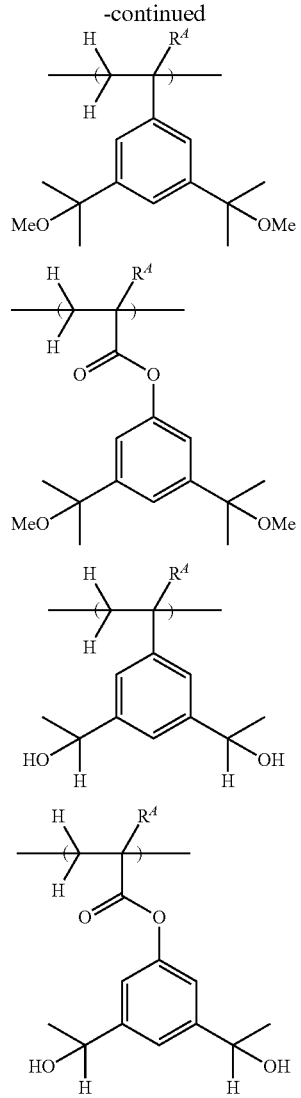

The repeat unit (B5) may be of one type or a combination of plural types.

The polymer B' may further comprise repeat units of at least one type selected from repeat units having the formula (B6), repeat units having the formula (B7), repeat units having the formula (B8), repeat units having the formula (B9), repeat units having the formula (B10), repeat units having the formula (B11), repeat units having the formula (B12), and repeat units having the formula (B13). Notably these repeat units are also referred to as repeat units (B6) to (B13).

(B6)

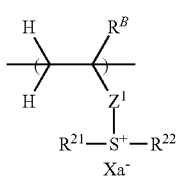

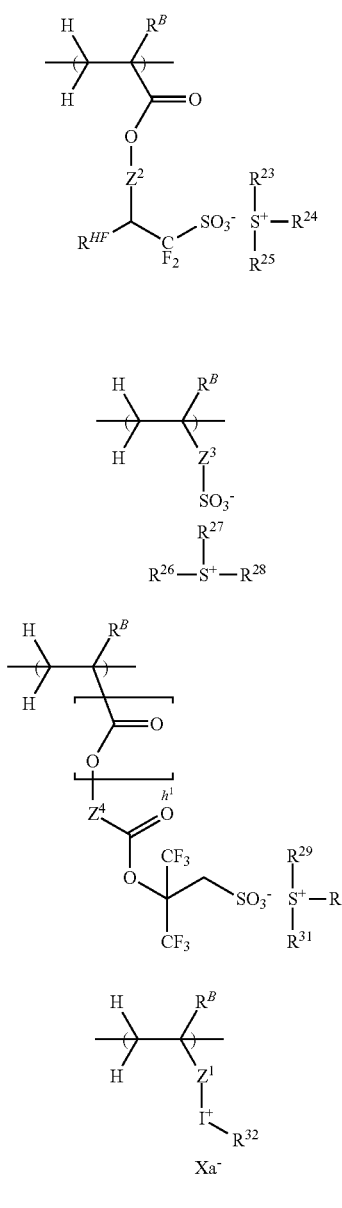

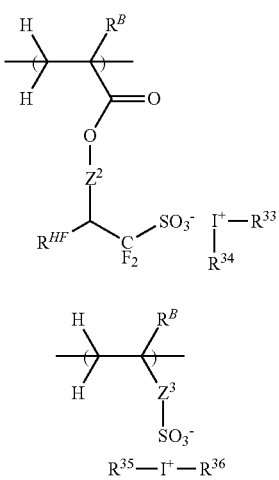

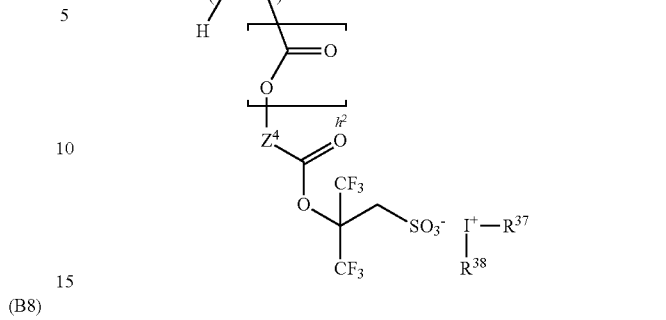

In formulae (B6) to (B13), $R^B$ is each independently hydrogen or methyl. $Z^1$ is a single bond, a $C_1$-$C_6$ aliphatic hydrocarbyl group, phenylene group, naphthylene group, or $C_7$-$C_{18}$ group obtained by combining the foregoing, —O—$Z^{11}$—, —C(=O)—O—$Z^{11}$—, or —C(=O)—NH—$Z^{11}$—, wherein $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety. $Z^2$ is a single bond or —$Z^{21}$—C(=O)—O—, wherein $Z^{21}$ is a $C_1$-$C_{20}$ hydrocarbylene group which may contain a heteroatom. $Z^3$ is a single bond, methylene, ethylene, phenylene, fluorinated phenylene, trifluoromethyl-substituted phenylene group, —O—$Z^{31}$—, —C(=O)—O—$Z^{31}$—, or —C(=O)—NH—$Z^{31}$—, wherein $Z^{31}$ is a $C_1$-$C_6$ aliphatic hydrocarbylene group, phenylene group, fluorinated phenylene group, trifluoromethyl-substituted phenylene group, or $C_7$-$C_{20}$ group obtained by combining the foregoing, which may contain a carbonyl moiety, ester bond, ether bond or hydroxy moiety. $Z^4$ is a single bond or a $C_1$-$C_{30}$ hydrocarbylene group which may contain a heteroatom. The subscripts $h^1$ and $h^2$ are each independently 0 or 1. When $Z^4$ is a single bond, $h^1$ and $h^2$ are 0.

In formulae (B7) and (B11) wherein $Z^2$ is —$Z^{21}$—C(=O)—O—, $Z^{21}$ is a $C_1$-$C_{20}$ hydrocarbylene group which may contain a heteroatom, examples of which are shown below, but not limited thereto.

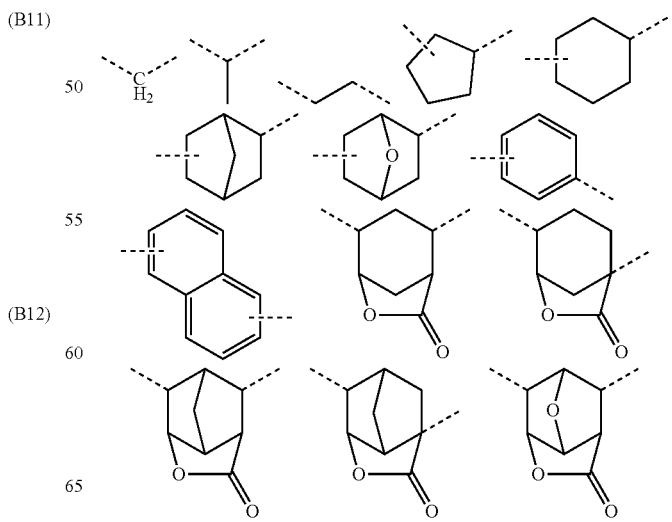

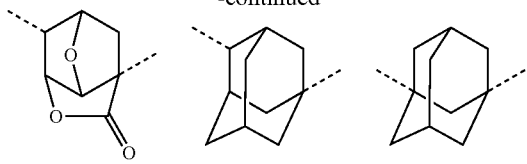

In formulae (B7) and (B11), $R^{HF}$ is hydrogen or trifluoromethyl. Examples of the repeat units (B7) and (B11) wherein $R^{HF}$ is hydrogen include those described in JP-A 2010-116550. Examples of the repeat units (B7) and (B11) wherein $R^{HF}$ is trifluoromethyl include those described in JP-A 2010-077404. Examples of the repeat units (B8) and (B12) include those described in JP-A 2012-246265 and JP-A 2012-246426.

In formulae (B6) and (B10), $Xa^-$ is a non-nucleophilic counter ion, examples of which include those described in JP-A 2010-113209 and JP-A 2007-145797.

Preferred examples of the anion in the monomer from which repeat units (B9) and (B13) are derived are shown below, but not limited thereto.

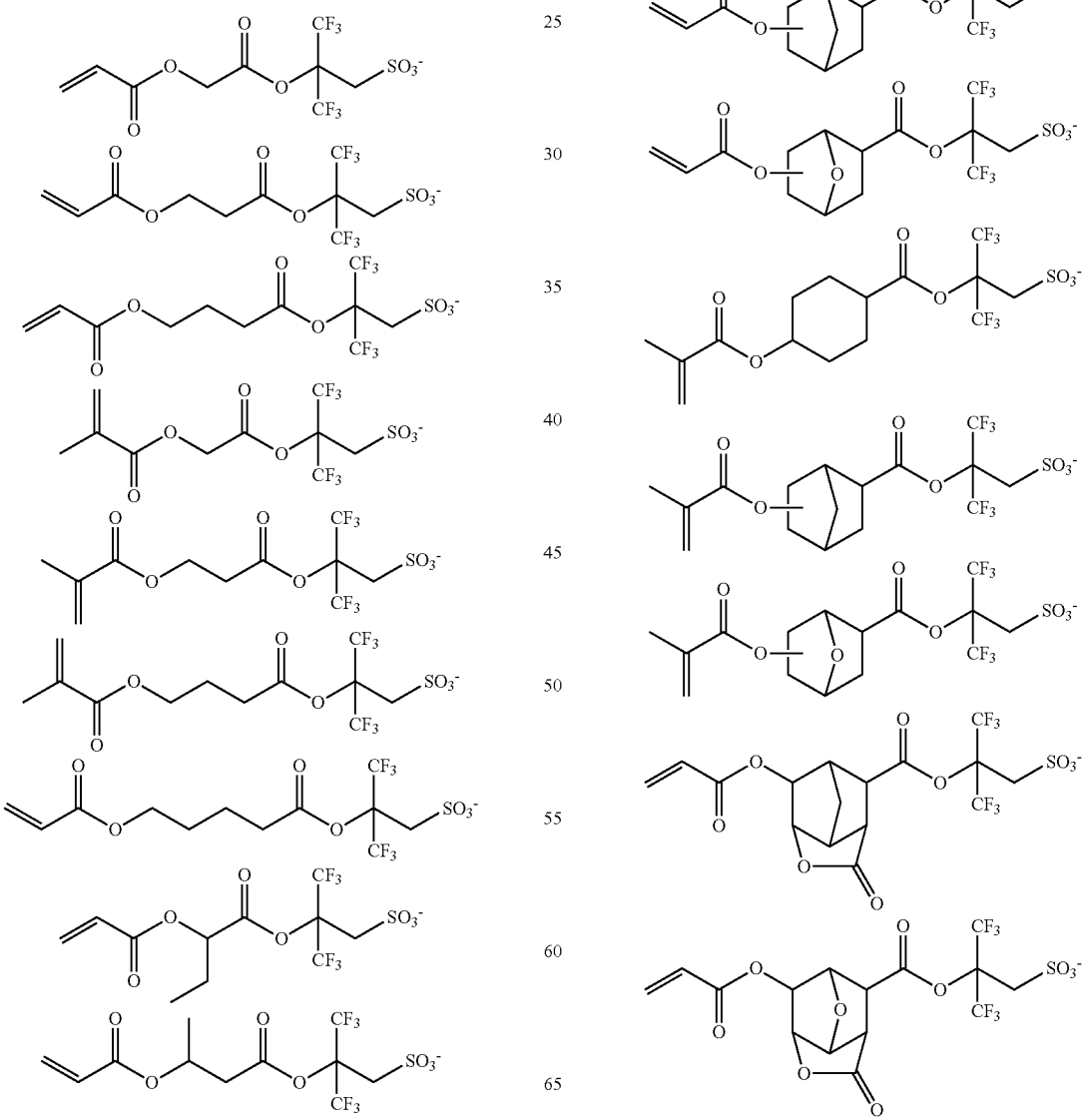

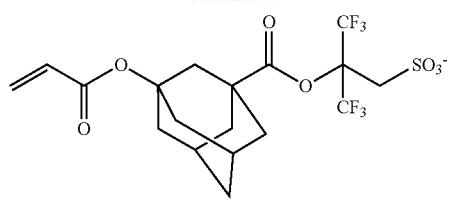
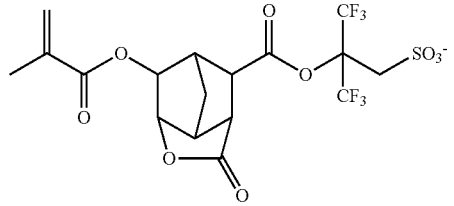
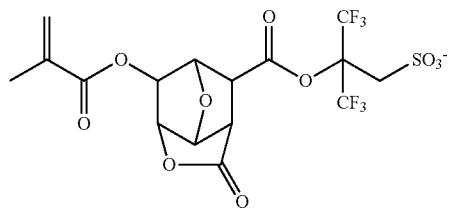
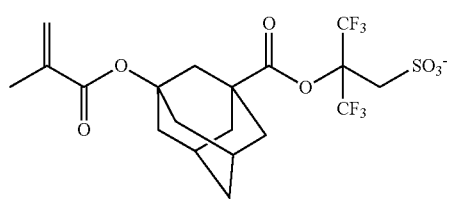
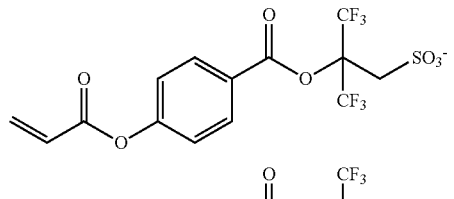
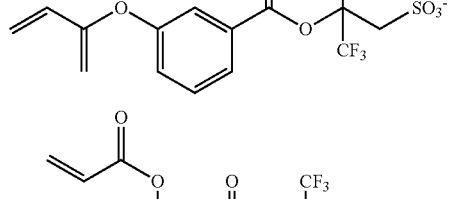
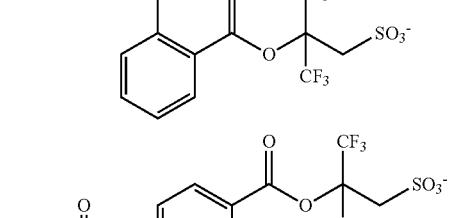
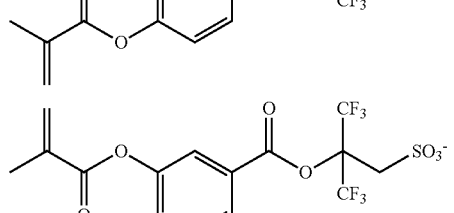
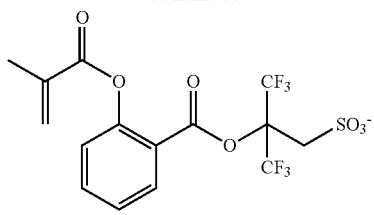
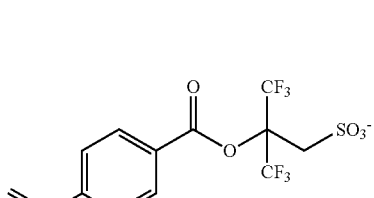
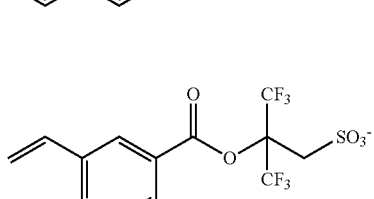
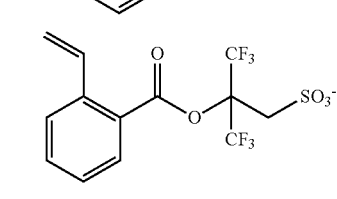
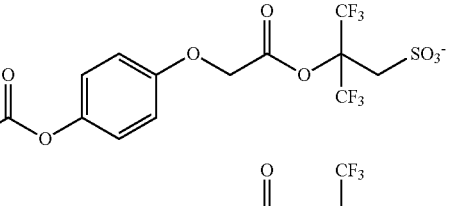
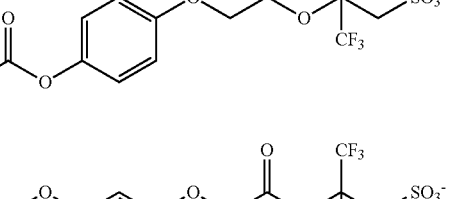
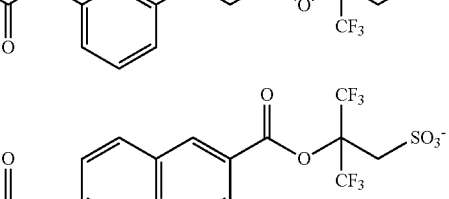
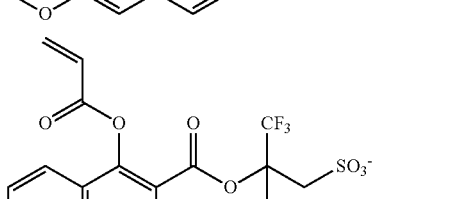

-continued

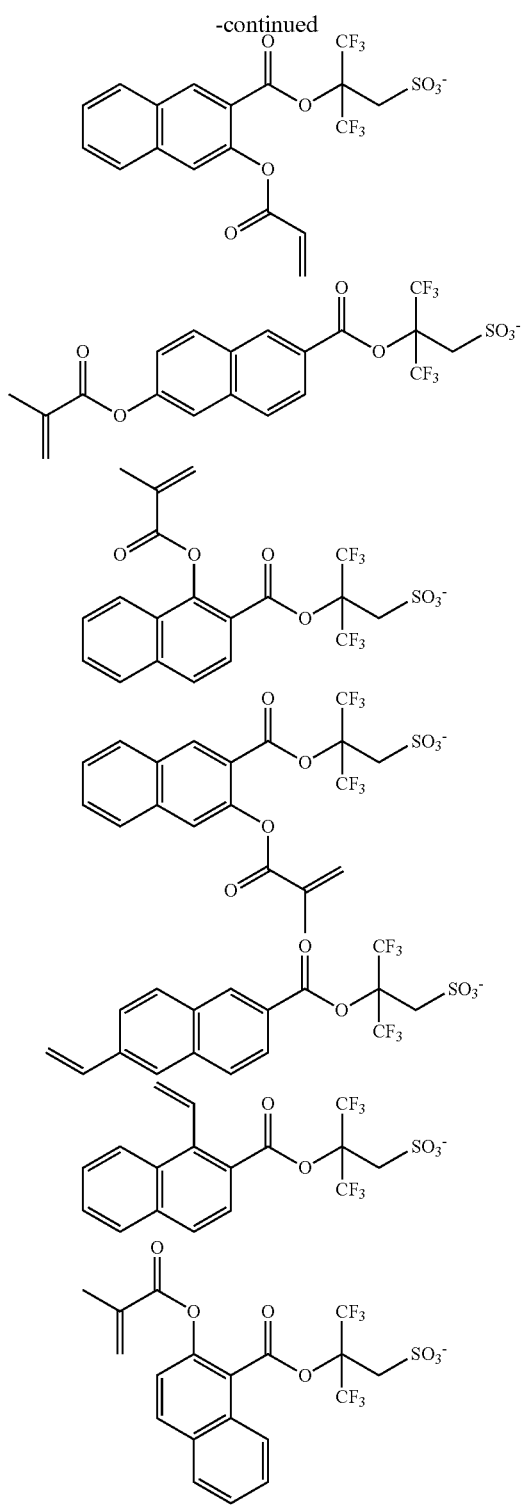

In formulae (86) to (B13), $R^{21}$ to $R^{38}$ are each independently a $C_1$-$C_{20}$ hydrocarbyl group which may contain a heteroatom. The hydrocarbyl group may be saturated or unsaturated and straight, branched or cyclic, and examples thereof are as exemplified above for the hydrocarbyl groups $R^1$ to $R^4$. In the hydrocarbyl group, some or all of the hydrogen atoms may be substituted by a moiety containing a heteroatom such as oxygen, sulfur, nitrogen or halogen, and a moiety containing a heteroatom such as oxygen, sulfur or nitrogen may intervene in a carbon-carbon bond, so that the group may contain a hydroxy moiety, fluorine, chlorine, bromine, iodine, cyano moiety, carbonyl moiety, ether bond, ester bond, sulfonic ester bond, carbonate bond, lactone ring, sultone ring, carboxylic anhydride or haloalkyl moiety.

A pair of $R^{21}$ and $R^{22}$ may bond together to form a ring with the sulfur atom to which they are attached. Also, $R^{23}$ and $R^{24}$, $R^{26}$ and $R^{27}$, or $R^{29}$ and $R^{30}$ may bond together to form a ring with the sulfur atom to which they are attached. Exemplary rings are shown below.

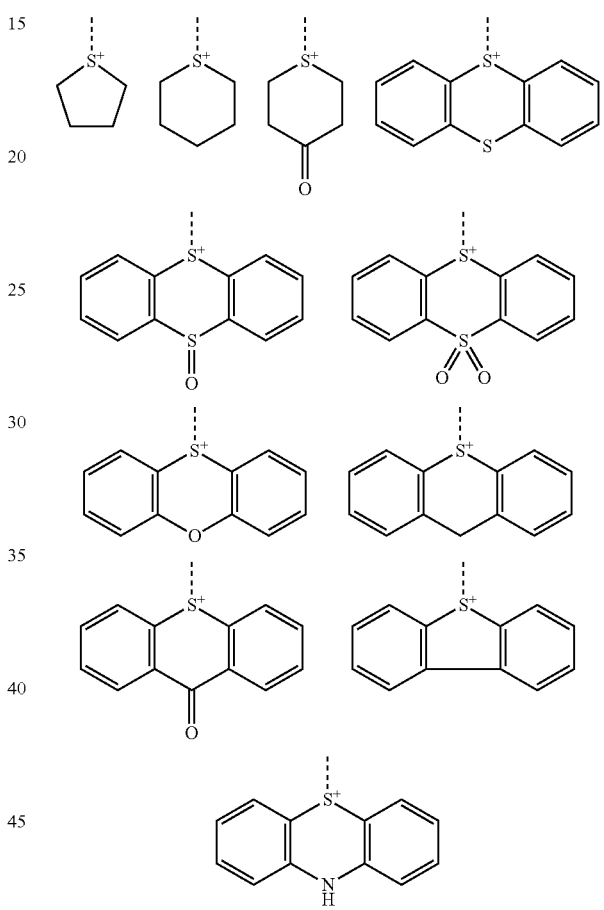

In formulae (B7) to (B9), exemplary structures of the sulfonium cation are shown below, but not limited thereto.

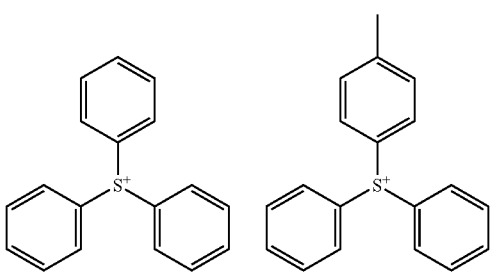

-continued
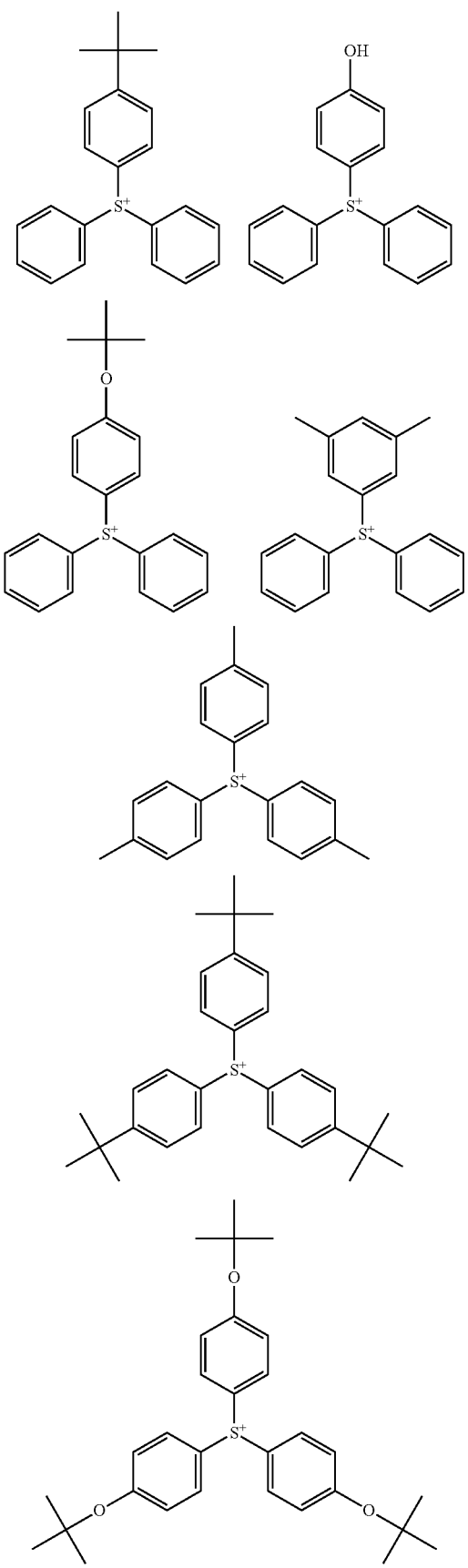
-continued
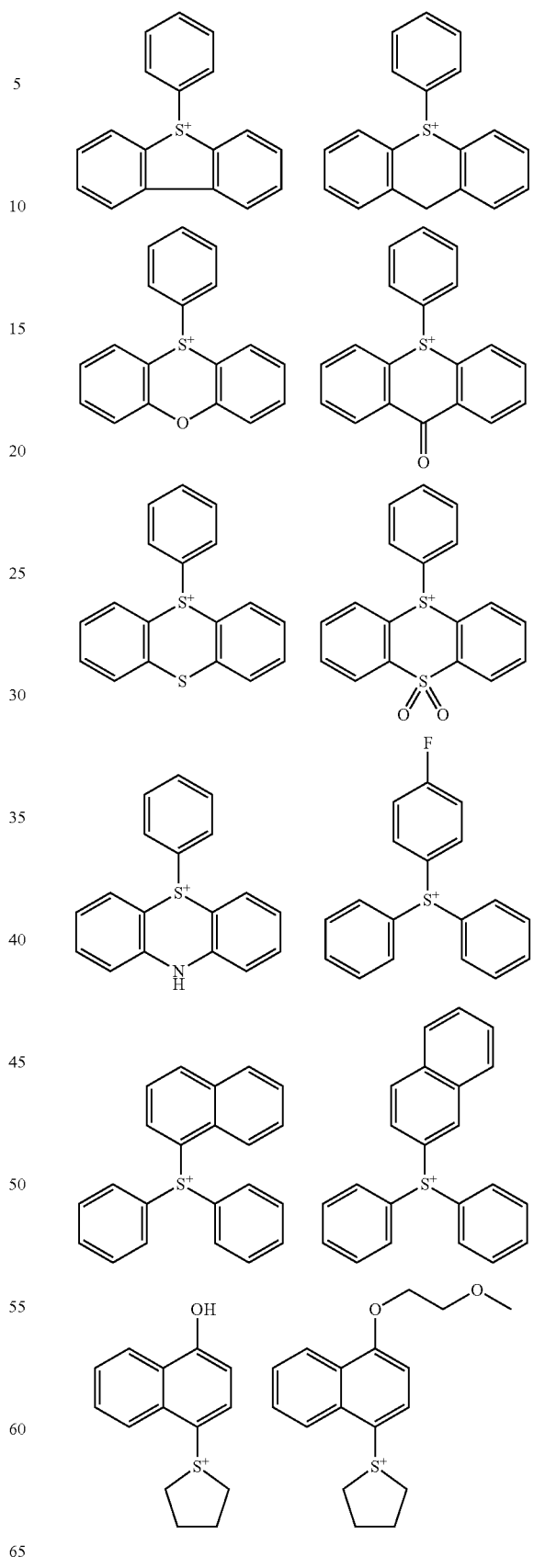

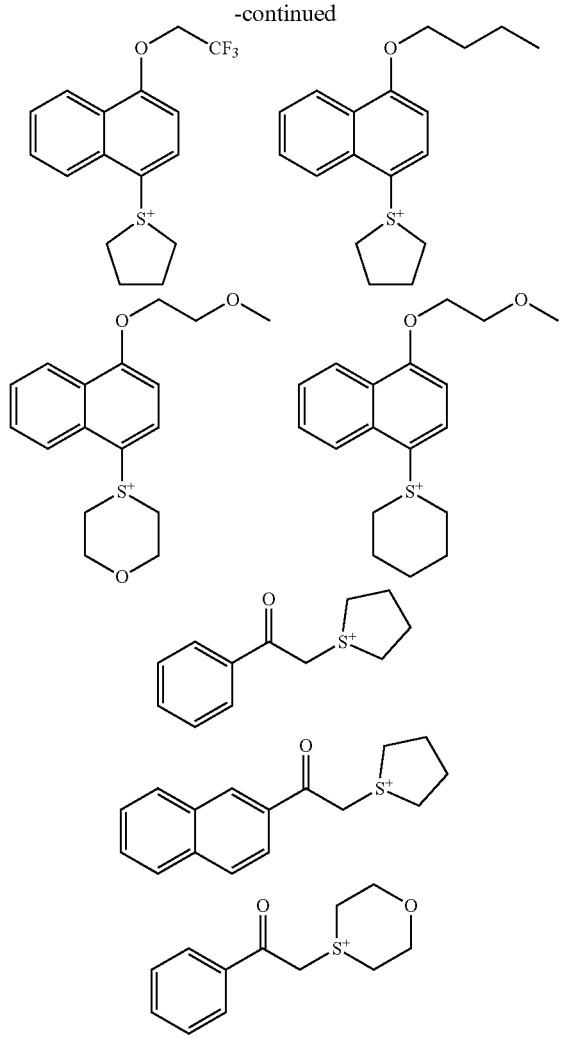
In formulae (B10) to (B13), exemplary structures of the iodonium cation are shown below, but not limited thereto.
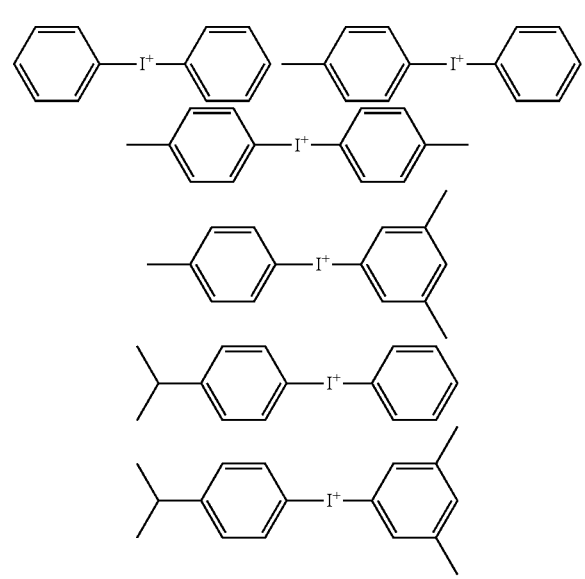
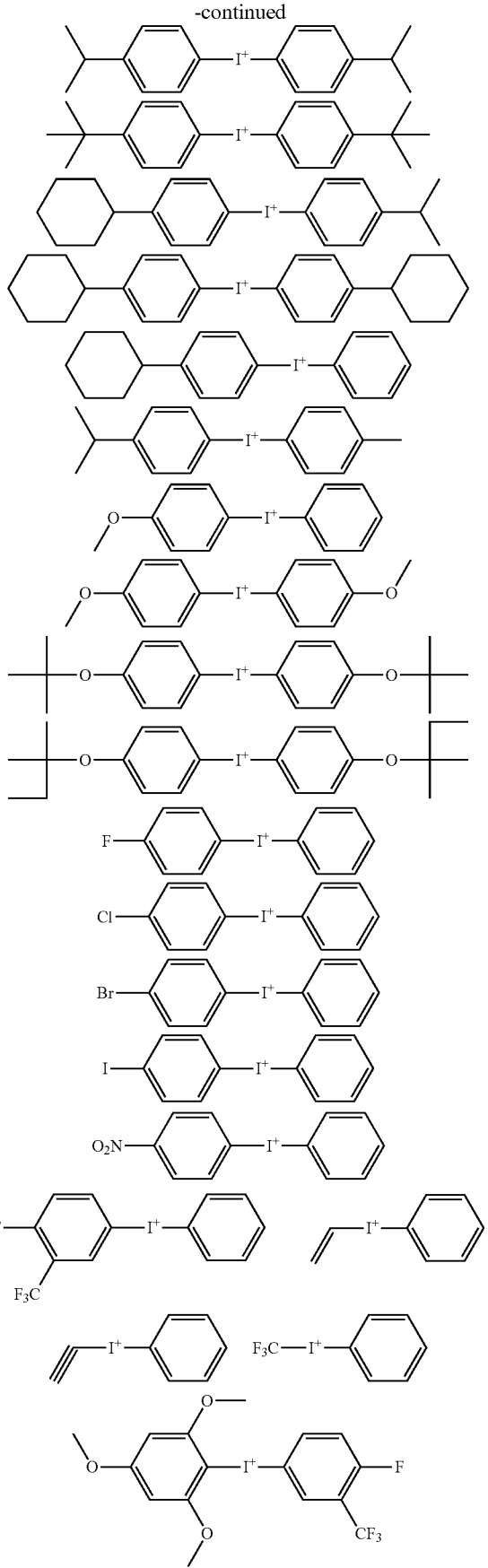

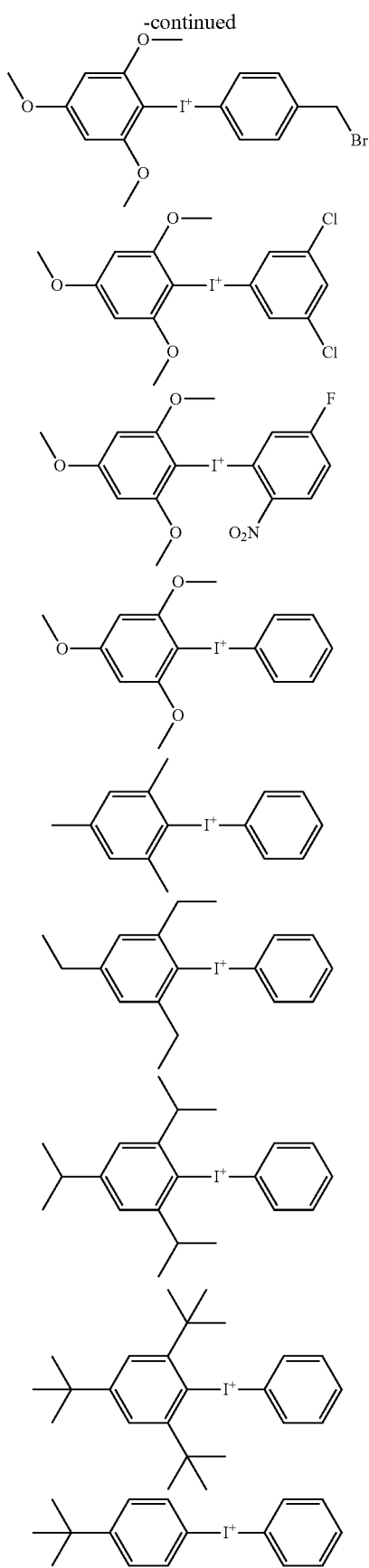

The repeat units (B6) to (B13) are capable of generating an acid upon receipt of high-energy radiation. With the relevant units bound into a polymer, an appropriate control of acid diffusion becomes possible, and a pattern with reduced LER or LWR can be formed. Since the acid-generating unit is bound to a polymer, the phenomenon that acid volatilizes from the exposed region and re-deposits on the unexposed region during bake in vacuum is suppressed. This is effective for reducing LER or LWR and for suppressing unwanted negative-working reaction in the unexposed region for thereby reducing defects.

Each of the repeat units (B6) to (B13) may be of one type or a combination of plural types.

In the polymer, (meth)acrylate and other repeat units having an adhesive group such as lactone structure or hydroxy group other than phenolic hydroxy may be incorporated for fine adjustment of properties of a resist film.

Examples of the (meth)acrylate unit having an adhesive group include repeat units having the following formulae (B14) to (B16), which are also referred to as repeat units (B14) to (B16). While these units do not exhibit acidity, they may be used as auxiliary units for providing adhesion to substrates or adjusting solubility.

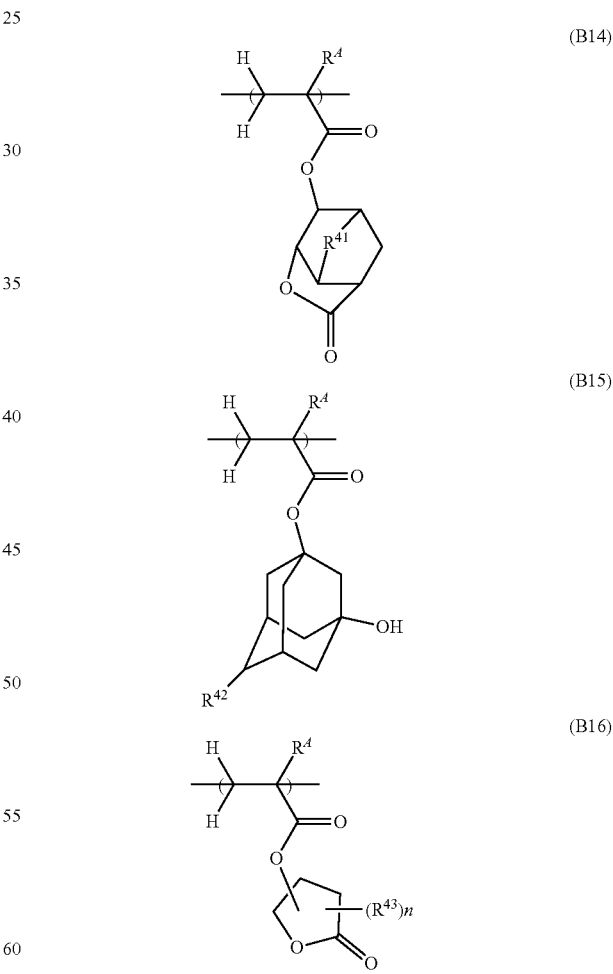

In formulae (B14) to (B16), $R^4$ is as defined above. $R^{41}$ is —O— or methylene. $R^{42}$ is hydrogen or hydroxy. $R^{43}$ is a $C_1$-$C_4$ saturated hydrocarbyl group, and n is an integer of 0 to 3. Each of the repeat units (B14) to (B16) may be of one type or a combination of plural types.

In polymer B, an appropriate content of repeat units (B1) is 40 to 95 mol %, more preferably 60 to 85 mol % for establishing a high contrast between a region which is exposed to high-energy radiation and turns negative and the unexposed region (which does not turn negative) for the purpose of achieving high resolution. An appropriate content of repeat units (B2) to (B4) is 0 to 30 mol %, more preferably 3 to 20 mol % for gaining the effect of improving etch resistance. The other repeat units may be incorporated in a range of 0 to 30 mol %, preferably 0 to 20 mol %.

Where the polymer B' is free of repeat units (B6) to (B13), the polymer B' preferably contains 25 to 95 mol %, more preferably 40 to 85 mol % of repeat units (B1). An appropriate content of repeat units (B2) to (B4) is 0 to 30 mol %, more preferably 3 to 20 mol %. An appropriate content of repeat units (B5) is 5 to 70 mol %, more preferably 10 to 60 mol %. The other repeat units may be incorporated in a range of 0 to 30 mol %, preferably 0 to 20 mol %.

Where the polymer B' contains repeat units (136) to (B13), the polymer B' preferably contains 25 to 94.5 mol %, more preferably 36 to 85 mol % of repeat units (B1). An appropriate content of repeat units (B2) to (B4) is 0 to 30 mol %, more preferably 3 to 20 mol %. An appropriate content of repeat units (B5) is 5 to 70 mol %, more preferably 10 to 60 mol %. The total content of repeat units (B1) to (B5) is preferably 60 to 99.5 mol %. An appropriate content of repeat units (B6) to (B13) is 0.5 to 20 mol %, more preferably 1 to 10 mol %. The other repeat units may be incorporated in a range of 0 to 30 mol %, preferably 0 to 20 mol %.

It is noted that the repeat units (B1) to (B5) preferably account for at least 60 mol %, more preferably at least 70 mol % of the overall repeat units of the polymer. This range ensures that the polymer has necessary properties as the chemically amplified negative resist composition.

Preferably, the polymer B' comprises repeat units having the formula (B1-1), repeat units having the formula (B5-1) or (B5-2), and repeat units having the formula (B7-1) or (B11-1).

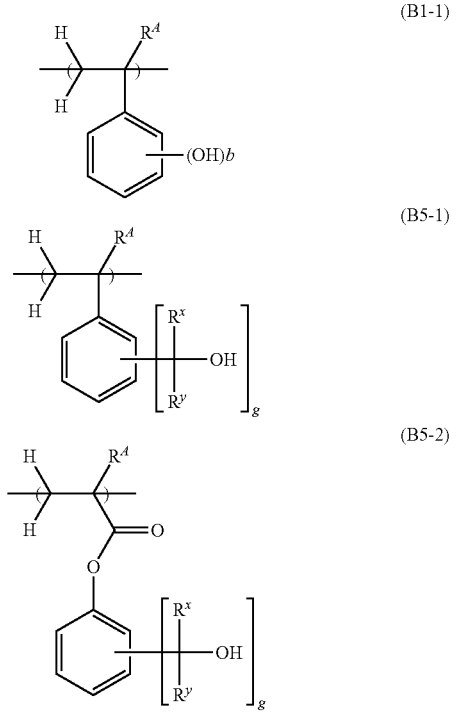

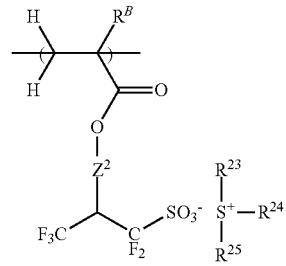

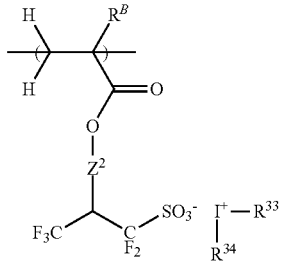

Herein $R^A$, $R^B$, $Z^2$, $R^{23}$, $R^{24}$, $R^{25}$, $R^{33}$, $R^{34}$, Rx, Ry, b, and g are as defined above.

Where the polymer B' is used as the base polymer (B), it may be a mixture of a polymer free of repeat units (B6) to (B13) and a polymer comprising repeat units (B6) to (B13). In this embodiment, the polymer free of repeat units (B6) to (B13) is preferably used in an amount of 2 to 5,000 parts, more preferably 10 to 1,000 parts by weight per 100 parts by weight of the polymer comprising repeat units (B6) to (B13).

Reference is now made to the use of the chemically amplified negative resist composition in the fabrication of photomasks. The lithography of the advanced generation employs a coating film having a thickness of up to 150 nm, preferably up to 100 nm. Since an intense development process is often employed to minimize defects resulting from resist residues, the base polymer should preferably have a dissolution rate in alkaline developer (typically 2.38 wt % tetramethylammonium hydroxide (TMAH) aqueous solution) of up to 80 nm/sec, more preferably up to 50 nm/sec in order to form a small size pattern. When the chemically amplified negative resist composition is used in the EUV lithography process for fabricating an LSI chip from a wafer, for example, the coating film often has a thickness of up to 100 nm, in view of the necessity of patterning narrow lines of 50 nm or less. In consideration of the risk that the pattern of such thin film can be degraded by development, the polymer preferably has a dissolution rate of up to 80 nm/sec, more preferably up to 50 nm/sec. On the other hand, a thick film having a thickness of 200 nm or greater is often employed in the KrF lithography process although the film thickness depends on a particular purpose. In this case, the polymer is preferably designed to a dissolution rate of at least 90 nm/sec.

The polymer may be synthesized by combining suitable monomers optionally protected with a protective group, copolymerizing them in the standard way, and effecting deprotection reaction if necessary. The copolymerization reaction is preferably radical polymerization or anionic polymerization though not limited thereto. For the polymerization reaction, reference may be made to WO 2006/121096, JP-A 2004-115630, JP-A 2008-102383, and JP-A 2008-304590.

The polymer should preferably have a Mw of 1,000 to 50,000, and more preferably 2,000 to 20,000. A Mw of at least 1,000 eliminates the risk that pattern features are rounded at their top, inviting degradations of resolution and LER or LWR. A Mw of up to 50,000 eliminates the risk that LER or LWR is increased when a pattern with a line width of up to 100 nm is formed. As used herein, Mw is measured by GPC versus polystyrene standards.

The polymer preferably has a narrow molecular weight distribution or dispersity (Mw/Mn) of 1.0 to 2.0, more preferably 1.0 to 1.8. A polymer with such a narrow dispersity eliminates the risk that foreign particles are left on the pattern after development and the pattern profile is aggravated.

(C) Acid Generator

The chemically amplified negative resist composition may further comprise (C) an acid generator, also referred to as acid generator of addition type. The acid generator is typically a compound (PAG) capable of generating an acid in response to actinic ray or radiation. The PAG used herein may be any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators, which may be used alone or in admixture of two or more.

Suitable PAGs include nonafluorobutane sulfonate, partially fluorinated sulfonates described in JP-A 2012-189977, paragraphs [0247]-[0251], partially fluorinated sulfonates described in JP-A 2013-101271, paragraphs [0261]-[0265], and those described in JP-A 2008-111103, paragraphs [0122]-[0142] and JP-A 2010-215608, paragraphs [0080]-[0081]. Among others, arylsulfonate and alkanesulfonate type PAGs are preferred because they generate acids having an appropriate strength to promote reaction of the crosslinker (D) with the base polymer (B).

The PAG capable of generating an acid having a pKa value in the range of −3.0 to 1.5, more preferably −1.0 to 1.5 is preferred because the effect of improving LER or LWR by combining the generated acid with the compound as component (A) is achievable. The preferred acid generators are compounds having a sulfonium anion of the structure shown below. Notably the cation that pair with the anion is as exemplified for the sulfonium cation in formulae (B7) to (B9).

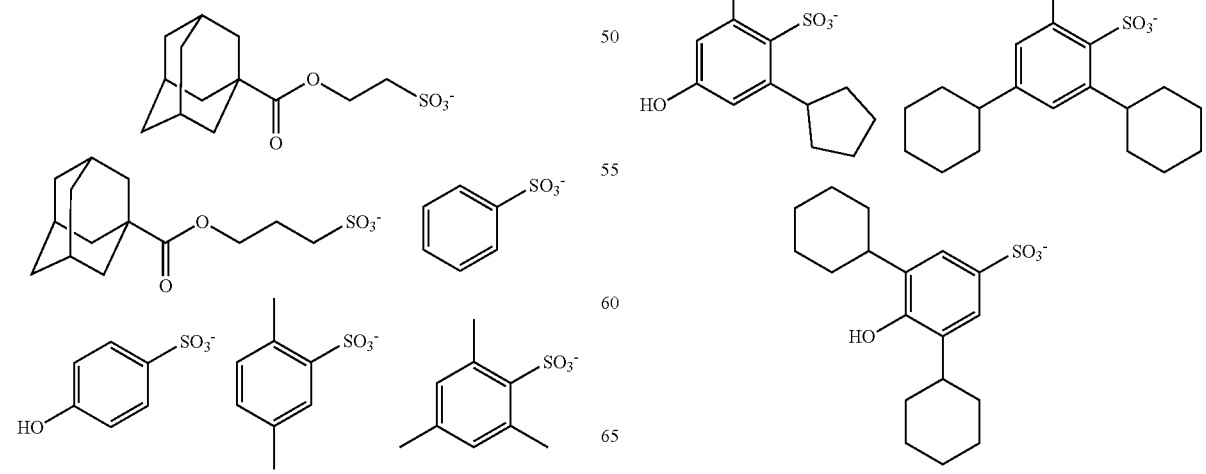

53
-continued
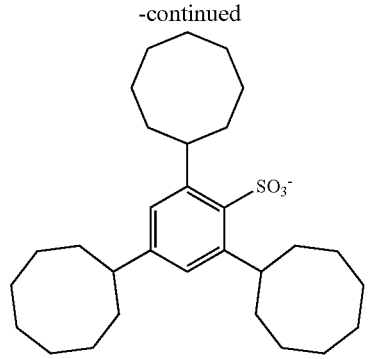
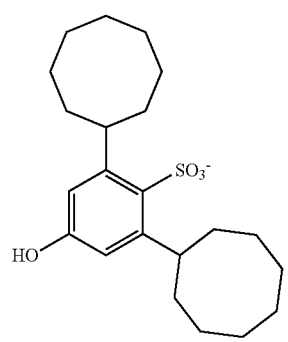
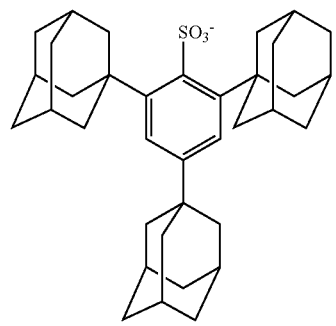
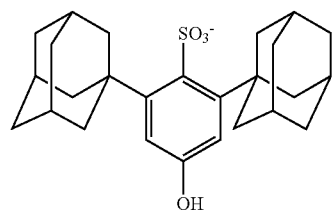
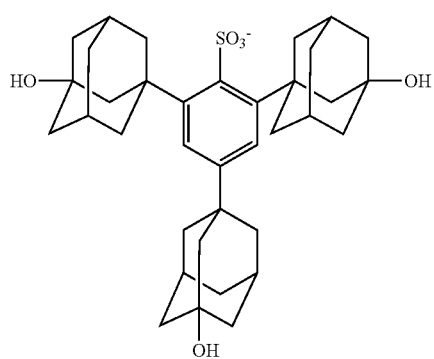
54
-continued
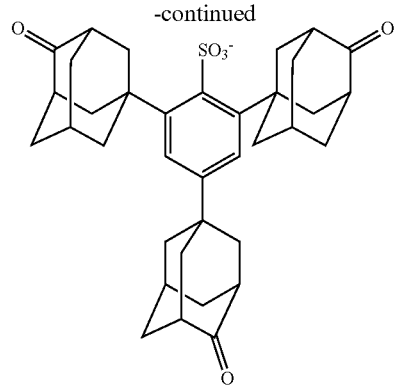
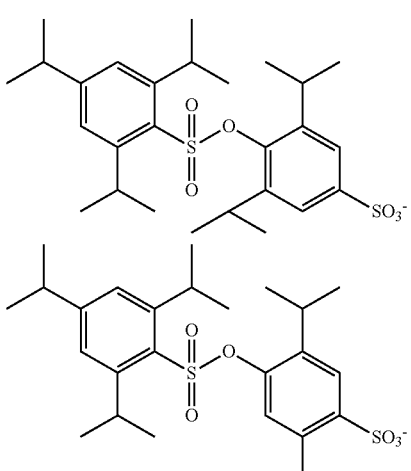
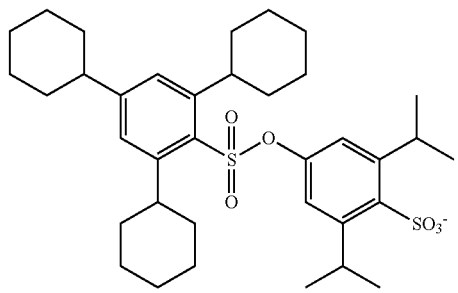
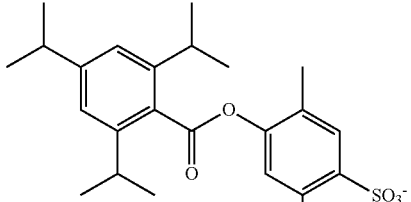
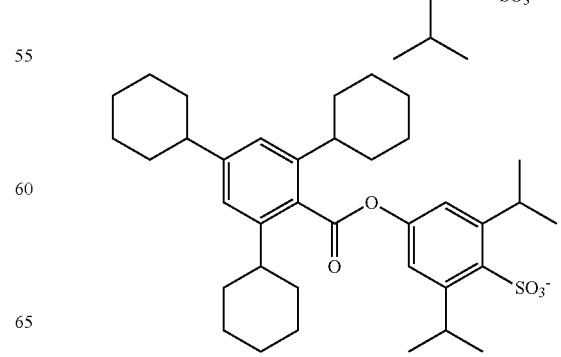

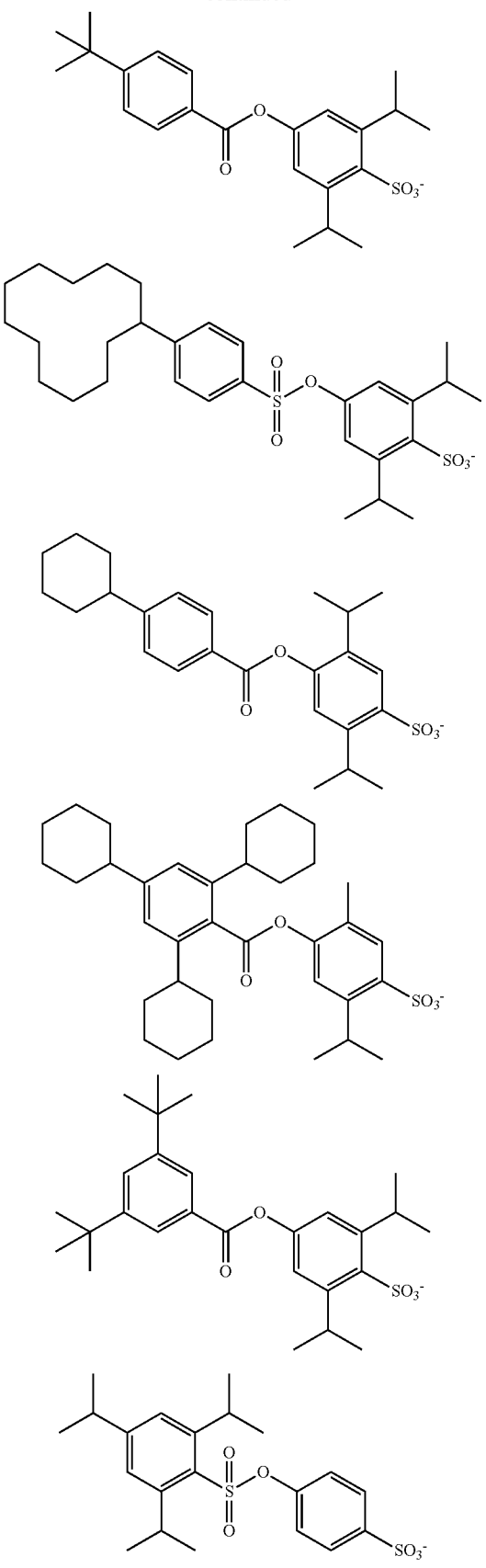

57
-continued
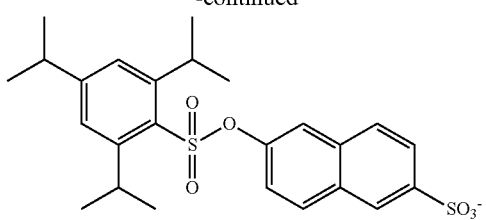
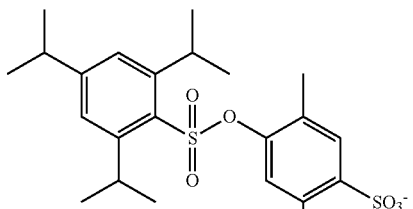
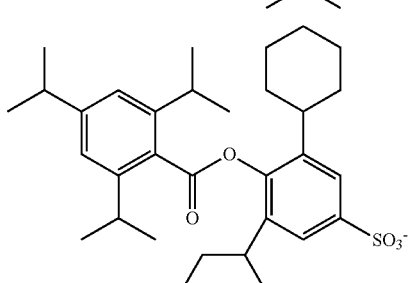
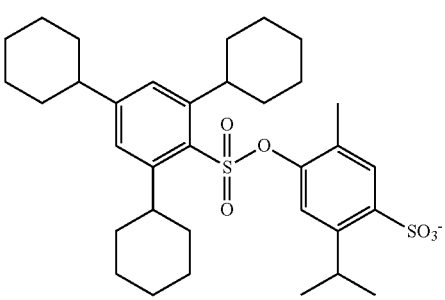
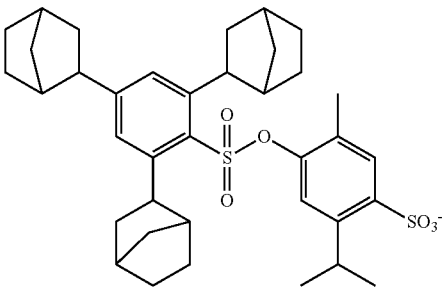
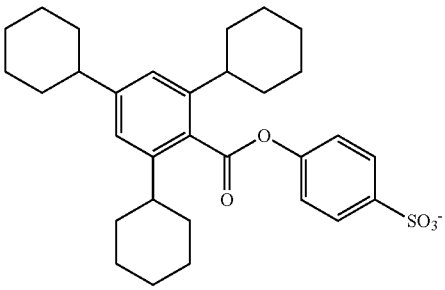
58
-continued
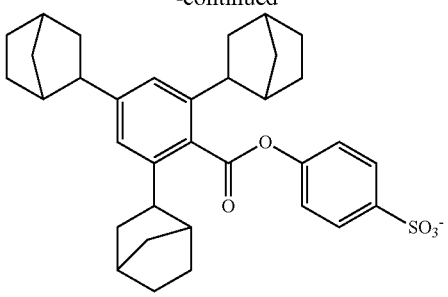
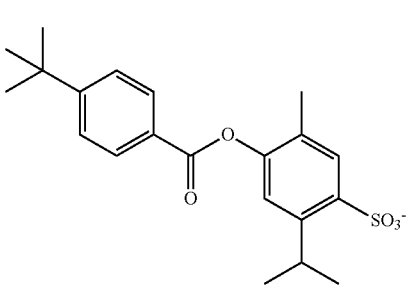
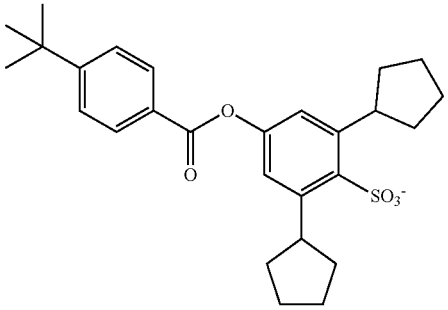
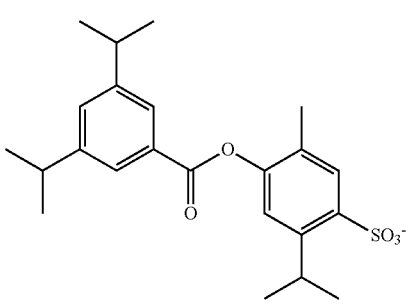
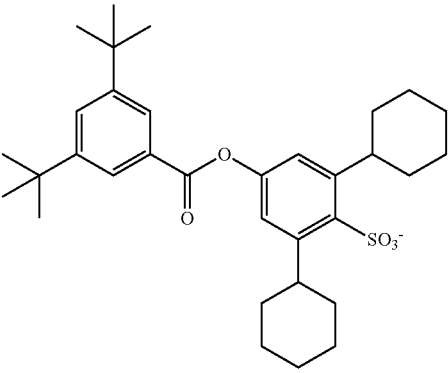

59
-continued
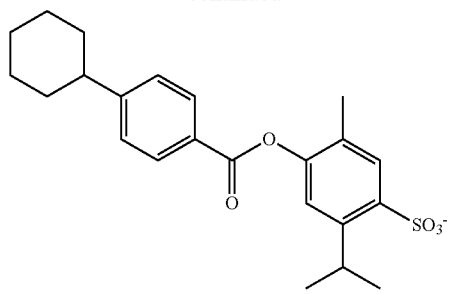
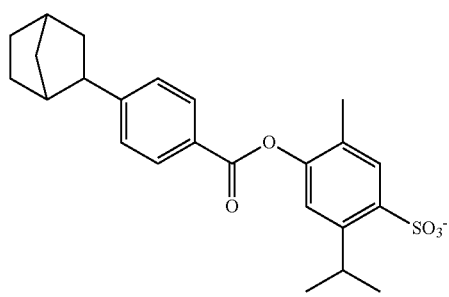
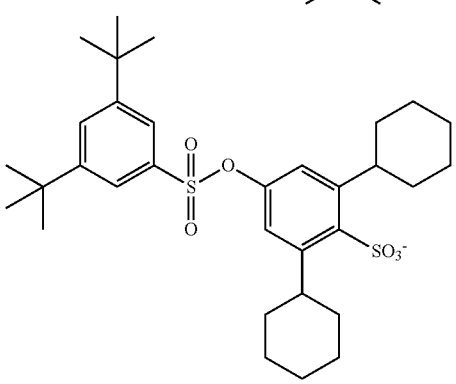
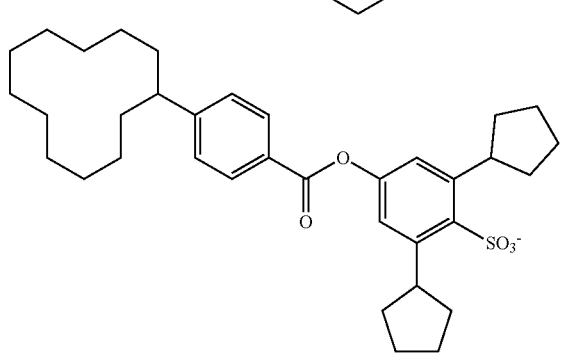
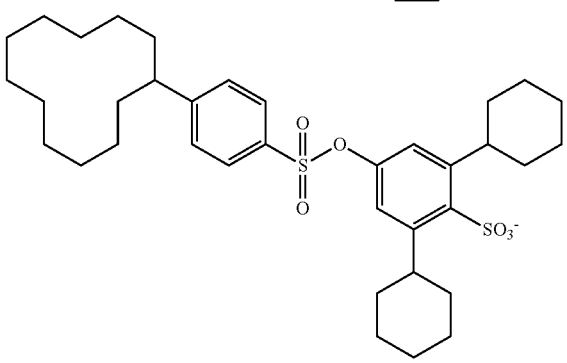
60
-continued
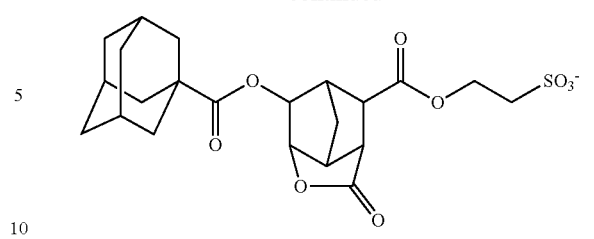
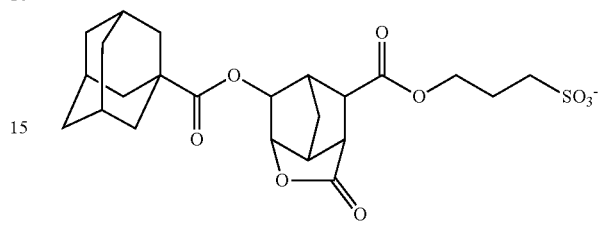
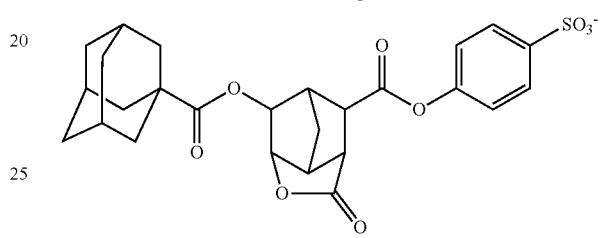
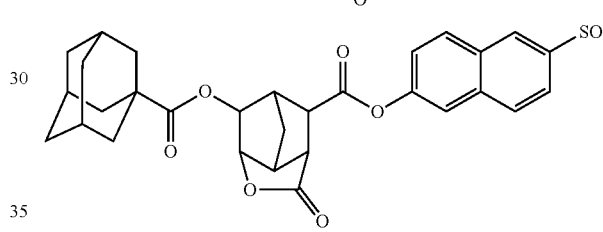
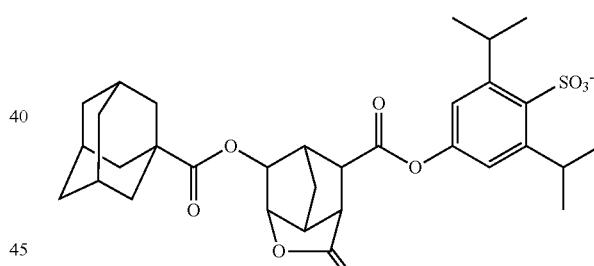
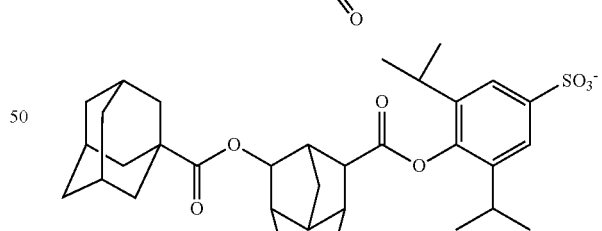
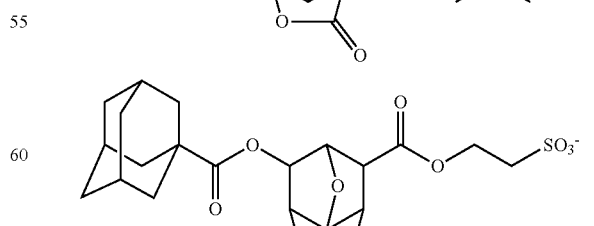
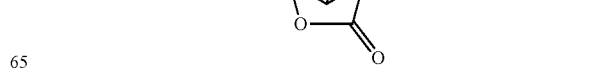

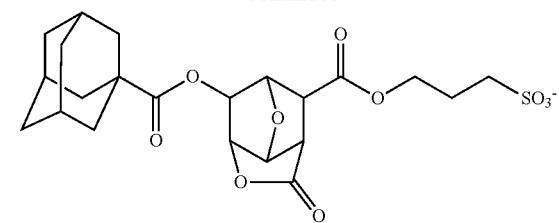
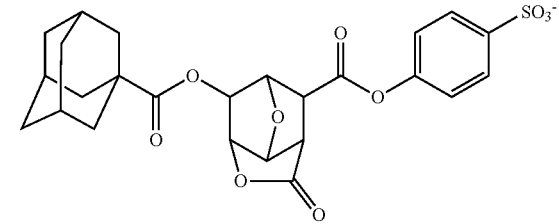
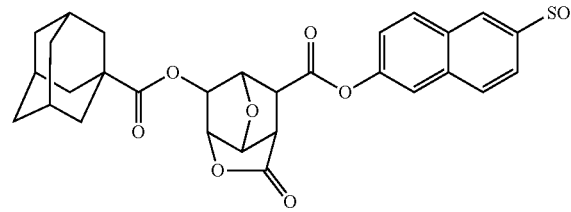
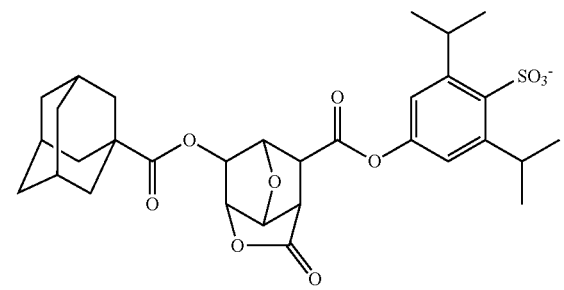
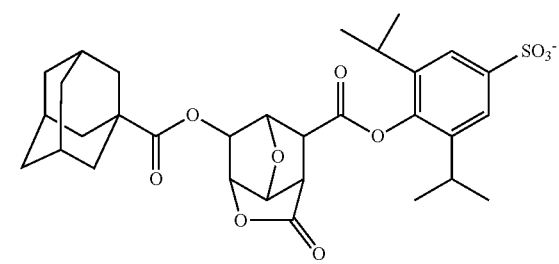
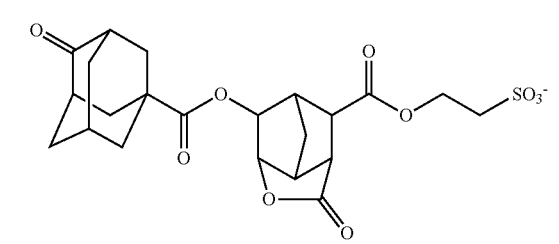
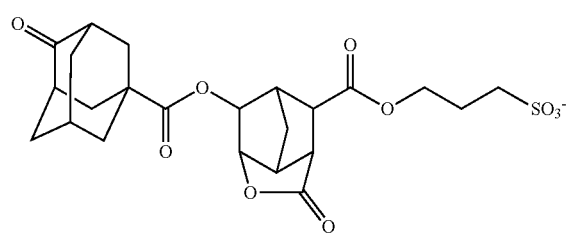
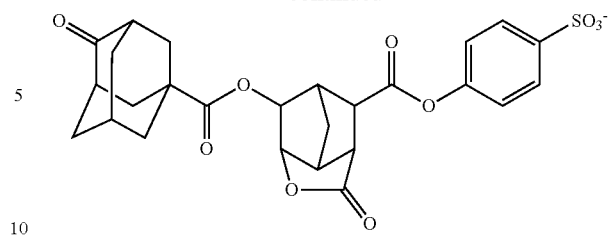
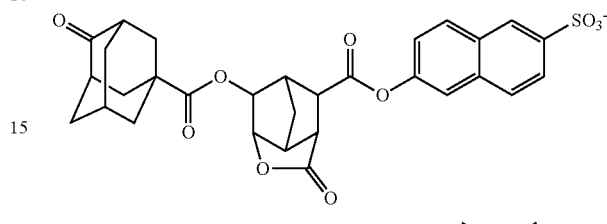
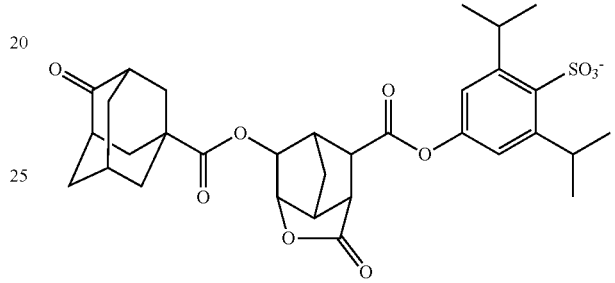
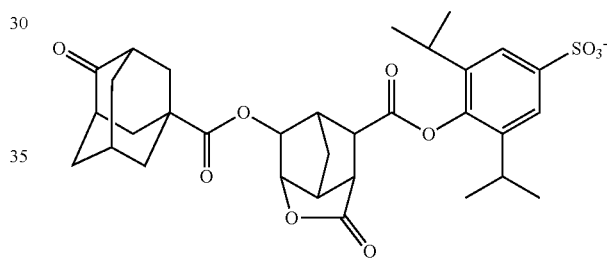
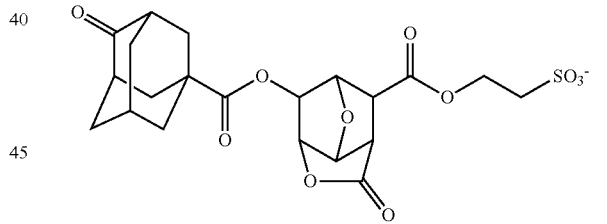
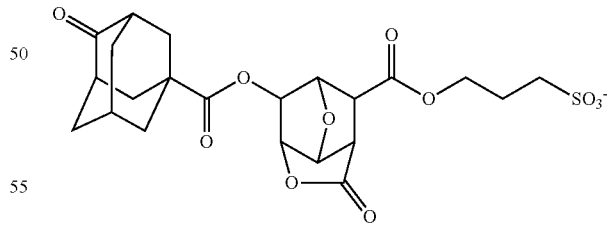
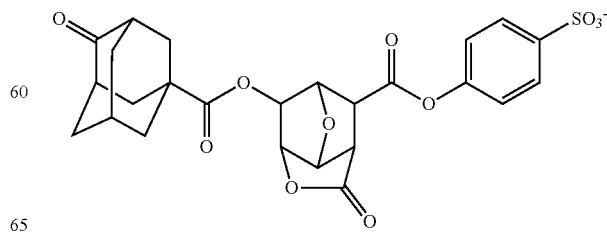

-continued

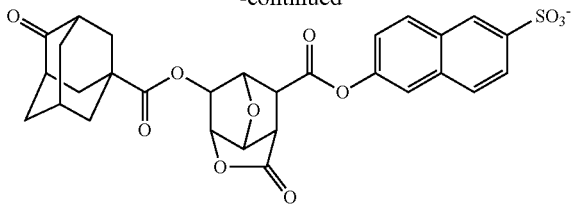
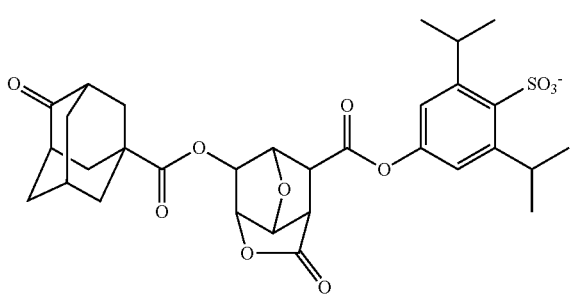
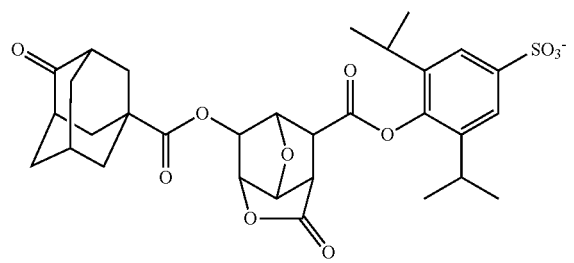
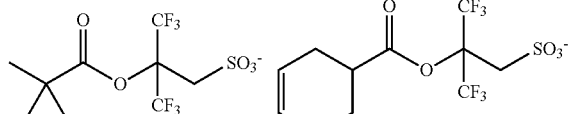
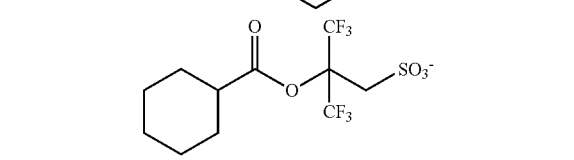
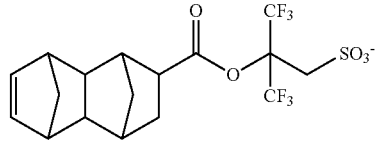
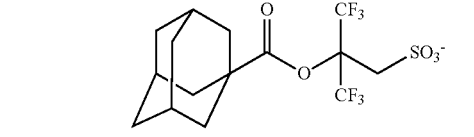
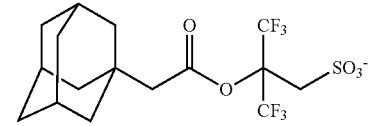

-continued

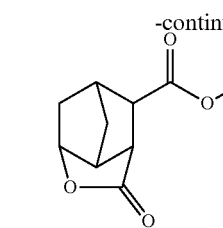
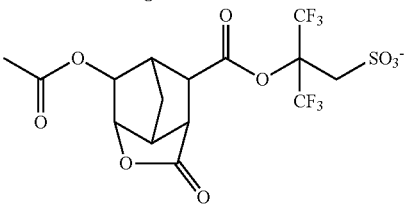
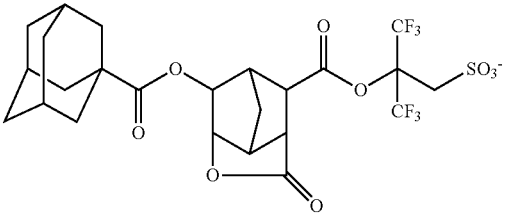
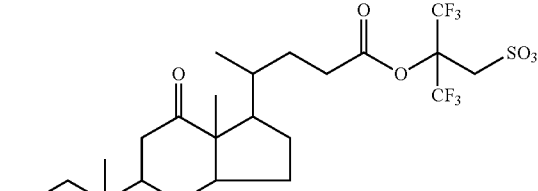

An appropriate amount of the acid generator of addition type used is 2 to 20 parts, more preferably 5 to 15 parts by weight per 80 parts by weight of the base polymer. Where the base polymer contains repeat units (B6) to (B13) (that is, in the case of polymer-bound acid generator), the acid generator of addition type may be omitted. The acid generator may be used alone or in admixture.

(D) Crosslinker

When the base polymer (B) does not contain polymer B', the negative resist composition preferably comprises a crosslinker. When the base polymer (B) contains polymer B', a crosslinker need not be added.

Suitable crosslinkers which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyloxy group. These compounds may be used as an additive or introduced into a polymer side chain as a pendant. Hydroxy-containing compounds may also be used as the crosslinker.

Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether.

Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof.

Examples of the guanamine compound include tetramethylol guanamine, tetramethoxymethyl guanamine, tetraethylol guanamine compounds having 1 to 4 methylol groups methoxymethylated and mixtures thereof, tetramethoxyethyl guanamine, tetraacyloxygunamine, tetramethylol guanamine compounds having 1 to 4 methylol groups acyloxymethylated and mixtures thereof.

Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof.

Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate.

Suitable azide compounds include 1,1'-biphenyl-4,4'-bisazide, 4,4'-methylidenebisazide, and 4,4'-oxybisazide.

Examples of the alkenyloxy-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

An appropriate amount of the crosslinker (D) used is 0.5 to 50 parts, and more preferably 1 to 30 parts by weight per 80 parts by weight of the base polymer (B). As long as the amount of the crosslinker is in the range, the risk of resolution being reduced by forming bridges between pattern features is mitigated. The crosslinkers may be used alone or in admixture.

(E) Fluorinated Polymer

The negative resist composition may further comprise (E) a fluorinated polymer comprising repeat units having the formula (E1) and repeat units of at least one type selected from (repeat units having the (formulae (E2), (E3), (E4) and (E5), for the purposes of enhancing contrast, preventing chemical flare of acid upon exposure to high-energy radiation, preventing mixing of acid from an anti-charging film in the step of coating an anti-charging film-forming material on a resist film, and suppressing unexpected unnecessary pattern degradation. Notably, repeat units having formulae (E1), (E2), (E3), (E4), and (E5) are simply referred to as repeat units (E1), (E2), (E3), (E4), and (E5), respectively. Since the fluorinated polymer also has a surface active function, it can prevent insoluble residues from re-depositing onto the substrate during the development step and is thus effective for preventing development defects.

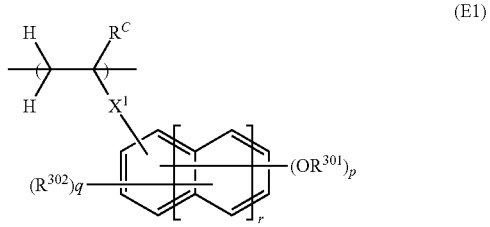
(E1)

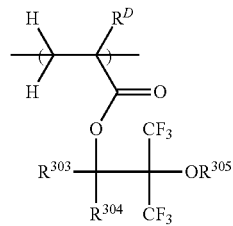
(E2)

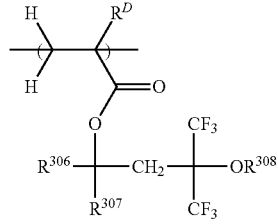
(E3)

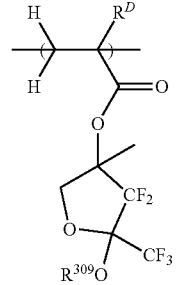
(E4)

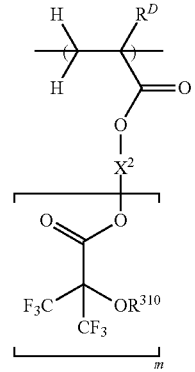
(E5)

In formulae (E1) to (E5), $R^C$ is each independently hydrogen or methyl. $R^D$ is each independently hydrogen, fluorine, methyl or trifluoromethyl. $R^{301}$ is hydrogen or a $C_1$-$C_5$ straight or branched hydrocarbyl group in which a heteroatom-containing moiety may intervene in a carbon-carbon bond. $R^{302}$ is a $C_1$-$C_5$ straight or branched hydrocarbyl group in which a heteroatom-containing moiety may intervene in a carbon-carbon bond. $R^{303}$, $R^{304}$, $R^{306}$ and $R^{307}$ are each independently hydrogen or a $C_1$-$C_{10}$ saturated hydrocarbyl group. $R^{305}$, $R^{308}$, $R^{309}$ and $R^{310}$ are each independently hydrogen, a $C_1$-$C_{15}$ hydrocarbyl group or fluorinated hydrocarbyl group, or an acid labile group, with the proviso that an ether bond or carbonyl moiety may intervene in a carbon-carbon bond in the hydrocarbyl groups or fluorinated hydrocarbyl groups represented by $R^{305}$, $R^{308}$, $R^{309}$ and $R^{310}$. $X^1$ is a single bond, —C(=O)—O— or —C(=O)—NH—. $X^2$ is a $C_1$-$C_2$ (m+1)-valent hydrocarbon group or fluorinated hydrocarbon group. The subscript p is an integer of 1 to 3, q is an integer satisfying: $0 \le q \le 5+2r-p$, r is 0 or 1, and m is an integer of 1 to 3.

Examples of the $C_1$-$C_5$ hydrocarbyl groups $R^{301}$ and $R^{302}$ include alkyl, alkenyl and alkynyl groups, with the alkyl groups being preferred. Suitable alkyl groups include methyl, ethyl, n-propyl, isopropyl, n-butyl, isobutyl, sec-butyl, and n-pentyl. In these groups, a moiety containing a heteroatom such as oxygen, sulfur or nitrogen may intervene in a carbon-carbon bond.

In formula (E1), —$OR^{301}$ is preferably a hydrophilic group. In this case, $R^{301}$ is preferably hydrogen or a $C_1$-$C_5$ alkyl group in which oxygen intervenes in a carbon-carbon bond.

Examples of the repeat unit (E1) are given below, but not limited thereto. Herein $R^C$ is as defined above.

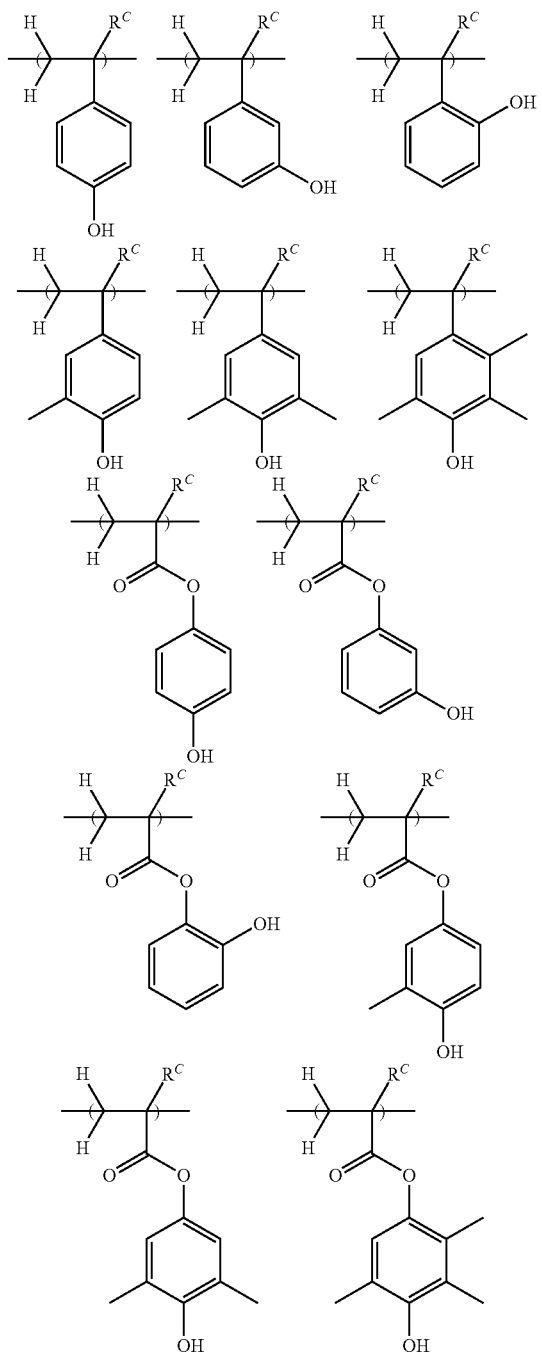

-continued

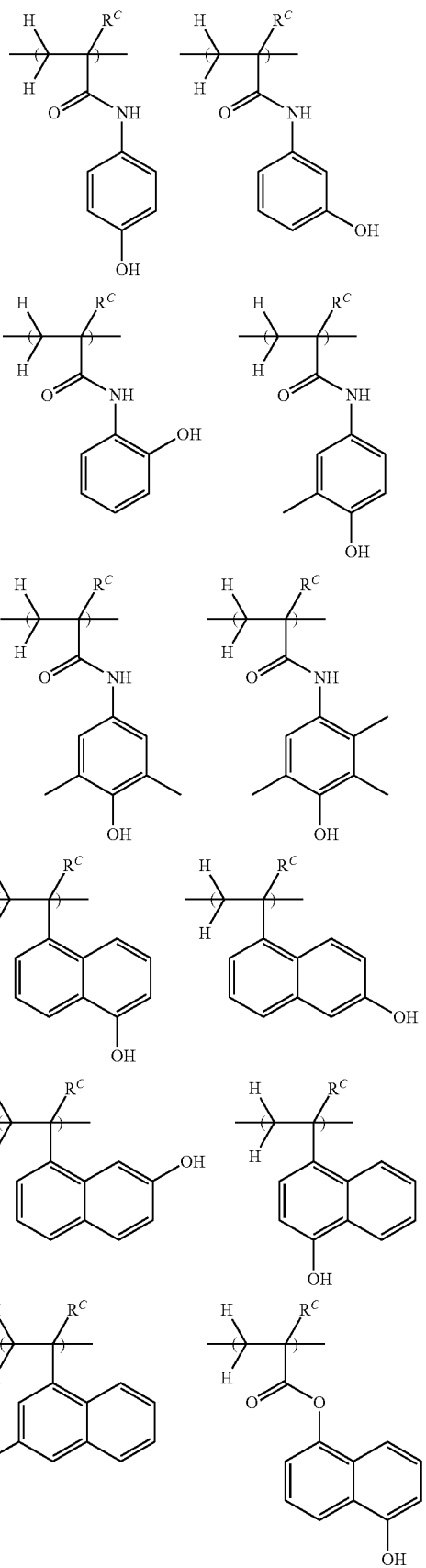

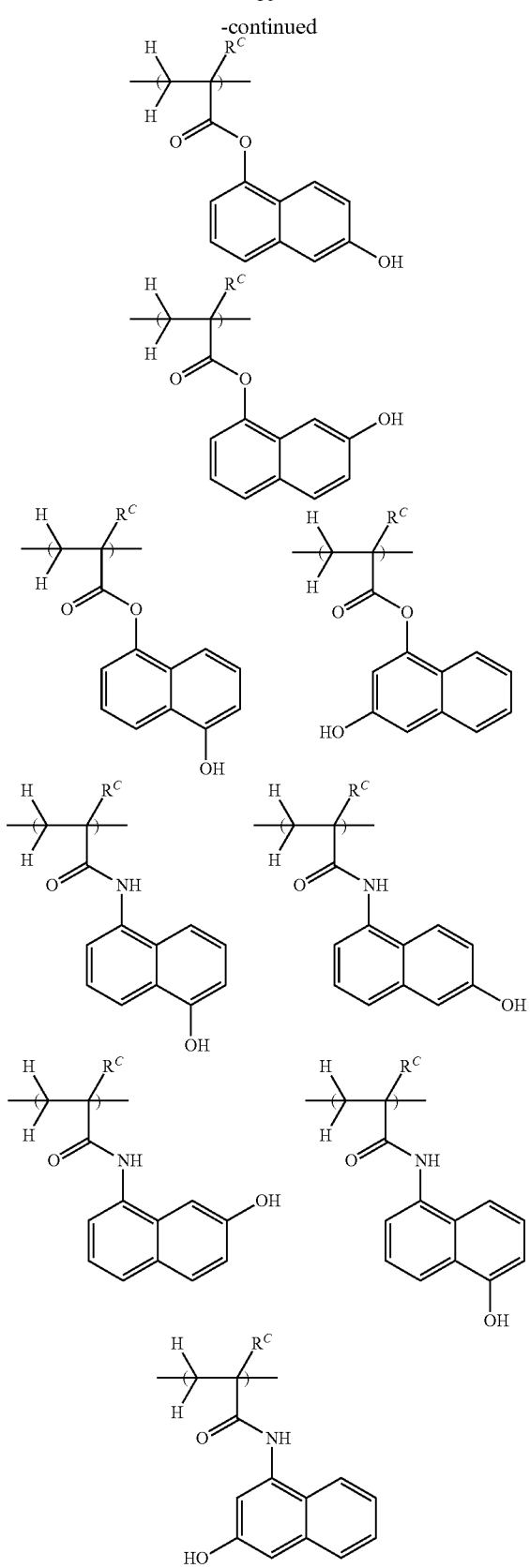

anti-charging film. Also preferably $R^C$ is methyl. A polymer wherein $R^C$ is methyl is a rigid polymer having a high glass transition temperature (Tg) which is effective for suppressing acid diffusion. As a result, the stability with time of a resist film is improved, and neither resolution nor pattern profile is degraded.

In formulae (E2) and (E3), examples of the $C_1$-$C_{10}$ saturated hydrocarbyl group represented by $R^{303}$, $R^{304}$, $R^{306}$ and $R^{307}$ include alkyl groups such as methyl, ethyl, n-propyl, isopropyl, n-butyl, isobutyl, sec-butyl, tert-butyl, n-pentyl, n-hexyl, n-heptyl, n-octyl, n-nonyl, and n-decyl, and cyclic saturated hydrocarbyl groups such as cyclopropyl, cyclobutyl, cyclopentyl, cyclohexyl, adamantyl, and norbornyl. Inter alia, $C_1$-$C_6$ saturated hydrocarbyl groups are preferred.

In formulae (E2) to (E5), examples of the $C_1$-$C_{15}$ hydrocarbyl group represented by $R^{305}$, $R^{308}$, $R^{309}$ and $R^{310}$ include alkyl, alkenyl and alkynyl groups, with the alkyl groups being preferred. Suitable alkyl groups include n-undecyl, n-dodecyl, tridecyl, tetradecyl and pentadecyl as well as those exemplified above. The fluorinated hydrocarbyl groups correspond to the foregoing hydrocarbyl groups in which some or all carbon-bonded hydrogen atoms are substituted by fluorine atoms.

Examples of the $C_1$-$C_{20}$ (m+1)-valent hydrocarbon group or fluorinated hydrocarbon group $X^2$ include the foregoing hydrocarbyl groups and fluorinated hydrocarbyl groups, with m number of hydrogen atoms being eliminated.

Examples of the repeat units (E2) to (E5) are given below, but not limited thereto. Herein $R^D$ is as defined above.

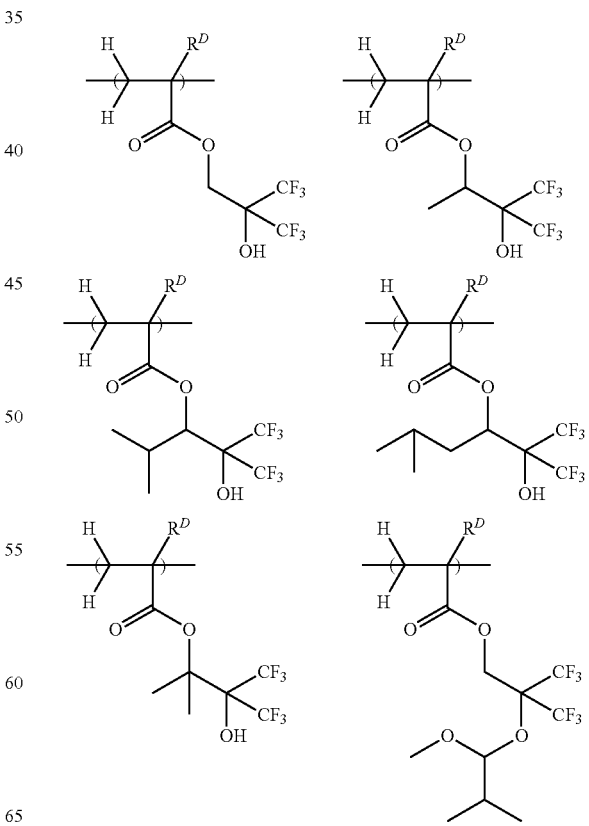

In formula (E1), $X^1$ is preferably —C(═O)—O— or —C(═O)—NH—. The inclusion of carbonyl in $X^1$ enhances the ability to trap the acid originating from the

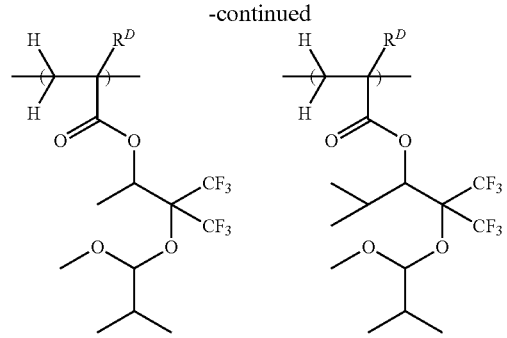
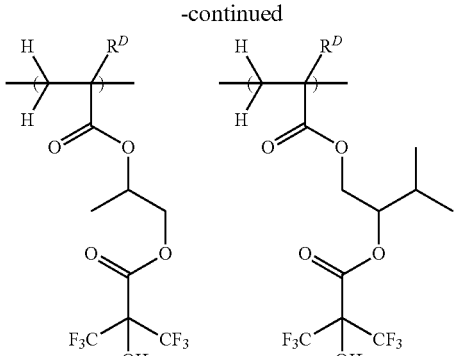
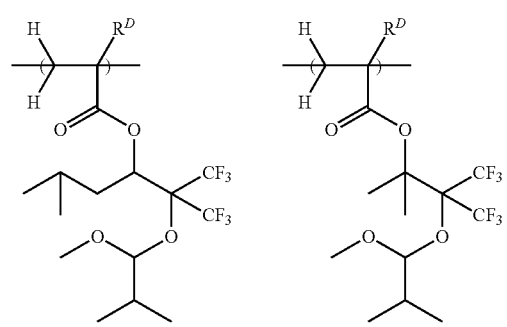
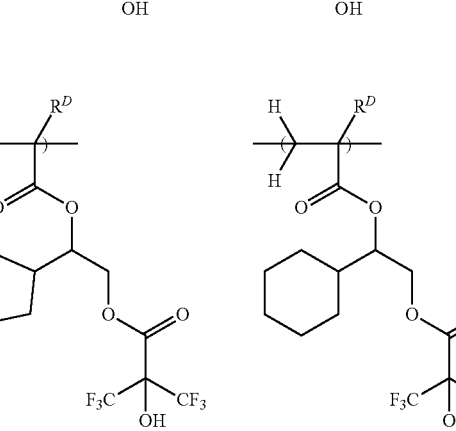
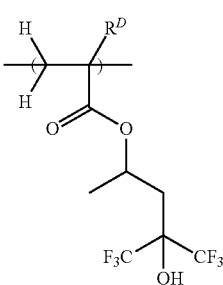
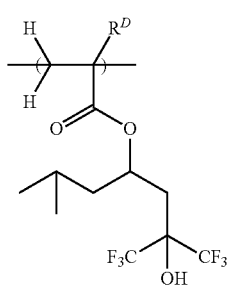
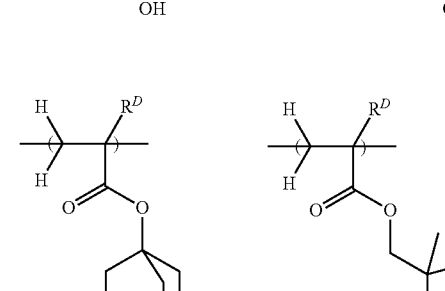
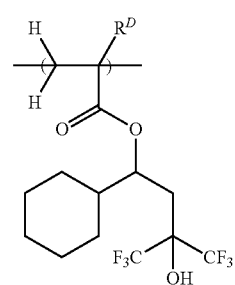
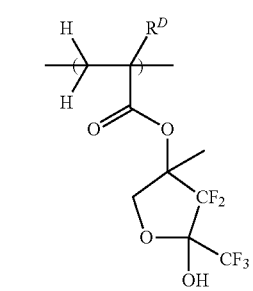
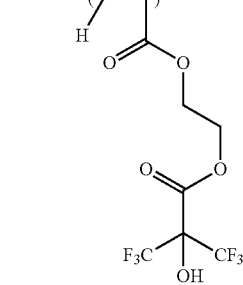
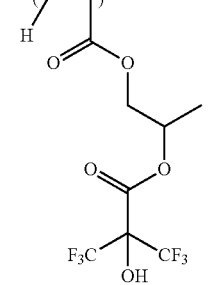

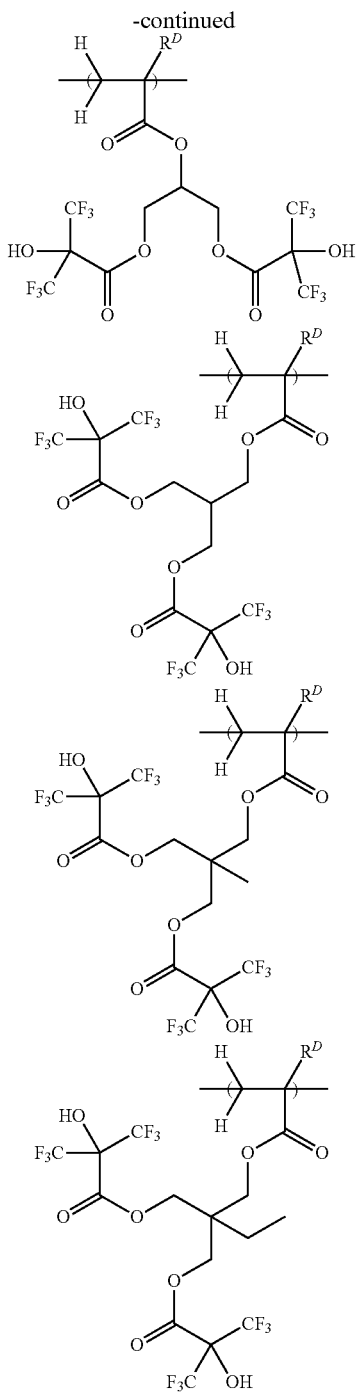

tional repeat units, their content is preferably up to 50 mol % based on the overall repeat units.

The fluorinated polymer (E) may be synthesized by combining suitable monomers optionally protected with a protective group, copolymerizing them in the standard way, and effecting deprotection reaction if necessary. The copolymerization reaction is preferably radical polymerization or anionic polymerization though not limited thereto. For the polymerization reaction, reference may be made to JP-A 2004-115630.

The fluorinated polymer (E) should preferably have a Mw of 2,000 to 50,000, and more preferably 3,000 to 20,000. A fluorinated polymer with a Mw of less than 2,000 helps acid diffusion, degrading resolution and detracting from age stability. A polymer with too high Mw has a reduced solubility in solvent, with a risk of leaving coating defects. The fluorinated polymer preferably has a dispersity (Mw/Mn) of 1.0 to 2.2, more preferably 1.0 to 1.7.

In the negative resist composition, the fluorinated polymer (E) is preferably used in an amount of 0.01 to 30 parts, more preferably 0.1 to 20 parts by weight per 80 parts by weight of the base polymer (B). The fluorinated polymer (E) may be used alone or in admixture.

(F) Organic Solvent

The negative resist composition may further comprise (F) an organic solvent. The organic solvent used herein is not particularly limited as long as the components are soluble therein. Examples of the organic solvent are described in JP-A 2008-111103, paragraphs [0144] to [0145] (U.S. Pat. No. 7,537,880). Specifically, exemplary solvents include ketones such as cyclohexanone, cyclopentanone, methyl-2-n-pentyl ketone and 2-heptanone; alcohols such as 3-methoxybutanol, 3-methyl-3-methoxybutanol, 1-methoxy-2-propanol, 1-ethoxy-2-propanol, and diacetone alcohol; ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate (EL), ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone (GBL), and mixtures thereof. Of the above organic solvents, it is recommended to use 1-ethoxy-2-propanol, PGMEA, PGME, cyclohexanone, EL, GBL, and mixtures thereof.

In the negative resist composition, the organic solvent (F) is preferably used in an amount of 200 to 10,000 parts, more preferably 400 to 6,000 parts by weight per 80 parts by weight of the base polymer (B). The organic solvent (F) may be used alone or in admixture.

(G) Basic Compound

In the negative resist composition, (G) a basic compound may be added as the acid diffusion inhibitor other than component (A) for the purpose of correcting a pattern profile or the like. The basic compound is effective for controlling acid diffusion. Even when the resist film is applied to a substrate having an outermost surface layer made of a chromium-containing material, the basic compound is effective for minimizing the influence of the acid generated in the resist film on the chromium-containing material.

Numerous basic compounds are known useful including primary, secondary, and tertiary aliphatic amines, mixed amines, aromatic amines, heterocyclic amines, nitrogen-containing compounds with carboxy group, nitrogen-con- The repeat unit (E1) is preferably incorporated in an amount of 5 to 85 mol %, more preferably 15 to 80 mol % based on the overall repeat units of the fluorinated polymer (E). The repeat units (E2) to (E5) are preferably incorporated in an amount of 15 to 95 mol %, more preferably 20 to 85 mol % based on the overall repeat units of the fluorinated polymer (E). Each of repeat units (E2) to (E5) may be used alone or in admixture.

The fluorinated polymer (E) may comprise additional repeat units as well as the repeat units (E1) to (E5). Suitable additional repeat units include those described in U.S. Pat. No. 9,091,918 (JP-A 2014-177407, paragraphs [0046]-[0078]). When the fluorinated polymer (E) comprises additaining compounds with sulfonyl group, nitrogen-containing compounds with hydroxy group, nitrogen-containing compounds with hydroxyphenyl group, alcoholic nitrogen-containing compounds, amide derivatives, imide derivatives, carbamate derivatives, and ammonium salts. Examples are described in Patent Document 9, for example, and any such compounds are useful. Of the foregoing basic compounds, preferred are tris[2-(methoxymethoxy)ethyl]amine, tris[2-(methoxymethoxy)ethyl]amine-N-oxide, di butylaminobenzoic acid, morpholine derivatives and imidazole derivatives.

In the negative resist composition, the basic compound is preferably added in an amount of 0 to 20 parts, and more preferably 0 to 10 parts by weight per 80 parts by weight of the base polymer (B). The basic compounds may be used alone or in admixture.

(H) Surfactant

In the negative resist composition, any of surfactants commonly used for improving coating characteristics to the substrate may be added as an optional component. Numerous surfactants are known in the art, for example, PF-636 (Omnova Solutions, Inc.). FC-4430 (3M), and those described in JP-A 2004-115630. A choice may be made with reference to such patent documents. An appropriate amount of the surfactant (H) used is 0 to 5 parts by weight per 80 parts by weight of the base polymer (B). The surfactants may be used alone or in admixture.

Process

Another embodiment of the invention is a resist pattern forming process comprising the steps of applying the resist composition defined above onto a substrate to form a resist film thereon, exposing the resist film patternwise to high-energy radiation, and developing the resist film in an alkaline developer to form a resist pattern.

Pattern formation using the negative resist composition of the invention may be performed by well-known lithography processes. In general, the resist composition is first applied onto a substrate for IC fabrication (e.g., Si, SiO, $SiO_2$, SiN, SiON, TiN, WSi, BPSG, SOG, organic antireflective coating, etc.) or a substrate for mask circuit fabrication (e.g., Cr, CrO, CrON, $MoSi_2$, Si, SiO, $SiO_2$, etc.) by a suitable coating technique such as spin coating. The coating is prebaked on a hotplate preferably at a temperature of 60 to 150° C. for 1 to 20 minutes, more preferably at 80 to 140° C. for 1 to 10 minutes to form a resist film of 0.03 to 2 μm thick.

Then the resist film is exposed patternwise to high-energy radiation such as UV, deep-UV, excimer laser (KrF, ArF), EUV, x-ray, γ-ray or synchrotron radiation or EB. The resist composition of the invention is especially effective in the KrF excimer laser, EUV or EB lithography.

On use of UV, deep-UV, EUV, excimer laser, x-ray, γ-ray or synchrotron radiation as the high-energy radiation, the resist film is exposed through a mask having a desired pattern, preferably in a dose of 1 to 500 n/cm², more preferably 10 to 400 mJ/cm². On use of EB, a pattern may be written directly in a dose of preferably 1 to 500 μC/cm², more preferably 10 to 400 μC/cm².

The exposure may be performed by conventional lithography whereas the immersion lithography of holding a liquid between the mask and the resist film may be employed if desired. In the case of immersion lithography, a protective film which is insoluble in water may be used.

The resist film is then baked (PEB) on a hotplate preferably at 60 to 150° C. for 1 to 20 minutes, more preferably at 80 to 140° C. for 1 to 10 minutes.

Thereafter, the resist film is developed with a developer in the form of an aqueous base solution, for example, 0.1 to 5 wt %, preferably 2 to 3 wt % aqueous solution of tetramethylammonium hydroxide (TMAH) preferably for 0.1 to 3 minutes, more preferably 0.5 to 2 minutes by conventional techniques such as dip, puddle and spray techniques. In this way, a desired resist pattern is formed on the substrate.

From the negative resist composition, a pattern with a high resolution and minimal LER or LWR can be formed. The resist composition is effectively applicable to a substrate, specifically a substrate having a surface layer of material to which a resist film is less adherent and which is likely to invite pattern stripping or pattern collapse, and particularly a substrate having sputter deposited on its outermost surface metallic chromium or a chromium compound containing at least one light element selected from oxygen, nitrogen and carbon or a substrate having an outermost surface layer of $SiO_x$. The invention is especially effective for pattern formation on a photomask blank as the substrate.

The resist pattern forming process is successful in forming a pattern having a high resolution and minimal LER or LWR through exposure and development even when a substrate having the outermost surface made of a material having a potential impact on a resist pattern profile, typically chromium or silicon-containing material, e.g., photomask blank is used because the negative resist composition is effective for controlling acid diffusion on the substrate interface.

EXAMPLES

Examples and Comparative Examples are given below by way of illustration and not by way of limitation. All parts are by weight (pbw). The monomer constitutional ratio in a copolymer is a molar ratio. THF stands for tetrahydrofuran. PGME for propylene glycol monomethyl ether, PGMEA for propylene glycol monomethyl ether acetate, EL for ethyl lactate, and GBL for γ-butyrolactone. Mw is measured by GPC versus polystyrene standards. Analytic instruments are as shown below.

IR: NICOLET 6700 by Thermo Fisher Scientific Inc.

$^1$H-NMR: ECA-500 by JEOL Ltd.

$^{19}$F-NMR: ECA-500 by JEOL Ltd.

LC-MS: Acquity UPLC H-Class system and Acquity QDa by Waters

[1] Synthesis of Acid Diffusion Inhibitor

Synthesis Example 1-1

Synthesis of Compound Q-1: 3,3,3',3'-tetrakis(trifluoromethyl)-1λ4-1,1'-spirobi[3H-2,1-benzoxathiol]

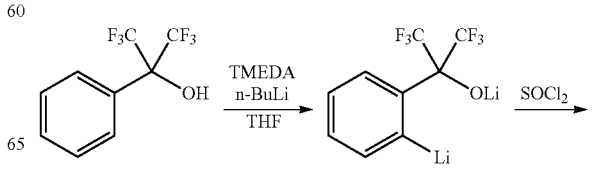

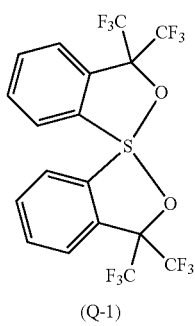

(Q-1)

Under ice cooling, 2.1 g of N,N,N,N-tetramethylethylenediamine (TMEDA) was added dropwise to 32 mL of hexane solution of n-butyllithium (n-BuLi), followed by 30 minutes of aging. Under ice cooling, a mixture of 9.8 g of 1,1,1,3,3,3-hexafluoro-2-phenyl-2-propanol and THF was added dropwise thereto, followed by 20 hours of stirring. Further 50 g of THF was added to the solution, yielding a dilithio compound. A reactor was charged with 21.2 g of thionyl chloride. Under ice cooling, the THF solution of the dilithio compound was added dropwise to the reactor where it was aged for 18 hours. Thereafter, a saturated ammonium chloride aqueous solution was added to the solution to quench the reaction. The organic layer was taken out, washed with water, and concentrated under reduced pressure. Hexane was added to the concentrate for recrystallization. The crystals were collected by filtration and dried in vacuum, obtaining 4.2 g of the target compound Q-1 (yield 41%).

Figure 2:
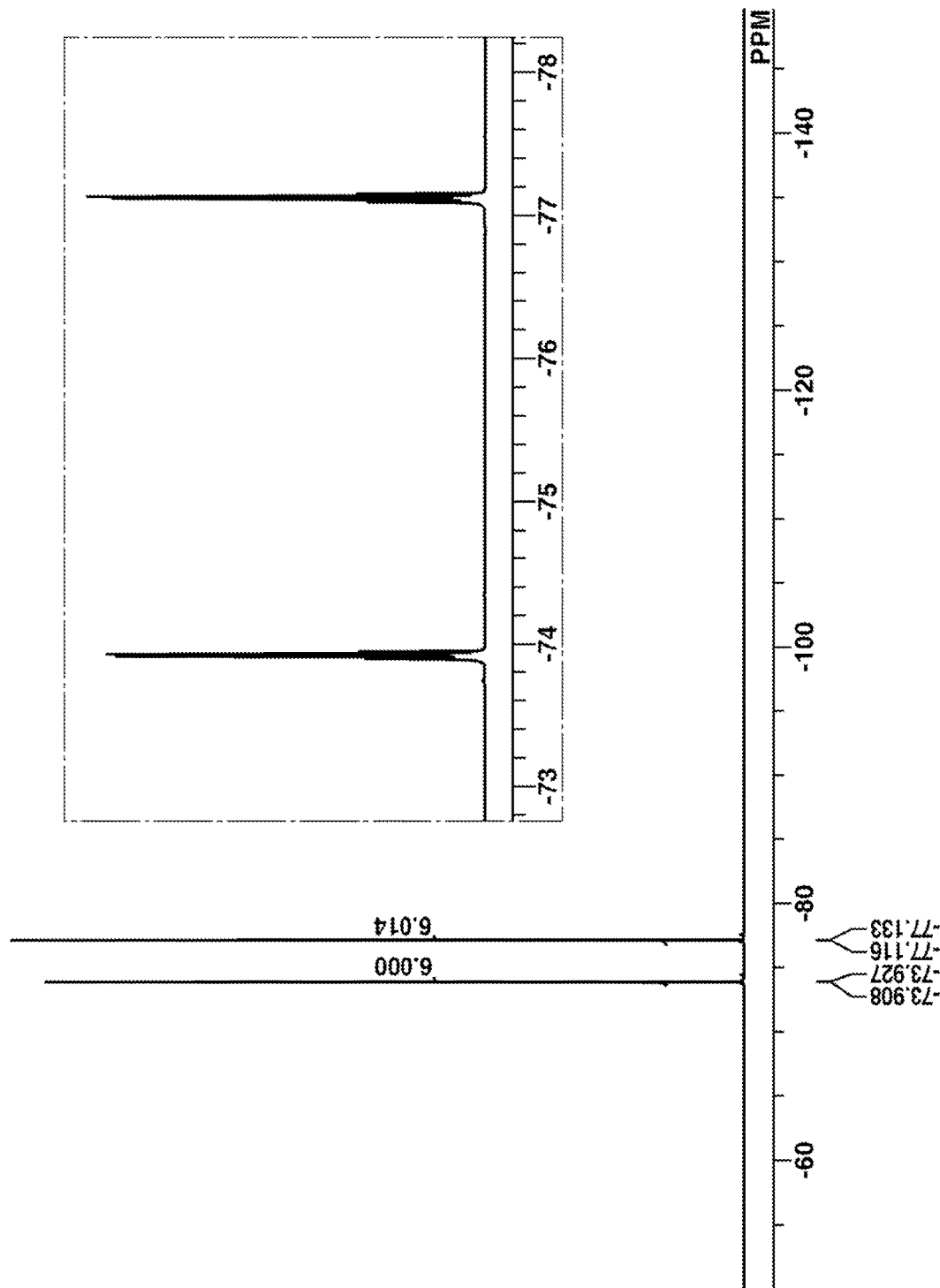
FIG. 2 is a diagram showing the $^{19}$F-NMR spectrum of compound Q-1 in Synthesis Example 1-1.

The compound Q-1 was analyzed by spectroscopy. The NMR spectra, $^1$H-NMR and $^{19}$F-NMR in DMSO-$d_6$ are shown in FIGS. 1 and 2, respectively. In $^1$H-NMR analysis, a minute amount of water was observed.

IR (D-ATR): 3133, 1466, 1448, 1299, 1271, 1210, 1169, 1146, 1115, 1048, 972, 965, 956, 767, 738, 703, 679, 665, 571, 535, 526, 497 cm$^{-1}$

LC/MS: Positive [M+H]$^+$ 517

Synthesis Example 1-2

Synthesis of Compound Q-2: 1-chloro-1-[2-(1-hydroxy-1-methylethyl)phenyl]-3,3-dimethyl[3H-2,1-benzoxathiol]

(1) Synthesis of Intermediate In-1: bis(2-carboxyphenyl)sulfide

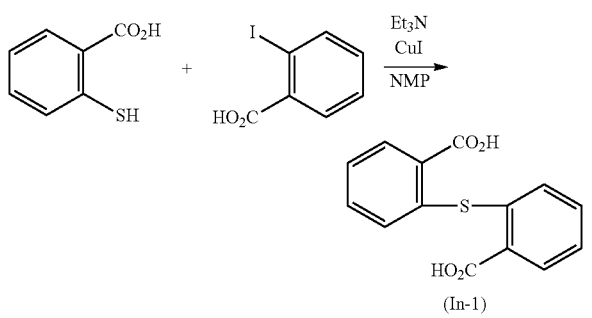

(In-1)

At room temperature, 34.0 g of triethylamine was added dropwise to a mixture of 15.4 g of thiosalicylic acid, 24.8 g of 2-iodobenzoic acid, 0.5 g of cupper iodide, and N-methylpyrrolidone (NMP). The solution was aged at 100° C. for 15 hours. Dilute hydrochloric acid was added to the reaction solution. The insoluble or powder was collected by filtration. The powder was dissolved in methanol, after which deionized water was added thereto for recrystallization. The crystals were collected by filtration and heat dried in vacuum, obtaining 23 g of Intermediate In-1 (yield 84%).

(2) Synthesis of Intermediate In-2: 2,2'-dicarboxydiphenylsulfide dimethyl ester

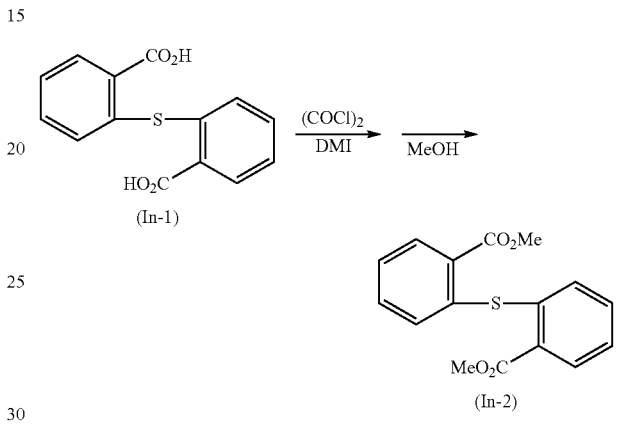

(In-2)

Intermediate In-1, 19.2 g, was dissolved in 100 g of 1,3-dimethyl-2-imidazolidinone (DMI). At room temperature, 26.7 g of oxalyl chloride was added dropwise to the solution, followed by 2 hours of aging. At room temperature, 100 g of methanol was added dropwise to the solution, followed by 3 hours of aging. Thereafter, 300 g of deionized water was added to quench the reaction. 200 g of toluene was added to the solution. The organic layer was taken out, washed with water, and concentrated under reduced pressure. The solvent removal left 22.9 g of concentrated residue. The residue as Intermediate In-2 was subjected to the subsequent reaction.

(3) Synthesis of Intermediate In-3: bis[2-(1-hydroxy-1-methylethyl)phenyl]sulfide

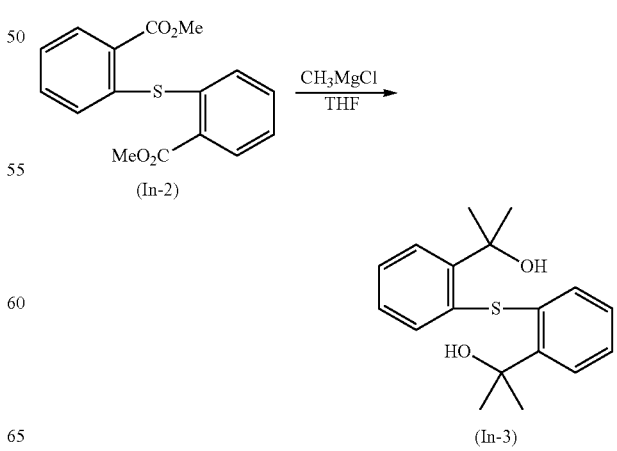

(In-3)

Intermediate In-2, 22.9 g, was dissolved in 75 g of THF. Under ice cooling, 100 g of THF solution of methylmagnesium chloride was added dropwise to the solution, followed by 20 hours of aging. Dilute hydrochloric acid was added to quench the reaction. Thereafter, 220 g of toluene was added to the reaction solution. The organic layer was taken out, washed with water, and concentrated under reduced pressure. To the concentrated residue, 100 g of hexane was added for crystallization. The crystals were collected by filtration and heat dried in vacuum, obtaining 15.7 g of the desired compound, Intermediate In-3 (yield 77%).

(4) Synthesis of Intermediate In-4: 1-chloro-1-[2-(1-hydroxy-1-methylethyl)phenyl]-3,3'-dimethyl [3H-2,1-benzoxathiol]

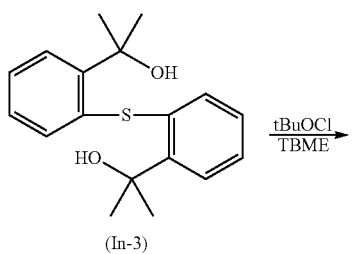

Intermediate In-3, 9.1 g, was dissolved in 50 g of tert-butyl methyl ether (TBME). Under ice cooling, 3.3 g of tert-butyl hypochlorite was added dropwise to the solution, followed by 3 hours of aging. The insoluble or powder was collected by filtration, washed with TBME, and heat dried in vacuum, obtaining 8.2 g of the desired compound, Intermediate In-4 (yield 81%).

(5) Synthesis of compound Q-2: 1-chloro-1-[2-(1-hydroxy-1-methylethyl)phenyl]-3,3'-dimethyl[3H-2,1-benzoxathiol]

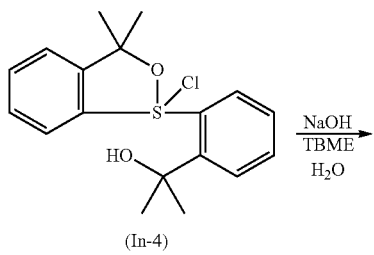

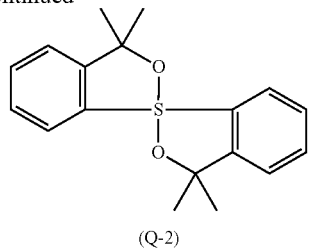

At room temperature, 37 g of a 25 wt % sodium hydroxide aqueous solution was added dropwise to a mixture of 8.2 g of Intermediate In-4 and 40 g of TBME, followed by 1 hour of aging. Then, 20 g of methyl isobutyl ketone was added to the solution. The organic layer was taken out, washed with deionized water, and concentrated under reduced pressure. Hexane was added to the concentrate for crystallization. The crystals were collected by filtration and heat dried in vacuum, obtaining 5.1 g of the target compound Q-2 (yield 73%).

The compound Q-2 was analyzed by spectroscopy. The NMR spectrum, $^1$H-NMR in DMSO-$d_6$ is shown in FIG. 3.

IR (D-ATR): 2974, 2928, 1468, 1446, 1436, 1374, 1357, 1285, 1251, 1165, 1156, 960, 945, 869, 782, 768, 743, 631, 622, 539, 532, 481, 458, 430 cm$^{-1}$

LC/MS: Positive [M+H]$^+$ 301

[2] Synthesis of Base Polymers

Synthesis Example 2-1

Synthesis of Polymer P-1

A 3-L flask was charged with 314.4 g of 5-acetoxyacenaphthylene, 22.0 g of 4-chlorostyrene, 190.7 g of indene, and 675 g of toluene solvent. The reactor was cooled at −70° C. under nitrogen atmosphere, after which vacuum pumping and nitrogen flow were repeated 3 times. The reactor was warmed up to room temperature, after which 40.5 g of 2,2'-azobis(2,4-dimethylvaleronitrile) (V-65 by Fujifilm Wako Pure Chemical Corp.) was added as polymerization initiator. The reactor was heated at 45° C., at which reaction took place for 20 hours, and the reactor was further heated at 55° C., at which reaction took place for 20 hours. The reaction solution was concentrated to ½, and added to 15 L of methanol for precipitation. The precipitated white solid was filtered and vacuum dried at 40° C., obtaining 309 g of white solid.

The white solid was dissolved in a mixture of 488 g methanol and 540 g THF again. 162 g of triethylamine and 32 g of water were added to the solution, after which deprotection reaction took place at 60° C. for 40 hours. The reaction solution was concentrated and dissolved in 870 g of ethyl acetate. The solution was subjected to neutralization/separatory washing once with a mixture of 250 g water and 98 g acetic acid, and to separatory washing once with a mixture of 225 g water and 75 g pyridine and 4 times with 225 g water. Thereafter, the upper layer, ethyl acetate solution was concentrated, dissolved in 250 g of acetone, and added to 15 L of water for precipitation. The precipitate was collected by filtration and vacuum dried at 50° C. for 40 hours, obtaining 223 g of Polymer P-1 in white solid form. On analysis by $^{13}$C-NMR, $^1$H-NMR, and GPC, Polymer P-1 was identified as below.

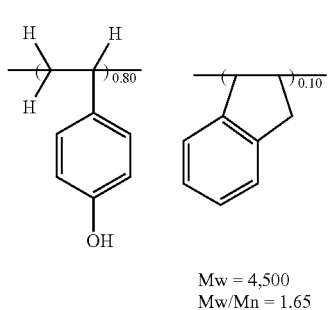
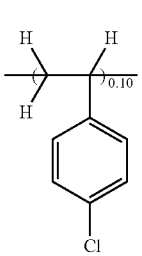

P-1

Mw = 4,500
Mw/Mn = 1.65

Synthesis Example 2-2

Synthesis of Polymer P-9

In nitrogen atmosphere, 890 g of 50.0 wt % PGMEA solution of 4-hydroxystyrene, 47.7 g of acenaphthylene, 310 g of 54.7 wt % PGMEA solution of 4-(2-hydroxy-2-propyl) styrene, 87.0 g of triphenylsulfonium 1,1,3,3,3-pentafluoro-2-methacryloyloxypropane-1-sulfonate, 96.1 g of dimethyl 2,2'-azobis(2-methylpropionate) (V-601 by Fujifilm Wako Pure Chemical Corp.), and 360 g of γ-butyrolactone and 220 g of PGMEA as solvent were fed into a 3000-mL dropping cylinder to form a monomer solution. A 5000-mL flask under nitrogen atmosphere was charged with 580 g of γ-butyrolactone and heated at 80° C. The monomer solution was added dropwise to the flask over the course of 4 hours. After the completion of dropwise addition, the polymerization solution was continuously stirred for 18 hours while maintaining its temperature at 80° C. The polymerization solution was cooled to room temperature and added dropwise to 22.5 kg of diisopropyl ether whereupon a white solid precipitated. After diisopropyl ether was decanted off, the precipitated white solid was dissolved in 2,250 g of acetone. The acetone solution was added dropwise to 22.5 kg of diisopropyl ether, and the precipitated white solid was collected by filtration. The white solid was dissolved in 2,250 g of acetone again. The acetone solution was added dropwise to 22.5 kg of water and the precipitated while solid was filtered. The white solid was dried at 40° C. for 40 hours, obtaining 700 g of Polymer P-9 in white solid form. On analysis by $^{13}$C-NMR, $^1$H-NMR, and GPC, Polymer P-9 was identified as below.

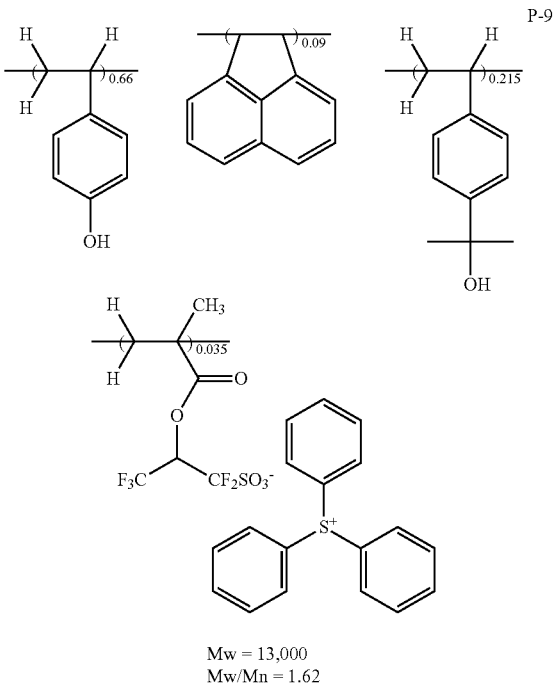

P-9

Mw = 13,000
Mw/Mn = 1.62

Synthesis Examples 2-3 to 2-30

Synthesis of Polymers P-2 to P-8, P-10 to P-30

Polymers P-2 to P-8, P-10 to P-30 were synthesized by the same procedure as in Synthesis Example 2-1 or 2-2 aside from changing the type and incorporation ratio (in molar ratio) of monomers. Table 1 shows the type and ratio (mol %) of monomers incorporated in the polymers. It is noted that Mw of Polymers P-1 to P-8, P-18, P-19, P-21, P-23 to P-26, and P-28 was measured by GPC versus polystyrene standards using THF solvent, whereas Mw of Polymers P-9 to P-17, P-20, P-22, P-27, P-29, and P-30 was measured by GPC versus polystyrene standards using N,N-dimethylformamide solvent.

TABLE 1

| | Unit 1 | Ratio (mol %) | Unit 2 | Ratio (mol %) | Unit 3 | Ratio (mol %) | Unit 4 | Ratio (mol %) | Unit 5 | Ratio (mol %) | Mw | Mw/Mn |
|---|---|---|---|---|---|---|---|---|---|---|---|---|
| P-1 | A-1 | 80.0 | B-1 | 10.0 | B-5 | 10.0 | — | — | — | — | 4,500 | 1.65 |
| P-2 | A-1 | 80.0 | B-2 | 8.0 | B-4 | 12.0 | — | — | — | — | 4,400 | 1.64 |
| P-3 | A-1 | 60.0 | B-2 | 10.0 | C-1 | 30.0 | — | — | — | — | 3,700 | 1.62 |
| P-4 | A-1 | 70.0 | B-2 | 7.0 | C-2 | 23.0 | — | — | — | — | 3,600 | 1.63 |
| P-5 | A-1 | 70.0 | B-2 | 10.0 | C-3 | 20.0 | — | — | — | — | 3,900 | 1.65 |
| P-6 | A-1 | 30.0 | B-2 | 10.0 | C-4 | 60.0 | — | — | — | — | 3,900 | 1.62 |
| P-7 | A-1 | 45.0 | 5-2 | 10.0 | C-5 | 45.0 | — | — | — | — | 4,100 | 1.63 |
| P-8 | A-1 | 55.0 | B-4 | 10.0 | C-1 | 35.0 | — | — | — | — | 4,000 | 1.63 |
| P-9 | A-1 | 66.0 | B-2 | 9.0 | C-1 | 21.5 | E-1 | 3.5 | — | — | 13,000 | 1.62 |
| P-10 | A-1 | 60.0 | B-2 | 4.0 | C-1 | 24.0 | E-1 | 12.0 | — | — | 15,000 | 1.65 |
| P-11 | A-1 | 67.0 | B-2 | 10.0 | C-1 | 18.5 | E-2 | 4.5 | — | — | 14,000 | 1.63 |
| P-12 | A-1 | 67.0 | B-2 | 9.3 | C-1 | 20.0 | E-3 | 3.7 | — | — | 13,500 | 1.63 |
| P-13 | A-1 | 67.3 | B-2 | 10.0 | C-1 | 17.5 | E-4 | 5.2 | — | — | 13,200 | 1.64 |
| P-14 | A-1 | 64.1 | B-2 | 9.5 | C-1 | 22.0 | E-5 | 4.4 | — | — | 12,800 | 1.62 |
| P-15 | A-1 | 64.0 | B-2 | 10.0 | C-1 | 22.8 | E-6 | 3.2 | — | — | 13,500 | 1.63 |
| P-16 | A-1 | 62.0 | B-3 | 10.0 | C-1 | 24.3 | E-1 | 3.7 | — | — | 12,400 | 1.66 |
| P-17 | A-2 | 60.5 | B-4 | 10.0 | C-1 | 24.4 | E-2 | 5.1 | — | — | 12,300 | 1.65 |
| P-18 | A-1 | 80.0 | C-1 | 20.0 | — | — | — | — | — | — | 4,200 | 1.69 |
| P-19 | A-1 | 80.0 | B-2 | 5.0 | C-1 | 15.0 | — | — | — | — | 4,300 | 1.67 |

TABLE 1-continued
| | Unit 1 | Ratio (mol %) | Unit 2 | Ratio (mol %) | Unit 3 | Ratio (mol %) | Unit 4 | Ratio (mol %) | Unit 5 | Ratio (mol %) | Mw | Mw/Mn |
|---|---|---|---|---|---|---|---|---|---|---|---|---|
| P-20 | A-1 | 30.0 | B-2 | 2.5 | C-1 | 15.0 | E-1 | 2.5 | — | — | 12,100 | 1.69 |
| P-21 | A-2 | 50.0 | C-1 | 30.0 | D-4 | 20.0 | — | — | — | — | 4,600 | 1.67 |
| P-22 | A-2 | 50.0 | B-2 | 2.5 | C-1 | 30.0 | D-1 | 15.0 | E-1 | 2.5 | 12,700 | 1.73 |
| P-23 | A-2 | 50.0 | C-1 | 30.0 | D-2 | 20.0 | — | — | — | — | 5,400 | 1.72 |
| P-24 | A-2 | 50.0 | C-1 | 30.0 | D-3 | 20.0 | — | — | — | — | 6,100 | 1.73 |
| P-25 | A-2 | 50.0 | C-1 | 30.0 | D-4 | 20.0 | — | — | — | — | 7,000 | 1.76 |
| P-26 | A-1 | 67.5 | B-2 | 2.5 | C-1 | 30.0 | — | — | — | — | 4,100 | 1.65 |
| P-27 | A-1 | 57.5 | B-2 | 2.5 | C-1 | 30.0 | E-5 | 10 | — | — | 11,000 | 1.65 |
| P-28 | A-1 | 70.0 | C-1 | 30.0 | — | — | — | — | — | — | 4,000 | 1.71 |
| P-29 | A-1 | 65.0 | C-1 | 25.0 | E-7 | 10.0 | — | — | — | — | 12,500 | 1.80 |
| P-30 | A-1 | 65.0 | C-1 | 25.0 | E-8 | 10.0 | — | — | — | — | 13,000 | 1.77 |
The structure of repeat units in Table 1 is shown below.
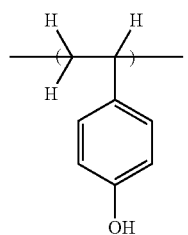
A-1
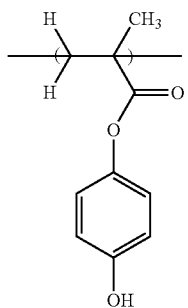
A-2
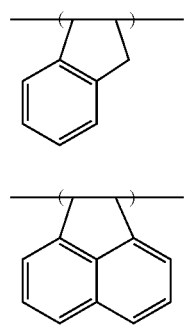
B-1
B-2
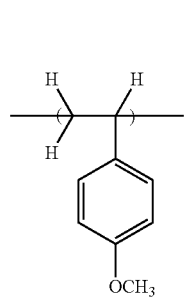
B-3
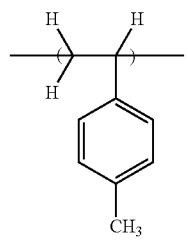
B-4
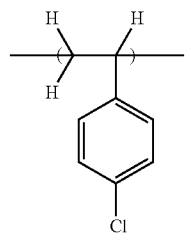
B-5
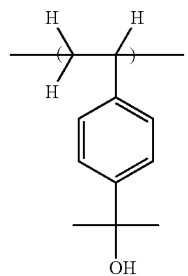
C-1
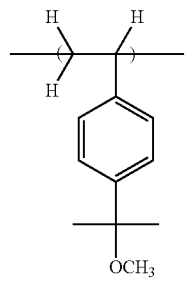
C-2

C-3
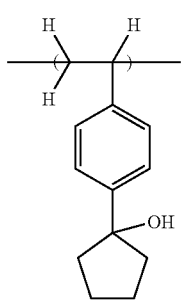
C-4
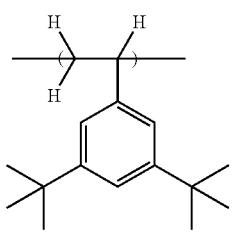
C-5
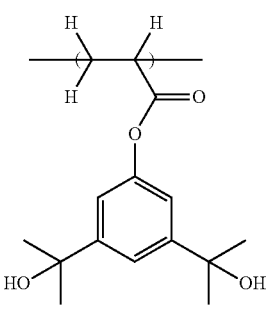
D-1
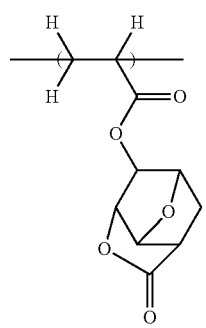
D-2
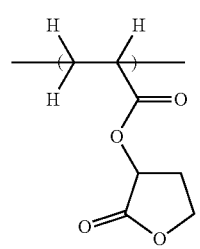
D-3
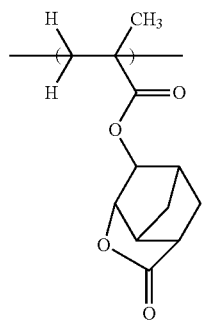
D-4
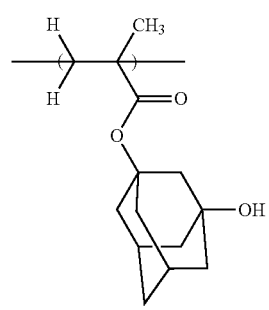
E-1
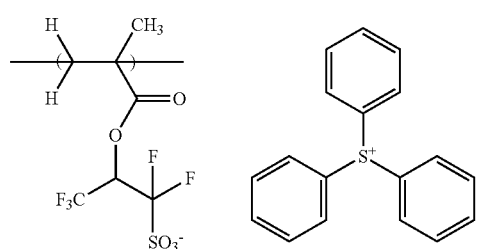
E-2
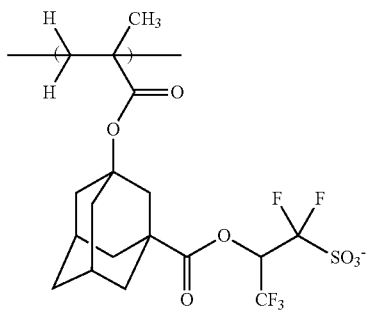

-continued

E-3

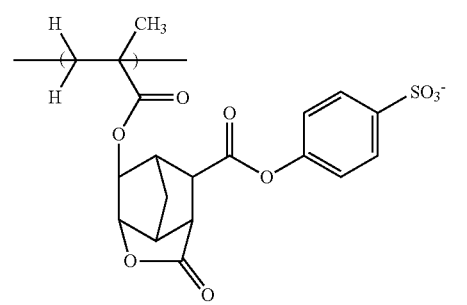

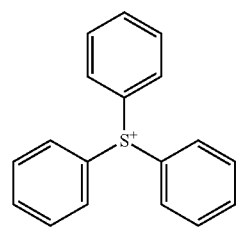

E-4

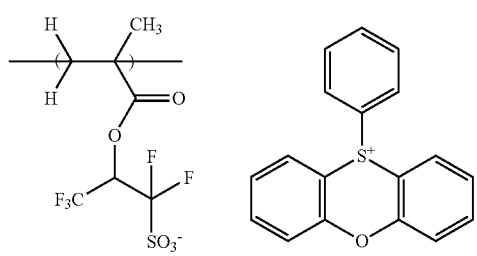

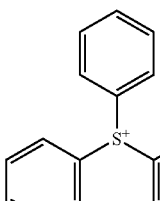

E-5

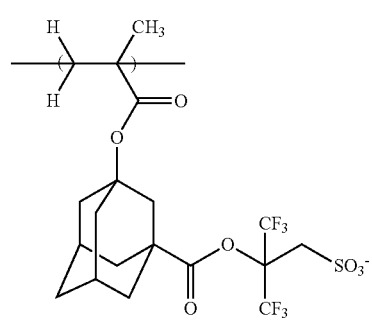

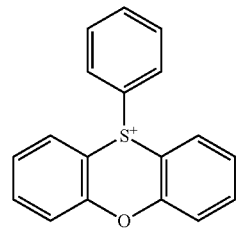

E-6

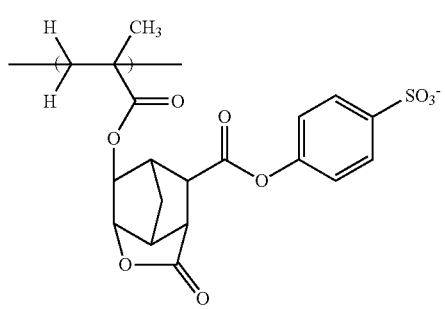

-continued

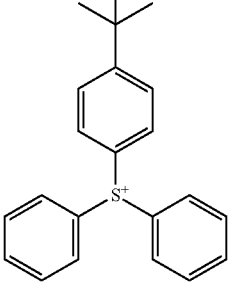

E-7

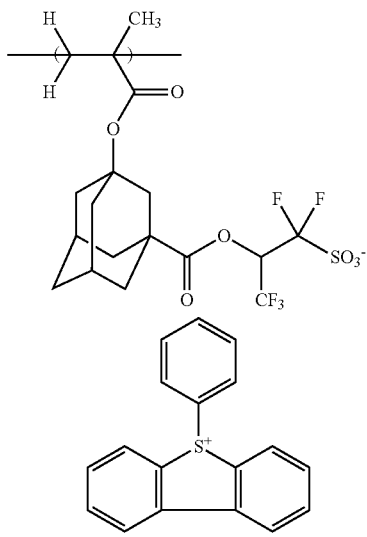

E-8

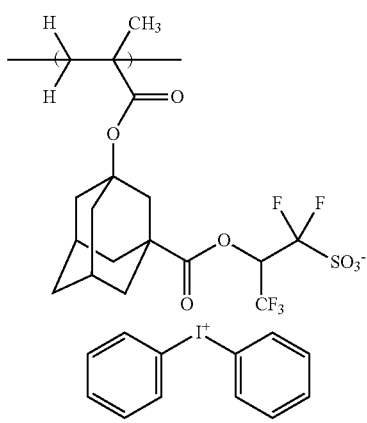

[3] Preparation of Chemically Amplified Negative Resist Composition

Examples 1-1 to 1-63 and Comparative Examples 1-1 to 1-8

A chemically amplified negative resist composition (R-01 to R-63, CR-1 to CR-8) was prepared by dissolving selected components in an organic solvent in accordance with the formulation shown in Tables 2 to 5, and filtering the solution through a UPE filter and/or nylon filter with a pore size of 5 nm. The resist compositions of Examples 1-1 to 1-51 and Comparative Examples 1-1 to 1-4 used a mixture of 1,204 pbw of PGMEA, 1,204 pbw of EL, and 1,606 pbw of PGME as the organic solvent. The resist compositions of Examples 1-52 to 1-63 and Comparative Examples 1-5 to 1-8 used a mixture of 249 pbw of PGMEA and 655 pbw of EL as the organic solvent. To some compositions, a fluorinated polymer (Polymer FP-1 to FP-3) as additive, tetramethoxymethyl glycol uril (TMGU) as crosslinker, and PF-636 (Omonoval Solutions Inc.) as surfactant were added.

TABLE 2

| | | Resist composition | Acid diffusion inhibitor (pbw) | Polymer 1 (pbw) | Polymer 2 (pbw) | Acid generator (pbw) | Crosslinker (pbw) | Additive (pbw) | Surfactant (pbw) |
|---|---|---|---|---|---|---|---|---|---|
| Example | 1-1 | R-1 | Q-1 (6.0) | P-1 (80) | — | PAG-A (2) PAG-C (8) | TMGU (8.154) | — | PF-636 (0.075) |
| | 1-2 | R-2 | Q-1 (5.8) | P-1 (80) | — | PAG-A (2) PAG-C (8) | TMGU (8.154) | FP-1 (3) | PF-636 (0.075) |
| | 1-3 | R-3 | Q-1 (5.8) | P-1 (80) | — | PAG-A (2) PAG-C (8) | TMGU (8.154) | FP-2 (3) | PF-636 (0.075) |
| | 1-4 | R-4 | Q-1 (5.8) | P-1 (80) | — | PAG-A (2) PAG-C (8) | TMGU (8.154) | FP-3 (3) | PF-636 (0.075) |
| | 1-5 | R5 | Q-1 (6.5) | P-2 (80) | — | PAG-A (2) PAG-C (8) | TMGU (8.154) | — | PF-636 (0.075) |
| | 1-6 | R-6 | Q-1 (6.0) | P-3 (80) | — | PAG-A (10) | — | — | — |
| | 1-7 | R-7 | Q-1 (5.8) | P-3 (80) | — | PAG-A (10) | — | FP-1 (3) | — |
| | 1-8 | R-8 | Q-1 (6.0) | P-4 (80) | — | PAG-A (10) | — | — | — |
| | 1-9 | R-9 | Q-1 (5.0) | P-5 (80) | — | PAG-A (10) | — | — | — |
| | 1-10 | R-10 | Q-1 (6.0) | P-6 (80) | — | PAG-A (10) | — | — | — |
| | 1-11 | R-11 | Q-1 (6.0) | P-7 (80) | — | PAG-A (10) | — | — | — |
| | 1-12 | R-12 | Q-1 (6.5) | P-8 (80) | — | PAG-D (5) | — | — | — |
| | 1-13 | R-13 | Q-1 (7.0) | P-9 (80) | — | — | — | — | — |
| | 1-14 | R-14 | Q-1 (10.0) | P-9 (80) | — | PAG-D (5) | — | — | — |
| | 1-15 | R-15 | Q-1 (12.0) | P-10 (80) | — | PAG-D (5) | — | — | — |
| | 1-16 | R-16 | Q-1 (12.0) | P-11 (80) | — | PAG-D (5) | — | — | — |
| | 1-17 | R-17 | Q-1 (12.0) | P-12 (80) | — | PAG-D (5) | — | — | — |
| | 1-18 | R-18 | Q-1 (120) | P-13 (80) | — | PAG-D (5) | — | — | — |
| | 1-19 | R-19 | Q-1 (10.0) | P-14 (80) | — | PAG-D (5) | — | — | — |
| | 1-20 | R-20 | Q-1 (9.0) | P-15 (80) | — | PAG-D (5) | — | — | — |
| | 1-21 | R-21 | Q-1 (9.0) | P-16 (80) | — | PAG-D (5) | — | — | — |
| | 1-22 | R-22 | Q-1 (9.0) | P-17 (80) | — | PAG-D (5) | — | — | — |
| | 1-23 | R-23 | Q-1 (6.0) | P-9 (40) | P-3 (40) | PAG-A (5) | — | — | — |
| | 1-24 | R-24 | Q-1 (6.0) | P-9 (40) | P-3 (40) | PAG-A (5) PAG-B (2) | — | FP-1 (3) | — |
| | 1-25 | R-25 | Q-1 (6.0) | P-9 (40) | P-3 (40) | PAG-D (7) | — | — | — |

TABLE 3

| | | Resist composition | Acid diffusion inhibitor (pbw) | Polymer 1 (pbw) | Polymer 2 (pbw) | Acid generator (pbw) | Crosslinker (pbw) | Additive (pbw) | Surfactant (pbw) |
|---|---|---|---|---|---|---|---|---|---|
| Example | 1-26 | R-26 | Q-1 (5.8) | P-9 (40) | P-3 (40) | PAG-D (7) | — | FP-1 (3) | — |
| | 1-27 | R-27 | Q-1 (5.6) | P-9 (40) | P-3 (40) | PAG-D (7) | — | FP-1 (5) | — |
| | 1-28 | R-28 | Q-1 (5.9) | P-9 (40) | P-3 (40) | PAG-E (7) | — | — | — |
| | 1-29 | R-29 | Q-1 (5.7) | P-9 (40) | P-3 (40) | PAG-E (7) | — | FP-1 (3) | — |
| | 1-30 | R-30 | Q-1 (5.7) | P-9 (40) | P-3 (40) | PAG-E (7) | — | FP-1 (3) | — |
| | 1-31 | R-31 | Q-1 (5.7) | P-9 (40) | P-3 (40) | PAG-E (7) | — | FP-1 (3) | — |

TABLE 3-continued

|  | Resist composition | Acid diffusion inhibitor (pbw) | Polymer 1 (pbw) | Polymer 2 (pbw) | Acid generator (pbw) | Crosslinker (pbw) | Additive (pbw) | Surfactant (pbw) |
|---|---|---|---|---|---|---|---|---|
| 1-32 | R-32 | Q-1 (5.5) | P-9 (40) | P-4 (40) | PAG-E (7) | — | — | — |
| 1-33 | R-33 | Q-1 (5.5) | P-9 (40) | P-5 (40) | PAG-E (7) | — | — | — |
| 1-34 | R-34 | Q-1 (5.5) | P-9 (40) | P-6 (40) | PAG-E (7) | — | — | — |
| 1-35 | R-35 | Q-1 (6.5) | P-9 (40) | P-7 (40) | PAG-E (7) | — | — | — |
| 1-36 | R-36 | Q-1 (6.5) | P-9 (40) | P-7 (40) | PAG-F (7) | — | — | — |
| 1-37 | R-37 | Q-1 (6.1) | P-10 (20) | P-3 (60) | PAG-D (3) | — | — | — |
| 1-38 | R-38 | Q-1 (8.0) | P-10 (40) | P-3 (40) | PAG-A (5) PAG-B (2) | — | — | — |
| 1-39 | R-39 | Q-1 (6.5) | P-11 (40) | P-3 (40) | PAG-A (5) PAG-B (2) | — | — | — |
| 1-40 | R-40 | Q-1 (5.5) | P-12 (40) | P-3 (40) | PAG-A (5) PAG-B (2) | — | — | — |
| 1-41 | R-41 | Q-1 (5.8) | P-13 (40) | P-3 (40) | PAG-A (5) PAG-B (2) | — | — | — |
| 1-42 | R-42 | Q-1 (5.6) | P-14 (40) | P-3 (40) | PAG-A (5) PAG-B (2) | — | — | — |
| 1-43 | R-43 | Q-1 (5.8) | P-15 (40) | P-3 (40) | PAG-A (5) PAG-B (2) | — | — | — |
| 1-44 | R-44 | Q-1 (6.5) | P-16 (40) | P-3 (40) | PAG-A (5) PAG-B (2) | — | — | — |
| 1-45 | R-45 | Q-1 (6.5) | P-17 (40) | P-3 (40) | PAG-A (5) PAG-B (2) | — | — | — |
| 1-46 | R-46 | Q-2 (5.0) | P-1 (80) | — | PAG-A (2) PAG-C (8) | TMGU (8.154) | — | PF-636 (0.075) |
| 1-47 | R-47 | Q-2 (4.8) | P-1 (80) | — | PAG-A (2) PAG-C (8) | TMGU (8.154) | FP-1 (3) | PF-636 (0.075) |
| 1-48 | R-48 | Q-2 (5.0) | P-9 (40) | P-3 (40) | PAG-A (5) PAG-B (2) | — | — | — |
| 1-49 | R-49 | Q-2 (4.8) | P-9 (40) | P-3 (40) | PAG-A (5) PAG-B (2) | — | FP-1 (3) | — |
| 1-50 | R-50 | Q-2 (5.0) | P-9 (40) | P-3 (40) | PAG-E (7) | — | — | — |

TABLE 4

|  |  | Resist composition | Acid diffusion inhibitor (pbw) | Polymer 1 (pbw) | Polymer 2 (pbw) | Acid generator (pbw) | Crosslinker (pbw) | Additive (pbw) | Surfactant (pbw) |
|---|---|---|---|---|---|---|---|---|---|
| Example | 1-51 | R-51 | Q-2 (4.8) | P-9 (40) | P-3 (40) | PAG-E (7) | — | FP-1 (3) | — |
|  | 1-52 | R-52 | Q-1 (6.0) | P-18 (80) | — | PAG-A (4) | — | — | — |
|  | 1-53 | R-53 | Q-1 (5.8) | P-18 (80) | — | PAG-A (4) | — | FP-1 (3) | — |
|  | 1-54 | R-54 | Q-1 (5.2) | P-19 (80) | — | PAG-A (4) | — | — | — |
|  | 1-55 | R-55 | Q-1 (5.5) | P-20 (80) | — | PAG-A (4) | — | — | — |
|  | 1-56 | R-56 | Q-1 (5.8) | P-21 (80) | — | PAG-A (4) | — | — | — |
|  | 1-57 | R-57 | Q-1 (5.5) | P-22 (80) | — | PAG-A (4) | — | — | — |
|  | 1-58 | R-58 | Q-1 (6.0) | P-23 (80) | — | PAG-A (4) | — | — | — |
|  | 1-59 | R-59 | Q-1 (6.0) | P-24 (80) | — | PAG-A (4) | — | — | — |
|  | 1-60 | R-60 | Q-1 (6.0) | P-25 (80) | — | PAG-A (4) | — | — | — |
|  | 1-61 | R-61 | Q-1 (20.0) | P-9 (40) | P-3 (40) | — | — | FP-1 (3) | — |
|  | 1-62 | R-62 | Q-1 (35.0) | P-9 (40) | P-3 (40) | — | — | FP-1 (3) | — |
|  | 1-63 | R-63 | Q-1 (55.0) | P-9 (40) | P-3 (40) | — | — | FP-1 (3) | — |

TABLE 5

| | Resist composition | Acid diffusion inhibitor (pbw) | Polymer 1 (pbw) | Polymer 2 (pbw) | Acid generator (pbw) | Crosslinker (pbw) | Additive (pbw) | Surfactant (pbw) |
|---|---|---|---|---|---|---|---|---|
| Comparative Example 1-1 | CR-1 | cQ-1 (5.5) | P-1 (80) | — | PAG-A (2) PAG-C (8) | TMGU (8.154) | — | PF-636 (0.075) |
| 1-2 | CR-2 | cQ-1 (5.0) | P-9 (40) | P-3 (40) | PAG-A (5) PAG-C (2) | — | — | — |
| 1-3 | CR-3 | cQ-2 (2.5) | P-1 (80) | — | PAG-A (2) PAG-C (8) | TMGU (8.154) | — | PF-636 (0.075) |
| 1-4 | CR-4 | cQ-2 (1.9) | P-9 (40) | P-3 (40) | PAG-A (5) PAG-C (2) | — | — | — |
| 1-5 | CR-5 | cQ-1 (1.0) | P-20 (80) | — | PAG-A (4) | — | — | — |
| 1-6 | CR-6 | cQ-2 (0.5) | P-20 (80) | — | PAG-A (4) | — | — | — |
| 1-7 | CR-7 | cQ-1 (1.0) | P-21 (80) | — | PAG-A (4) | — | — | — |
| 1-8 | CR-8 | cQ-2 (0.5) | P-21 (80) | — | PAG-A (4) | — | — | — |

The acid diffusion inhibitors cQ-1 and cQ-2, acid generators PAG-A to PAG-F, and fluorinated polymers P-1 to FP-3 in Tables 2 to are identified below.

cQ-1, cQ-2:

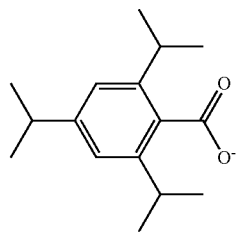

cQ-1

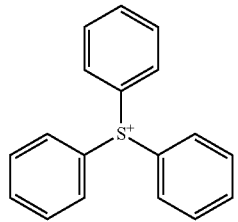

cQ-2

PAG-A to PAG-F:

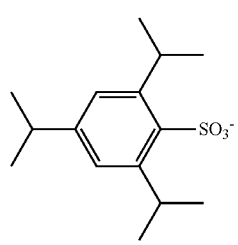

PAG-A

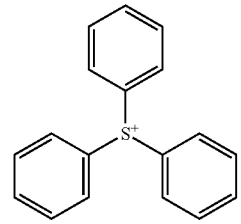

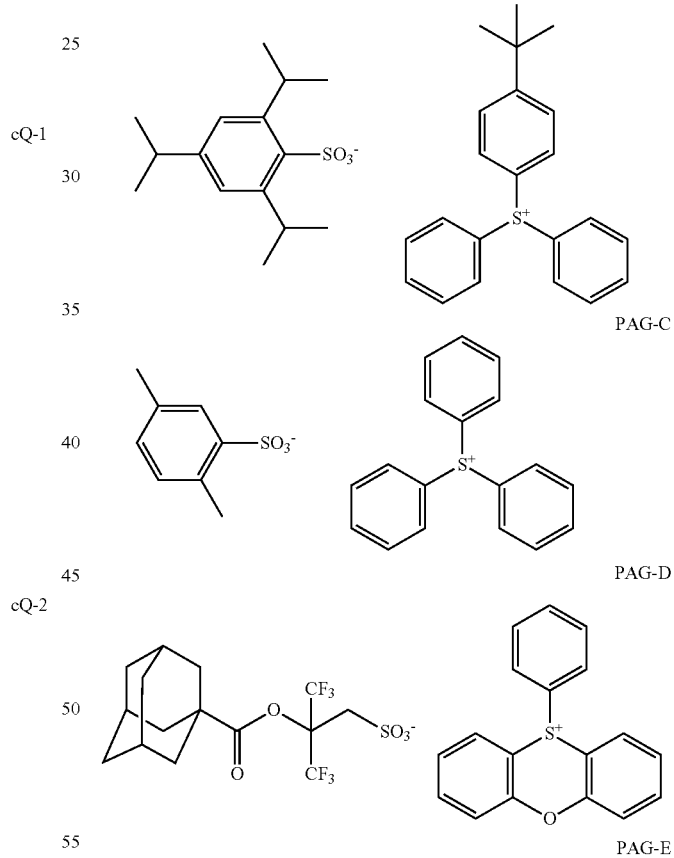

PAG-B

PAG-C

PAG-D

PAG-E

-continued

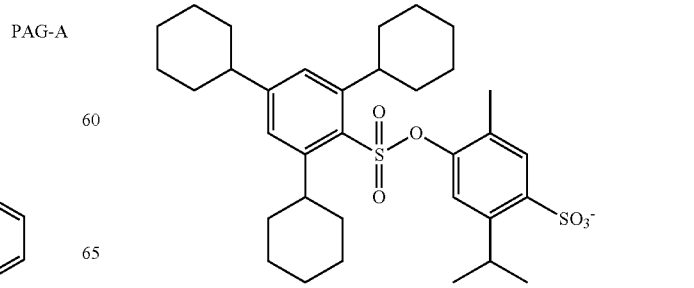

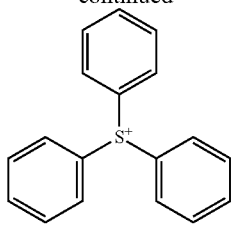

PAG-F

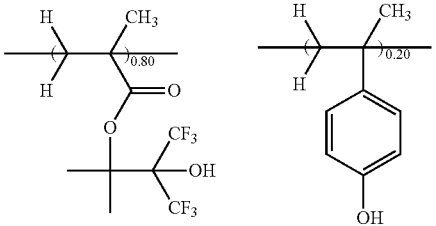

(Mw = 6,500)

[4] EB Lithography Test

Examples 2-1 to 2-54 and Comparative Examples 2-1 to 2-4

Using a coater/developer system ACT-M (Tokyo Electron Ltd.), each of the negative resist compositions (R-1 to R-51 and CR-1 to CR-4) was spin coated onto a mask blank of 152 mm squares having the outermost surface in the form of a silicon oxide coating, which had been vapor-primed with hexamethyldisilazane (HMDS), and prebaked on a hotplate at 110° C. for 600 seconds to form a resist film of 80 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The resist film was exposed to EB using an EB writer system EBM-5000Plus (NuFlare Technology Inc., accelerating voltage 50 kV), then baked (PEB) at 120° C. for 600 seconds, and developed in a 2.38 wt % TMAH aqueous solution, thereby yielding a negative pattern.

The resist pattern was evaluated as follows. The patterned mask blank was observed under a top-down scanning electron microscope (TDSEM). The optimum dose (Eop) was defined as the exposure dose ($\mu C/cm^2$) which provided a 1:1 resolution at the top and bottom of a 200-nm 1:1 line-and-space (LS) pattern. The LS resolution (or maximum resolution) was defined as the minimum line width of a L/S pattern that could be resolved at the optimum dose. The dot resolution (or maximum resolution) was defined as the minimum size of a pattern that could be resolved at the exposure dose capable of resolving a dot (line width) of 200 nm squares to square.

The 200-nm LS pattern printed by exposure at the optimum dose was observed under SEM. For each of the edges of 32 lines of the LS pattern, edge detection was carried out at 80 points, from which a 3-fold value (3σ) of standard deviation (σ) or variation was determined and reported as LER (nm).

The pattern was visually observed to judge whether or not the pattern profile was rectangular. Using the dose providing 1:1 resolution as reference, a change of CD per μC was determined from the dose curve. The test results are shown in Tables 6 to 8.

FP-1 to FP-3:

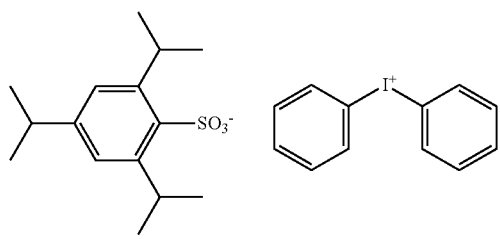

(Mw = 6,000)

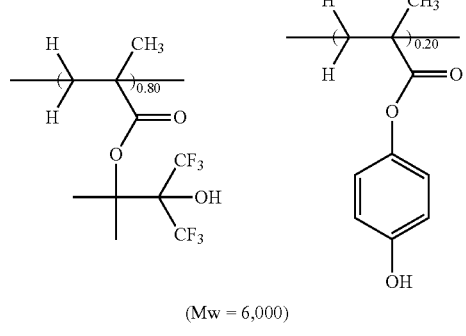

(Mw = 6,400)

TABLE 6

| | | Resist composition | Eop (μC/cm²) | Maximum resolution LS (nm) | Maximum resolution dot (nm) | CD change (nm) | LER (nm) | Pattern profile |
|---|---|---|---|---|---|---|---|---|
| Example | 2-1 | R-1 | 51 | 50 | 80 | 1.14 | 5.2 | rectangular |
| | 2-2 | R-2 | 50 | 50 | 80 | 1.10 | 5.1 | rectangular |
| | 2-3 | R-3 | 53 | 50 | 80 | 1.17 | 5.2 | rectangular |
| | 2-4 | R-4 | 49 | 50 | 80 | 1.12 | 5.2 | rectangular |
| | 2-5 | R-5 | 48 | 50 | 80 | 1.11 | 5.1 | rectangular |
| | 2-6 | R-6 | 50 | 40 | 70 | 1.08 | 4.8 | rectangular |
| | 2-7 | R-7 | 51 | 40 | 70 | 0.99 | 4.6 | rectangular |
| | 2-8 | R-8 | 50 | 40 | 70 | 1.04 | 4.7 | rectangular |
| | 2-9 | R-9 | 52 | 40 | 70 | 1.05 | 4.9 | rectangular |
| | 2-10 | R-10 | 51 | 40 | 70 | 1.06 | 4.8 | rectangular |
| | 2-11 | R-11 | 49 | 40 | 70 | 1.06 | 4.7 | rectangular |
| | 2-12 | R-12 | 49 | 40 | 70 | 1.04 | 4.7 | rectangular |
| | 2-13 | R-13 | 50 | 40 | 70 | 1.06 | 4.8 | rectangular |
| | 2-14 | R-14 | 49 | 40 | 70 | 1.06 | 4.9 | rectangular |
| | 2-15 | R-15 | 51 | 40 | 70 | 1.07 | 4.7 | rectangular |
| | 2-16 | R-16 | 51 | 40 | 70 | 1.04 | 4.8 | rectangular |
| | 2-17 | R-17 | 50 | 40 | 70 | 1.06 | 4.9 | rectangular |
| | 2-18 | R-18 | 52 | 40 | 70 | 1.07 | 4.8 | rectangular |
| | 2-19 | R-19 | 51 | 40 | 70 | 1.06 | 4.9 | rectangular |
| | 2-20 | R-20 | 49 | 40 | 70 | 1.05 | 4.8 | rectangular |
| | 2-21 | R-21 | 50 | 40 | 70 | 1.04 | 4.8 | rectangular |
| | 2-22 | R-22 | 51 | 40 | 70 | 1.09 | 4.7 | rectangular |
| | 2-23 | R-23 | 48 | 40 | 70 | 1.04 | 4.9 | rectangular |
| | 2-24 | R-24 | 52 | 37 | 65 | 1.02 | 4.6 | rectangular |
| | 2-25 | R-25 | 51 | 37 | 65 | 1.01 | 4.6 | rectangular |
| | 2-26 | R-26 | 50 | 37 | 65 | 0.97 | 4.5 | rectangular |
| | 2-27 | R-27 | 52 | 37 | 65 | 0.98 | 4.5 | rectangular |
| | 2-28 | R-28 | 52 | 37 | 65 | 1.04 | 4.6 | rectangular |
| | 2-29 | R-29 | 51 | 37 | 65 | 0.99 | 4.6 | rectangular |
| | 2-30 | R-30 | 50 | 37 | 65 | 0.99 | 4.7 | rectangular |

TABLE 7

| | | Resist composition | Eop (μC/cm²) | Maximum resolution LS (nm) | Maximum resolution dot (nm) | CD change (nm) | LER (nm) | Pattern profile |
|---|---|---|---|---|---|---|---|---|
| Example | 2-31 | R-31 | 49 | 37 | 65 | 0.99 | 4.7 | rectangular |
| | 2-32 | R-32 | 52 | 37 | 65 | 1.06 | 4.8 | rectangular |
| | 2-33 | R-33 | 52 | 37 | 65 | 1.07 | 4.6 | rectangular |
| | 2-34 | R-34 | 51 | 37 | 65 | 1.07 | 4.7 | rectangular |
| | 2-35 | R-35 | 50 | 37 | 70 | 1.05 | 4.8 | rectangular |
| | 2-36 | R-36 | 51 | 37 | 70 | 1.07 | 4.6 | rectangular |
| | 2-37 | R-37 | 51 | 40 | 70 | 1.06 | 4.7 | rectangular |
| | 2-38 | R-38 | 52 | 40 | 70 | 1.07 | 4.8 | rectangular |
| | 2-39 | R-39 | 50 | 40 | 70 | 1.04 | 4.6 | rectangular |
| | 2-40 | R-40 | 50 | 40 | 70 | 1.05 | 4.7 | rectangular |
| | 2-41 | R-41 | 48 | 40 | 70 | 1.06 | 4.8 | rectangular |
| | 2-42 | R-42 | 51 | 40 | 70 | 1.06 | 4.7 | rectangular |
| | 2-43 | R-43 | 50 | 50 | 70 | 1.05 | 5.2 | rectangular |
| | 2-44 | R-44 | 51 | 50 | 70 | 1.06 | 5.2 | rectangular |
| | 2-45 | R-45 | 52 | 40 | 70 | 1.06 | 4.8 | rectangular |
| | 2-46 | R-46 | 49 | 50 | 80 | 1.07 | 4.8 | rectangular |
| | 2-47 | R-47 | 48 | 50 | 80 | 1.01 | 4.6 | rectangular |
| | 2-48 | R-48 | 51 | 40 | 65 | 1.03 | 4.8 | rectangular |
| | 2-49 | R-49 | 52 | 40 | 65 | 1.04 | 4.8 | rectangular |
| | 2-50 | R-50 | 50 | 40 | 65 | 1.03 | 4.9 | rectangular |
| | 2-51 | R-51 | 51 | 40 | 65 | 1.05 | 4.8 | rectangular |
| | 2-52 | R-61 | 120 | 35 | 60 | 0.88 | 4.1 | rectangular |
| | 2-53 | R-62 | 210 | 35 | 60 | 0.80 | 3.6 | rectangular |
| | 2-54 | R-63 | 315 | 35 | 60 | 0.75 | 3.2 | rectangular |

TABLE 8

| | | Resist composition | Eop (µC/cm$^2$) | Maximum resolution LS (nm) | Maximum resolution dot (nm) | CD change (nm) | LER (nm) | Pattern profile |
|---|---|---|---|---|---|---|---|---|
| Comparative Example | 2-1 | CR-1 | 52 | 65 | 100 | 1.58 | 6.3 | undercut |
| | 2-2 | CR-2 | 50 | 60 | 95 | 1.59 | 5.9 | footing |
| | 2-3 | CR-3 | 51 | 65 | 110 | 1.47 | 6.5 | undercut |
| | 2-4 | CR-4 | 52 | 60 | 95 | 1.45 | 6.3 | footing |

Because of a large polarity change between imaged and unimaged regions, a satisfactory contrast, and a high ability of quenching the acid generated upon imaging or exposure, the resist compositions (R-1 to R-51 and R-61 to R-63) comprising the compounds having formula (A1) show satisfactory results of resolution, dose margin, rectangular pattern profile, and LER. In particular, the resist compositions R-61 to R-63 could form satisfactory patterns even in extremely low sensitivity regions. The comparative resist compositions CR-1 to CR-4 are inferior in resolution and LER. This is because the acid generated upon EB writing diffuses to the unexposed (unimaged) region where negative working reaction takes place to some extent, leading to a decline of contrast.

Since the inventive resist compositions comprising the compounds having formula (A1) have a higher acid-trapping ability than the resist compositions comprising the salt used in Comparative Examples 2-1 and 2-2, they are less susceptible to the unwanted reaction than the comparative resist compositions. The compound having formula (A1) reacts with the acid generated after imaging to forma salt. As a result, the reaction contrast between the exposed (imaged) region and the unexposed (unimaged) region is increased. Comparative resist compositions (CR-3 and CR-4) show a low reaction contrast because the inhibitor cQ-2 maintains its acid diffusion controlling ability even after imaging. Consequently, the inventive negative resist compositions form patterns having satisfactory resolution and reduced LER.

[5] KrF Lithography Test

Examples 3-1 to 3-9 and Comparative Examples 3-1 to 3-4

Each of the negative resist compositions (R-52 to R-60 and CR-5 to CR-8) was spin coated on a silicon wafer having an antireflective coating (DUV42 by Nissan Chemical Industries, Ltd.) of 61 nm thick, and baked on a hotplate at 100° C. for 60 seconds to form a resist film of 240 nm thick. The resist film was exposed to KrF laser radiation by means of KrF excimer laser scanner NSR-S206D (Nikon Corp., NA=0.80), then baked (PEB) for 60 seconds, and puddle developed in a 2.38 wt % TMAH aqueous solution for 60 seconds, thereby yielding a negative 1:1 LS pattern. In the PEB step, an optimum temperature for a particular resist composition was employed.

The patterned wafer was observed under TD-SEM. When a dark pattern of 150 nm line/300 nm pitch was observed under SEM, the exposure dose (mJ/cm$^2$) which finished to a size of 150 nm on SEM observation was defined as the optimum dose (Eop). Also a bright pattern of 150 nm line/150 nm pitch printed at the optimum dose was observed under SEM. A size difference (dark pattern size–bright pattern size, nm) was computed. A smaller difference indicates less chemical flare or better performance. For numerically expressing the roughness of a pattern at the optimum dose, a variation of line width was measured at 30 points, and a 3-fold value (3σ) of the standard deviation (σ) was computed and reported as LWR (nm). The pattern profile was visually judged by top-down observation and cross-sectional observation under SEM. As used herein, the "dark pattern" refers to a layout that a resist pattern is formed around a test pattern (area surrounding the test pattern is also exposed), and inversely, "bright pattern" refers to a layout that no resist pattern is formed around a test pattern (only the test pattern is exposed). The results are shown in Table 9.

TABLE 9

| | | Resist composition | PEB (° C.) | Eop (mJ/cm$^2$) | Size difference (nm) | LWR (nm) | Pattern profile |
|---|---|---|---|---|---|---|---|
| Example | 3-1 | R-52 | 130 | 47 | 5.8 | 4.3 | rectangular |
| | 3-2 | R-53 | 130 | 56 | 6.1 | 4.1 | rectangular |
| | 3-3 | R-54 | 130 | 44 | 6.9 | 5.3 | rectangular |
| | 3-4 | R-55 | 120 | 38 | 3.7 | 3.9 | rectangular |
| | 3-5 | R-56 | 130 | 73 | 3.9 | 4.2 | rectangular |
| | 3-6 | R-57 | 120 | 50 | 3.4 | 3.8 | rectangular |
| | 3-7 | R-58 | 130 | 73 | 4.4 | 4.3 | rectangular |
| | 3-8 | R-59 | 130 | 78 | 3.3 | 4.4 | rectangular |
| | 3-9 | R-60 | 130 | 75 | 4.5 | 5.5 | rectangular |
| Comparative Example | 3-1 | CR-5 | 120 | 45 | 16.6 | 8.3 | top loss |
| | 3-2 | CR-6 | 120 | 30 | 22.9 | 7.7 | footing |
| | 3-3 | CR-7 | 130 | 54 | 12.9 | 6.6 | top loss |
| | 3-4 | CR-8 | 130 | 36 | 17.1 | 5.9 | footing |

It is evident from Table 9 that the inventive resist composition possesses improved lithography performance as demonstrated by little influence of chemical flare and a good pattern profile with reduced roughness.

[6] EUV Lithography Test

Examples 4-1 to 4-8 and Comparative Examples 4-1 to 4-8

A chemically amplified negative resist composition was prepared by dissolving a polymer (Polymers P-26 to P-30), acid generator and acid diffusion inhibitor in a solvent in accordance with the recipe shown in Table 10, and filtering through a Teflon® filter having a pore size of 0.2 µm.

After a silicon wafer was baked at 200° C. for drying and vapor primed with HMDS at 100° C. for 90 seconds, the resist composition was spin coated on the silicon wafer and prebaked on a hotplate at 110° C. for 60 seconds to form a resist film of 30 nm thick.

Using a scanner NXE3300 (ASML, NA 0.33, dipole 90), the resist film was exposed to EUV. The resist film was baked (PEB) at 120° C. for 60 seconds and puddle developed in a 2.38 wt % TMAH aqueous solution for 60 seconds to form a negative LS pattern.

The patterned wafer was observed under TD-SEM. The exposure dose capable of resolving a 22-nm LS pattern at 1:1 (i.e., optimum dose) is reported as sensitivity. The minimum size at the optimum dose is reported as resolution. For numerically expressing the roughness of a 22-nm LS pattern at the optimum dose, a variation of line width was measured at 30 points, and a 3-fold value ($3\sigma$) of the standard deviation ($\sigma$) was computed and reported as LWR (nm). The results are shown in Table 10.

TABLE 10

| | | Polymer (pbw) | Acid generator (pbw) | Acid diffusion inhibitor (pbw) | Organic solvent (pbw) | PEB temp. (° C.) | Sensitivity (mJ/cm$^2$) | Resolution (nm) | LWR (nm) |
|---|---|---|---|---|---|---|---|---|---|
| Example | 4-1 | P-26 (80) | PAG-A (4) | Q-1 (6.5) | PGMEA (1,780) EL (1,920) PGME (2,800) | 120 | 43 | 21 | 4.0 |
| | 4-2 | P-27 (80) | — | Q-1 (6.5) | PGMEA (1,780) EL (1,920) PGME (2,800) | 120 | 47 | 22 | 3.9 |
| | 4-3 | P-26 (80) | PAG-A (4) | Q-1 (6.5) | PGMEA (5,525) GBL (975) | 120 | 42 | 20 | 4.2 |
| | 4-4 | P-27 (80) | — | Q-1 (6.5) | PGMEA (5,525) GBL (975) | 120 | 48 | 22 | 3.8 |
| | 4-5 | P-28 (80) | PAG-A (8) | Q-1 (11.0) | PGMEA (5,525) GBL (975) | 120 | 42 | 19 | 4.1 |
| | 4-6 | P-28 (80) | PAG-F (8) | Q-1 (11.0) | PGMEA (5,525) GBL (975) | 120 | 34 | 22 | 4.4 |
| | 4-7 | P-29 (80) | — | Q-1 (6.) | PGMEA (5,525) GBL (975) | 120 | 48 | 22 | 3.9 |
| | 4-8 | P-30 (80) | — | Q-1 (6.5) | PGMEA (5,525) GBL (975) | 120 | 33 | 22 | 4.4 |
| Comparative Example | 4-1 | P-26 (80) | PAG-A (4) | eQ-1 (4.0) | PGMEA (1,780) EL (1,920) PGME (2,800) | 120 | 41 | 20 | 6.0 |
| | 4-2 | P-26 (80) | PAG-A (4) | eQ-2 (2.0) | PGMEA (1,780) EL (1,920) PGME (2,800) | 120 | no pattern resolved | — | — |
| | 4-3 | P-27 (80) | — | eQ-1 (4.0) | PGMEA (1,780) EL (1,920) PGME (2,800) | 120 | 39 | 22 | 5.6 |
| | 4-4 | P-27 (80) | — | eQ-2 (2.0) | PGMEA (1,780) EL (1,920) PGME (2,800) | 120 | 40 | 22 | 6.6 |
| | 4-5 | P-26 (80) | PAG-A (4) | eQ-1 (4.0) | PGMEA (5,525) GBL (975) | 120 | 42 | 20 | 5.9 |
| | 4-6 | P-28 (80) | PAG-F (8) | eQ-1 (8.0) | PGMEA (5,525) GBL (975) | 120 | 31 | 22 | 6.1 |
| | 4-7 | P-29 (80) | — | eQ-1 (4.0) | PGMEA (5,525) GBL (975) | 120 | 48 | 21 | 5.1 |
| | 4-8 | P-30 (80) | — | eQ-1 (4.0) | PGMEA (5,525) GBL (975) | 120 | 27 | 22 | 5.5 |

It is evident from Table 10 that the inventive negative resist composition has improved EUV lithography performance as demonstrated by improved resolution and reduced roughness.

[7] EB Lithography Test after Anti-Charging Film Coating

Examples 5-1 to 5-7 and Comparative Examples 5-1 to 5-4

Each of the negative resist compositions (R-1 to R-4, R-25 to R-27, CR-1 to CR-4) was spin coated on a 6-inch silicon wafer and baked at 110° C. for 240 seconds to form a resist film of 80 nm thick. Using a system Mark 8 (Tokyo Electron Ltd.), an electroconductive polymer composition was dispensed and spin coated over the resist film and baked on a hotplate at 90° C. for 90 seconds to form an anti-charging film of 60 nm thick. The electroconductive polymer composition used was a water dispersion of polystyrene-doped polyaniline as described in Proc. of SPIE Vol. 8522, 85220O-1. Using a system HL-800D (Hitachi High-Technologies Corp.) at an accelerating voltage of 50 kV the resist film was exposed to EB, baked (PEB) at 110° C. for 240 seconds, and developed in a 2.38 wt % TMAH aqueous solution for 80 seconds, thereby yielding a negative pattern.

The resist pattern was evaluated. The resist pattern-bearing wafer was observed under a TD-SEM. The optimum dose (Eop) was defined as the exposure dose ($\mu C/cm^2$) which provided a 1:1 resolution of a 400-nm 1:1 LS pattern. The resolution (or maximum resolution) was defined as the minimum line width of a LS pattern that could be resolved at the optimum dose. The results are shown in Table 11.

TABLE 11

|  |  | Resist composition | Eop ($\mu C/cm^2$) | Maximum resolution (nm) |
|---|---|---|---|---|
| Example | 5-1 | R-1 | 55 | 70 |
|  | 5-2 | R-2 | 56 | 65 |
|  | 5-3 | R-3 | 56 | 65 |
|  | 5-4 | R-4 | 55 | 65 |
|  | 5-5 | R-25 | 54 | 55 |
|  | 5-6 | R-26 | 55 | 50 |
|  | 5-7 | R-27 | 56 | 50 |
| Comparative Example | 5-1 | CR-1 | 59 | 80 |
|  | 5-2 | CR-2 | 58 | 75 |
|  | 5-3 | CR-3 | 58 | 80 |
|  | 5-4 | CR-4 | 57 | 75 |

All the inventive resist compositions of Examples 5-1 to 5-7 comprising the compounds having formula (A1) show satisfactory resolution. The comparative resist compositions are inferior in resolution. This is because the acid migrates from the anti-charging film to the resist film to cause intermixing, whereby the unwanted negative working reaction takes place in the unexposed (umimaged) region to some extent.

Since the inventive resist compositions comprising the compounds having formula (A1) have a higher quenching efficiency than comparative resist compositions CR-1 and CR-2, and are reduced in intermixing of acid between anti-charging film and resist film as compared with comparative resist compositions CR-3 and CR-4, they are less susceptible to the unwanted reaction than the resist compositions of Comparative Examples. As a result, patterns with satisfactory resolution are formed. A comparison of Examples 5-1 to 5-4 with Examples 5-5 to 5-7 reveals an improvement in resolution by the fluorinated polymer (E) exerting the effect of suppressing acid mixing.

[8] Evaluation of Development Residue

Examples 6-1 to 6-7 and Comparative Examples 6-1 to 6-2

Using a coater/developer system ACT-M (Tokyo Electron Ltd.), each of the negative resist compositions (R-1 to R-4, R-25 to R-27, CR-3 to CR-4) was spin coated onto a mask blank of 152 mm squares having a chromium oxynitride film at the outermost surface and prebaked on a hotplate at 110° C. for 600 seconds to form a resist film of 80 nm thick. The resist film was directly (i.e., imagewise exposure omitted) baked at 120° C. for 600 seconds and puddle developed in a 2.38 wt % TMAH aqueous solution for 60 seconds. Using a mask defect monitor M2351 (Lasertec Corp.), development residues were counted. The total count of defects after development is reported in Table 12.

TABLE 12

|  |  | Resist composition | Total count of defects after development |
|---|---|---|---|
| Example | 6-1 | R-1 | 510 |
|  | 6-2 | R-2 | 200 |
|  | 6-3 | R-3 | 190 |
|  | 6-4 | R-4 | 200 |
|  | 6-5 | R-25 | 500 |
|  | 6-6 | R-26 | 190 |
|  | 6-7 | R-27 | 200 |
| Comparative Example | 6-1 | CR-3 | 520 |
|  | 6-2 | CR-4 | 530 |

The resist compositions (R-2 to R-4, R-26 to R-27) comprising the fluorinated polymer (E) are smaller in defect count than the resist compositions free of the fluorinated polymer. It is believed that the fluorinated polymer (E) allows a trace of negative-working matter (which will form defects upon high-temperature bake) to be washed away during development.

It has been demonstrated that by using the chemically amplified negative resist composition of the invention to form a resist film and exposing it via EB, KrF excimer laser or EUV lithography, a pattern having high resolution, a small line width variation relative to dose changes and pattern layout, and a minimal LER or LWR is formed. The resist pattern forming process using the inventive resist composition is useful in the photolithography for the fabrication of microelectronic devices, especially processing of photomask blanks and wafers.

Japanese Patent Application No. 2021-020906 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified negative resist composition comprising (A) a sulfurane or selenurane compound having the following formula (A1) and (B) a base polymer containing a polymer comprising repeat units having the following formula (B1),

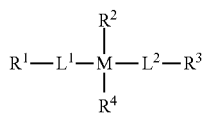
(A1)

wherein $R^1$ to $R^4$ are each independently a $C_1$-$C_{20}$ hydrocarbyl group which may contain a heteroatom, $R^1$ and $R^2$ may bond together to form a ring with $L^1$ and M to which they are attached, $R^1$ and $R^2$, and $R^3$ and $R^4$ may bond together to form spiro rings with M as the spiro atom, $L^1$ and $L^2$ are each independently —O— or —N(R)—, R is hydrogen or a $C_1$-$C_{20}$ hydrocarbyl group which may contain a heteroatom, and M is sulfur or selenium,

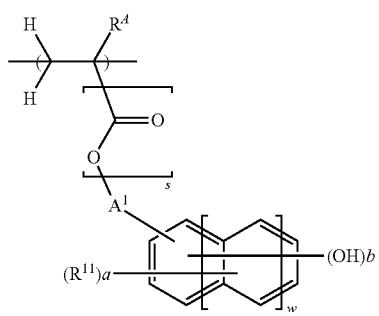
(B1)

wherein $R^A$ is hydrogen, fluorine, methyl or trifluoromethyl, $R^{11}$ is halogen, an optionally halogenated $C_2$-$C_8$ saturated hydrocarbylcarbonyloxy group, optionally halogenated $C_1$-$C_6$ saturated hydrocarbyl group, or optionally halogenated $C_1$-$C_6$ saturated hydrocarbyloxy group, $A^1$ is a single bond or a $C_1$-$C_{10}$ saturated hydrocarbylene group in which any constituent —$CH_2$— may be replaced by —O—, s is 0 or 1, w is an integer of 0 to 2, a is an integer satisfying 0≤a≤5+2w−b, and b is an integer of 1 to 3.

2. The negative resist composition of claim 1 wherein the polymer further comprises repeat units of at least one type selected from repeat units having the formulae (B2), (B3) and (B4):

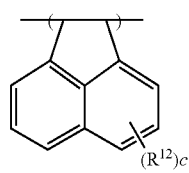
(B2)

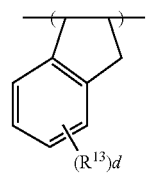
(B3)

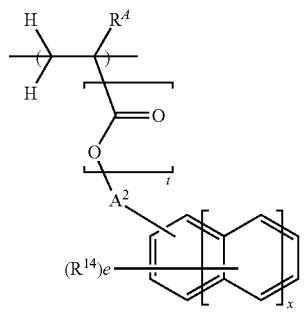
(B4)

wherein $R^A$ is as defined above, $R^{12}$ and $R^{13}$ are each independently hydroxy, halogen, an optionally halogenated $C_2$-$C_8$ saturated hydrocarbylcarbonyloxy group, optionally halogenated $C_1$-$C_8$ saturated hydrocarbyl group, or optionally halogenated $C_1$-$C_8$ saturated hydrocarbyloxy group, $R^{14}$ is an acetyl group, $C_1$-$C_{20}$ saturated hydrocarbyl group, $C_1$-$C_{20}$ saturated hydrocarbyloxy group, $C_2$-$C_{20}$ saturated hydrocarbylcarbonyloxy group, $C_2$-$C_{20}$ saturated hydrocarbyloxyhydrocarbyl group, $C_2$-$C_{20}$ saturated hydrocarbylthiohydrocarbyl group, halogen atom, nitro group, cyano group, sulfinyl group, or sulfonyl group, $A^2$ is a single bond or $C_1$-$C_{10}$ saturated hydrocarbylene group in which any constituent —$CH_2$— may be replaced by —O—, c and d are each independently an integer of 0 to 4, e is an integer of 0 to 5, x is an integer of 0 to 2, and t is 0 or 1.

3. The negative resist composition of claim 1 wherein the polymer further comprises repeat units having the formula (B5):

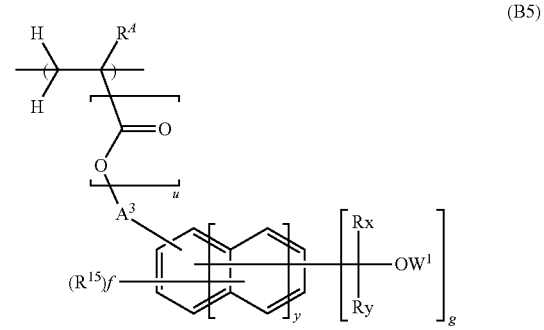
(B5)

wherein $R^A$ is as defined above, $A^3$ is a single bond or $C_1$-$C_{10}$ saturated hydrocarbylene group in which any constituent —$CH_2$— may be replaced by —O—, $R^{15}$ is each independently halogen, an optionally halogenated $C_2$-$C_8$ saturated hydrocarbylcarbonyloxy group, optionally halogenated $C_1$-$C_6$ saturated hydrocarbyl group, or optionally halogenated $C_1$-$C_6$ saturated hydrocarbyloxy group, $W^1$ is hydrogen, a $C_1$-$C_{10}$ aliphatic hydrocarbyl group or an optionally substituted aryl group, any constituent —$CH_2$— in the aliphatic hydrocarbyl group may be replaced by —O—, —C(=O)—, —O—C(=O)— or —C(=O)—O—, Rx and Ry are each independently hydrogen, an optionally hydroxy or saturated hydrocarbyloxy-substituted $C_1$-$C_{15}$ saturated hydrocarbyl group, or an optionally substituted aryl group, with the proviso that both Rx and Ry are not hydrogen at the same time, Rx and Ry may bond together to form a ring with the carbon atom to which they are attached, y is an integer of 0 to 2, u is 0 or 1, f is an integer satisfying 0≤f≤5+2y−g, and g is an integer of 1 to 3.

4. The negative resist composition of claim 3 wherein the polymer further comprises repeat units of at least one type selected from repeat units having the formulae (B6) to (B13):

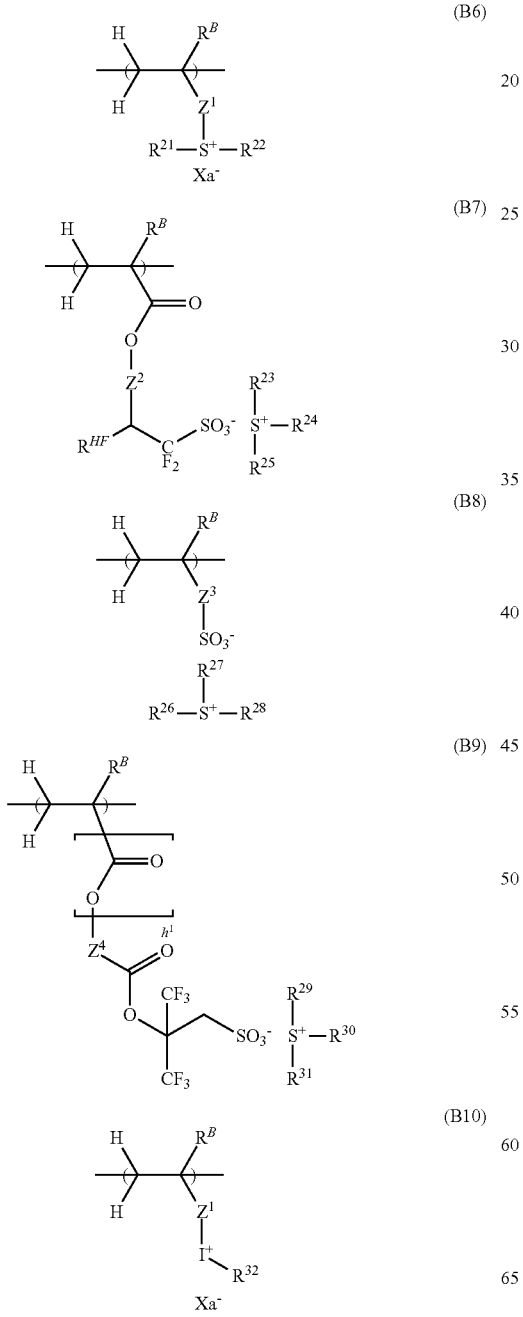
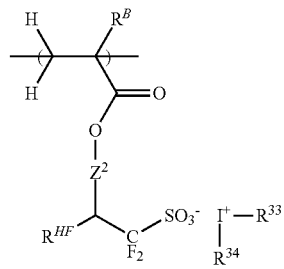
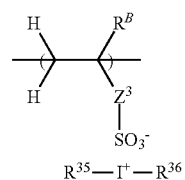
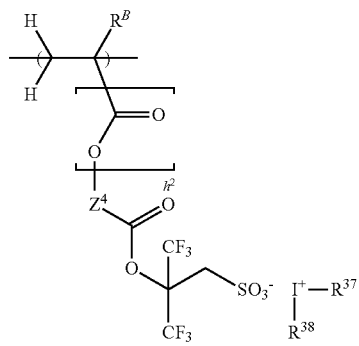

wherein $R^B$ is each independently hydrogen or methyl,
$Z^1$ is a single bond, a $C_1$-$C_6$ aliphatic hydrocarbylene group, phenylene group, naphthylene group or $C_7$-$C_{18}$ group obtained by combining the foregoing, —O—$Z^{11}$—, —C(=O)—O—$Z^{11}$—, or —C(=O)—NH—$Z^{11}$—, $Z^{11}$ is a $C_1$-$C_6$ aliphatic hydrocarbylene group, phenylene group, naphthylene group or $C_7$-$C_{18}$ group obtained by combining the foregoing, which may contain a carbonyl moiety, ester bond, ether bond or hydroxy moiety,
$Z^2$ is a single bond or —$Z^{71}$—C(=O)—O—, $Z^{21}$ is a $C_1$-$C_{20}$ hydrocarbylene group which may contain a heteroatom,
$Z^3$ is a single bond, methylene, ethylene, phenylene, fluorinated phenylene, trifluoromethyl-substituted phenylene, —O—$Z^{31}$—, —C(=O)—O—$Z^{31}$—, or —C(=O)—NH—$Z^{31}$—, $Z^{31}$ is a $C_1$-$C_6$ aliphatic hydrocarbylene group, phenylene group, fluorinated phenylene group, trifluoromethyl-substituted phenylene group, or $C_7$-$C_{20}$ group obtained by combining the foregoing, which may contain a carbonyl moiety, ester bond, ether bond or hydroxy moiety,
$Z^4$ is a single bond or $C_1$-$C_{30}$ hydrocarbylene group which may contain a heteroatom, $h^1$ and $h^2$ are each independently 0 or 1, $h^1$ and $h^2$ are 0 when $Z^4$ is a single bond,
$R^{21}$ to $R^{38}$ are each independently a $C_1$-$C_{20}$ hydrocarbyl group which may contain a heteroatom, $R^{21}$ and $R^{22}$ may bond together to form a ring with the sulfur atom to which they are attached, $R^{23}$ and $R^{24}$, $R^{26}$ and $R^{27}$, or $R^{29}$ and $R^{30}$ may bond together to form a ring with the sulfur atom to which they are attached, $R^{HF}$ is hydrogen or trifluoromethyl, and
$Xa^-$ is a non-nucleophilic counter ion.

5. The negative resist composition of claim 4 wherein the polymer further comprises repeat units having the formula (B1-1), repeat units having the formula (B5-1) or repeat units having the formula (B5-2), and repeat units having the formula (B7-1) or repeat units having the formula (B11-1):

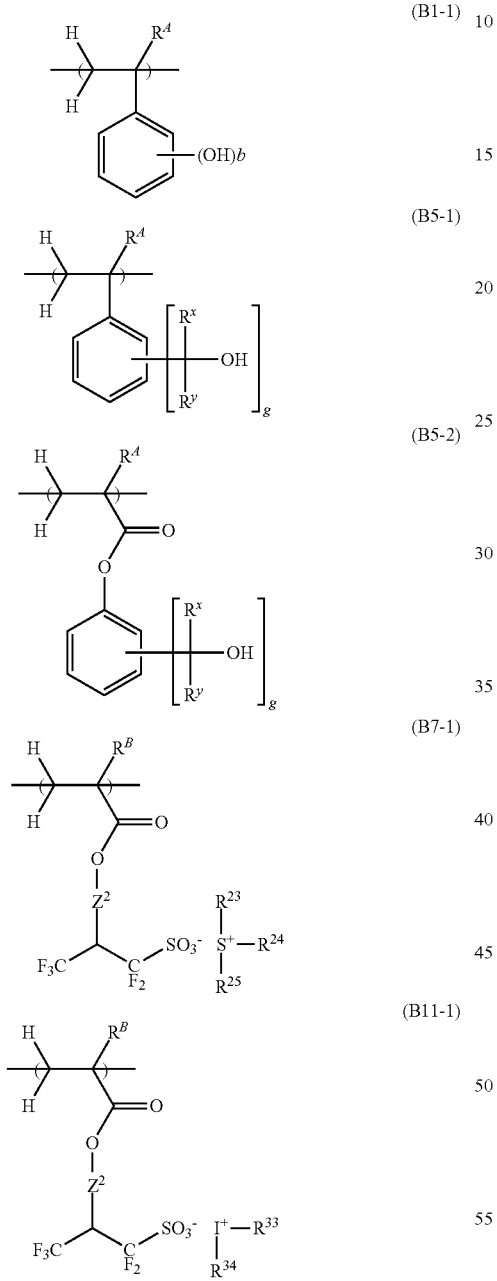

wherein $R^A$, $R^B$, $Z^2$, $R^{23}$, $R^{24}$, $R^{25}$, $R^{33}$, $R^{34}$, Rx, Ry, b, and g are as defined above.

6. The negative resist composition of claim 4 wherein the base polymer (B) further contains a polymer comprising repeat units having formula (B1) and repeat units having formula (B5), but not repeat units having formulae (B36) to (B13).

7. The negative resist composition of claim 1, further comprising (C) an acid generator.

8. The negative resist composition of claim 1, further comprising (D) a crosslinker.

9. The negative resist composition of claim 1, which is free of a crosslinker.

10. The negative resist composition of claim 1, further comprising (E) a polymer comprising repeat units having the formula (E1) and repeat units of at least one type selected from repeat units having the formulae (E2) to (E5):

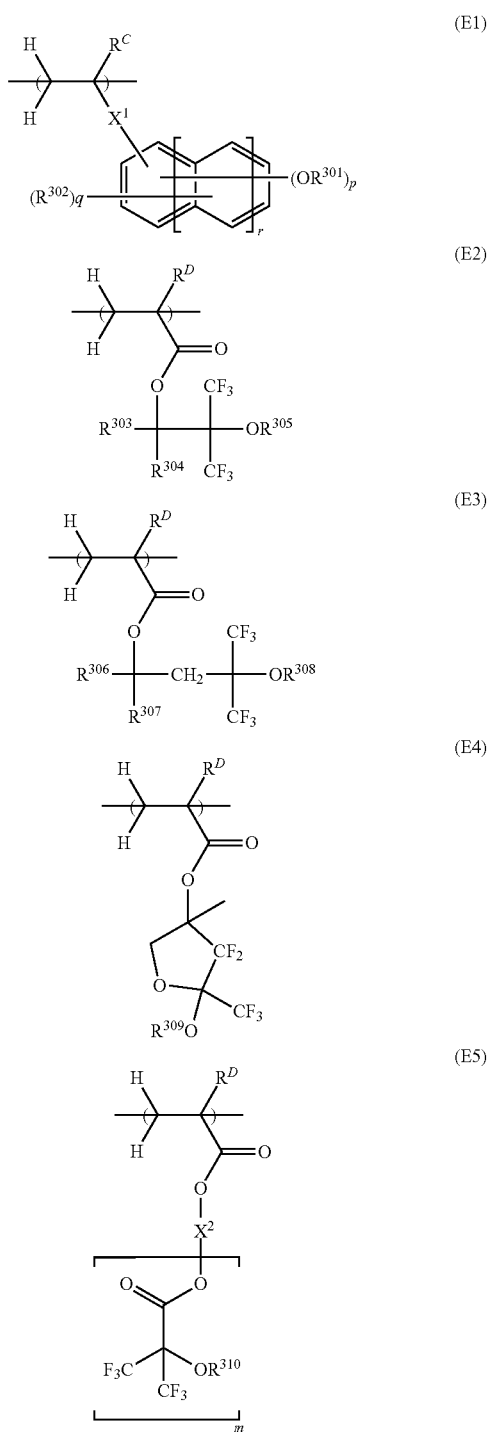

wherein $R^C$ is each independently hydrogen or methyl,
$R^D$ is each independently hydrogen, fluorine, methyl or trifluoromethyl,
$R^{301}$ is hydrogen or a $C_1$-$C_5$ straight or branched hydrocarbyl group in which a heteroatom-containing moiety may intervene in a carbon-carbon bond,
$R^{302}$ is a $C_1$-$C_5$ straight or branched hydrocarbyl group in which a heteroatom-containing moiety may intervene in a carbon-carbon bond,
$R^{303}$, $R^{304}$, $R^{306}$ and $R^{307}$ are each independently hydrogen or a $C_1$-$C_{10}$ saturated hydrocarbyl group,
$R^{305}$, $R^{308}$, $R^{309}$ and $R^{310}$ are each independently hydrogen, a $C_1$-$C_{15}$ hydrocarbyl group, $C_1$-$C_{15}$ fluorinated hydrocarbyl group, or acid labile group,
when $R^{305}$, $R^{308}$, $R^{309}$ and $R^{310}$ each are a hydrocarbyl or fluorinated hydrocarbyl group, an ether bond or carbonyl moiety may intervene in a carbon-carbon bond,
p is an integer of 1 to 3, q is an integer satisfying $0 \leq q \leq 5+2r-p$, r is 0 or 1, m is an integer of 1 to 3,
$X^1$ is a single bond, —C(=O)—O— or —C(=O)—NH—, and
$X^2$ is a $C_1$-$C_{20}$ (m+1)-valent hydrocarbon group or $C_1$-$C_{20}$ (m+1)-valent fluorinated hydrocarbon group.

11. A resist pattern forming process comprising the steps of:

applying the chemically amplified negative resist composition of claim 1 onto a substrate to form a resist film thereon, exposing the resist film patternwise to high-energy radiation, and developing the exposed resist film in an alkaline developer.

12. The process of claim 11 wherein the high-energy radiation is KrF excimer laser, EUV or EB.

13. The process of claim 11 wherein the substrate is a photomask blank.

* * * * *